(12) United States Patent
Deguet et al.

(10) Patent No.: US 8,142,593 B2
(45) Date of Patent: Mar. 27, 2012

(54) METHOD OF TRANSFERRING A THIN FILM ONTO A SUPPORT

(75) Inventors: Chrystel Deguet, Saint Ismier (FR);
Laurent Clavelier, Grenoble (FR);
Jerome Dechamp, Beaucroissant (FR)

(73) Assignee: Commissariat a l'Energie Atomique, Paris (FR)

( * ) Notice: Subject to any disclaimer, the term of this patent is extended or adjusted under 35 U.S.C. 154(b) by 360 days.

(21) Appl. No.: 12/063,808

(22) PCT Filed: Aug. 11, 2006

(86) PCT No.: PCT/FR2006/001945
§ 371 (c)(1),
(2), (4) Date: Mar. 25, 2008

(87) PCT Pub. No.: WO2007/020351
PCT Pub. Date: Feb. 22, 2007

(65) Prior Publication Data
US 2009/0120568 A1    May 14, 2009

(30) Foreign Application Priority Data
Aug. 16, 2005    (FR) ..................... 05 08555

(51) Int. Cl.
*H01L 21/304*    (2006.01)
*H01L 21/324*    (2006.01)
*B32B 37/06*    (2006.01)
*B32B 37/14*    (2006.01)
*B32B 38/10*    (2006.01)
*B29C 65/02*    (2006.01)
*B29C 65/72*    (2006.01)
*B32B 37/12*    (2006.01)
*B32B 37/16*    (2006.01)

(52) U.S. Cl. ........ 156/235; 156/153; 156/281; 156/298; 438/455; 438/459; 257/E21.561

(58) Field of Classification Search ............... 156/153, 156/235, 281, 298; 438/455, 459; 257/E21.561
See application file for complete search history.

(56) References Cited

U.S. PATENT DOCUMENTS
3,901,423 A    8/1975 Hillberry et al.
(Continued)

FOREIGN PATENT DOCUMENTS
DE    101 53 319 A1    5/2003
(Continued)

OTHER PUBLICATIONS
Caymax, et al. High-Mobility Group—IV Materials and Devices, Materials Research Society, Symposium Proceedings vol. 809, 2004.
(Continued)

*Primary Examiner* — Sonya Mazumdar
(74) *Attorney, Agent, or Firm* — Brinks Hofer Gilson & Lione

(57) ABSTRACT

A method of transferring a thin film onto a first support, includes supplying a structure comprising a film of which at least one part originates from a solid substrate of a first material and which is solidly connected to a second support having a thermal expansion coefficient that is different from that of the first material and close to that of the first support, forming an embrittled area inside the film that defines the thin film to be transferred, affixing the film that is solidly connected to the second support to the first support, and breaking the film at the embrittled area.

12 Claims, 2 Drawing Sheets

U.S. PATENT DOCUMENTS

| | | | |
|---|---|---|---|
| 3,915,757 A | 10/1975 | Engel | |
| 3,957,107 A | 5/1976 | Altoz et al. | |
| 3,993,909 A | 11/1976 | Drews et al. | |
| 4,006,340 A | 2/1977 | Gorinas | |
| 4,028,149 A | 6/1977 | Deines et al. | |
| 4,039,416 A | 8/1977 | White | |
| 4,074,139 A | 2/1978 | Pankove | |
| 4,107,350 A | 8/1978 | Berg et al. | |
| 4,108,751 A | 8/1978 | King | |
| 4,121,334 A | 10/1978 | Wallis | |
| 4,170,662 A | 10/1979 | Weiss et al. | |
| 4,179,324 A | 12/1979 | Kirkpatrick | |
| 4,244,348 A | 1/1981 | Wilkes | |
| 4,252,837 A | 2/1981 | Auton | |
| 4,254,590 A | 3/1981 | Eisele et al. | |
| 4,274,004 A | 6/1981 | Kanai | |
| 4,324,631 A | 4/1982 | Meckel et al. | |
| 4,346,123 A | 8/1982 | Kaufmann | |
| 4,361,600 A | 11/1982 | Brown | |
| 4,368,083 A | 1/1983 | Bruel et al. | |
| 4,412,868 A | 11/1983 | Brown et al. | |
| 4,452,644 A | 6/1984 | Bruel et al. | |
| 4,468,309 A | 8/1984 | White | |
| 4,471,003 A | 9/1984 | Cann | |
| 4,486,247 A | 12/1984 | Ecer et al. | |
| 4,490,190 A | 12/1984 | Speri | |
| 4,500,563 A | 2/1985 | Ellenberger et al. | |
| 4,508,056 A | 4/1985 | Bruel et al. | |
| 4,536,657 A | 8/1985 | Bruel | |
| 4,539,050 A | 9/1985 | Kramler et al. | |
| 4,542,863 A | 9/1985 | Larson | |
| 4,566,403 A | 1/1986 | Fournier | |
| 4,567,505 A | 1/1986 | Pease | |
| 4,568,563 A | 2/1986 | Jackson et al. | |
| 4,585,945 A | 4/1986 | Bruel et al. | |
| 4,630,093 A | 12/1986 | Yamaguchi et al. | |
| 4,684,535 A | 8/1987 | Heinecke et al. | |
| 4,704,302 A | 11/1987 | Bruel et al. | |
| 4,717,683 A | 1/1988 | Parrillo et al. | |
| 4,764,394 A | 8/1988 | Conrad | |
| 4,837,172 A | 6/1989 | Mizuno et al. | |
| 4,846,928 A | 7/1989 | Dolins et al. | |
| 4,847,792 A | 7/1989 | Barna et al. | |
| 4,853,250 A | 8/1989 | Boulos et al. | |
| 4,887,005 A | 12/1989 | Rough et al. | |
| 4,891,329 A | 1/1990 | Reisman et al. | |
| 4,894,709 A | 1/1990 | Phillips et al. | |
| 4,904,610 A | 2/1990 | Shyr | |
| 4,920,396 A | 4/1990 | Shinohara et al. | |
| 4,929,566 A | 5/1990 | Beitman | |
| 4,931,405 A | 6/1990 | Kamijo et al. | |
| 4,948,458 A | 8/1990 | Ogle | |
| 4,952,273 A | 8/1990 | Popov | |
| 4,956,698 A | 9/1990 | Wang | |
| 4,960,073 A | 10/1990 | Suzuki et al. | |
| 4,975,126 A | 12/1990 | Margail et al. | |
| 4,982,090 A | 1/1991 | Wittmaack | |
| 4,996,077 A | 2/1991 | Moslehi et al. | |
| 5,013,681 A | 5/1991 | Godbey et al. | |
| 5,015,353 A | 5/1991 | Hubler et al. | |
| 5,034,343 A | 7/1991 | Rouse et al. | |
| 5,036,023 A | 7/1991 | Dautremont-Smith et al. | |
| 5,110,748 A | 5/1992 | Sarma | |
| 5,120,666 A | 6/1992 | Gotou | |
| 5,138,422 A | 8/1992 | Fujii et al. | |
| 5,198,371 A | 3/1993 | Li | |
| 5,200,805 A | 4/1993 | Parsons et al. | |
| 5,232,870 A | 8/1993 | Ito et al. | |
| 5,234,535 A | 8/1993 | Beyer et al. | |
| 5,242,863 A | 9/1993 | Xiang-Zheng et al. | |
| 5,250,446 A | 10/1993 | Osawa et al. | |
| 5,256,581 A | 10/1993 | Foerstner et al. | |
| 5,259,247 A | 11/1993 | Bantien | |
| 5,300,788 A | 4/1994 | Fan et al. | |
| 5,310,446 A | 5/1994 | Konishi et al. | |
| 5,374,564 A | 12/1994 | Bruel | |
| 5,400,458 A | 3/1995 | Rambosek | |
| 5,405,802 A | 4/1995 | Yamagata et al. | |
| 5,413,951 A | 5/1995 | Ohori et al. | |
| 5,442,205 A | 8/1995 | Brasen et al. | |
| 5,494,835 A | 2/1996 | Bruel | |
| 5,524,339 A | 6/1996 | Gorowitz et al. | |
| 5,539,241 A | 7/1996 | Abidi et al. | |
| 5,559,043 A | 9/1996 | Bruel | |
| 5,567,654 A | 10/1996 | Beilstein, Jr. et al. | |
| 5,611,316 A | 3/1997 | Oshima et al. | |
| 5,618,739 A | 4/1997 | Takahashi et al. | |
| 5,622,896 A | 4/1997 | Knotter et al. | |
| 5,633,174 A | 5/1997 | Li | |
| 5,661,333 A | 8/1997 | Bruel et al. | |
| 5,714,395 A | 2/1998 | Bruel | |
| 5,741,733 A | 4/1998 | Bertagnolli et al. | |
| 5,753,038 A | 5/1998 | Vichr et al. | |
| 5,804,086 A | 9/1998 | Bruel | |
| 5,811,348 A | 9/1998 | Matsushita et al. | |
| 5,817,368 A | 10/1998 | Hashimoto | |
| 5,854,123 A | 12/1998 | Sato et al. | |
| 5,863,830 A | 1/1999 | Bruel et al. | |
| 5,863,832 A | 1/1999 | Doyle et al. | |
| 5,877,070 A | 3/1999 | Goesele et al. | |
| 5,880,010 A | 3/1999 | Davidson | |
| 5,882,987 A | 3/1999 | Srikrishnan | |
| 5,897,331 A | 4/1999 | Sopori | |
| 5,909,627 A | 6/1999 | Egloff | |
| 5,920,764 A | 7/1999 | Hanson et al. | |
| 5,953,622 A | 9/1999 | Lee et al. | |
| 5,966,620 A | 10/1999 | Sakaguchi et al. | |
| 5,981,400 A | 11/1999 | Lo | |
| 5,985,412 A | 11/1999 | Gösele | |
| 5,993,677 A | 11/1999 | Biasse et al. | |
| 5,994,207 A | 11/1999 | Henley et al. | |
| 6,010,591 A | 1/2000 | Gösele | |
| 6,013,563 A | 1/2000 | Henley et al. | |
| 6,013,954 A | 1/2000 | Hamajima | |
| 6,020,252 A | 2/2000 | Aspar et al. | |
| 6,033,974 A * | 3/2000 | Henley et al. | 438/526 |
| 6,048,411 A | 4/2000 | Henley et al. | |
| 6,054,363 A | 4/2000 | Sakaguchi et al. | |
| 6,054,370 A | 4/2000 | Doyle | |
| 6,057,212 A | 5/2000 | Chan et al. | |
| 6,071,795 A | 6/2000 | Cheung et al. | |
| 6,080,640 A | 6/2000 | Gardner et al. | |
| 6,096,433 A | 8/2000 | Kikuchi et al. | |
| 6,103,597 A | 8/2000 | Aspar et al. | |
| 6,103,599 A | 8/2000 | Henley et al. | |
| 6,118,181 A | 9/2000 | Merchant et al. | |
| 6,127,199 A | 10/2000 | Inoue | |
| 6,146,979 A | 11/2000 | Henley et al. | |
| 6,150,239 A | 11/2000 | Goesele et al. | |
| 6,156,215 A | 12/2000 | Shimada et al. | |
| 6,159,323 A | 12/2000 | Joly et al. | |
| 6,190,998 B1 | 2/2001 | Bruel et al. | |
| 6,197,695 B1 | 3/2001 | Joly et al. | |
| 6,198,159 B1 | 3/2001 | Hosoma et al. | |
| 6,200,878 B1 | 3/2001 | Yamagata et al. | |
| 6,204,079 B1 * | 3/2001 | Aspar et al. | 438/458 |
| 6,225,190 B1 | 5/2001 | Bruel et al. | |
| 6,225,192 B1 | 5/2001 | Aspar et al. | |
| 6,251,754 B1 | 6/2001 | Ohshima et al. | |
| 6,271,101 B1 | 8/2001 | Fukunaga | |
| 6,276,345 B1 | 8/2001 | Nelson et al. | |
| 6,287,940 B1 | 9/2001 | Cole et al. | |
| 6,294,478 B1 | 9/2001 | Sakaguchi et al. | |
| 6,303,468 B1 | 10/2001 | Aspar et al. | |
| 6,306,720 B1 | 10/2001 | Ding | |
| 6,310,387 B1 | 10/2001 | Seefeldt et al. | |
| 6,316,333 B1 | 11/2001 | Bruel et al. | |
| 6,323,108 B1 | 11/2001 | Kub et al. | |
| 6,323,109 B1 | 11/2001 | Okonogi | |
| 6,346,458 B1 | 2/2002 | Bower | |
| 6,362,077 B1 | 3/2002 | Aspar et al. | |
| 6,362,082 B1 | 3/2002 | Doyle et al. | |
| 6,407,929 B1 | 6/2002 | Hale et al. | |
| 6,417,075 B1 | 7/2002 | Haberger et al. | |
| 6,429,094 B1 | 8/2002 | Maleville et al. | |
| 6,429,104 B1 | 8/2002 | Auberton-Herve | |
| 6,465,892 B1 | 10/2002 | Suga | |

| | | | |
|---|---|---|---|
| 6,504,235 B2 | 1/2003 | Schmitz et al. | |
| 6,513,564 B2 | 2/2003 | Bryan et al. | |
| 6,529,646 B1 | 3/2003 | Wight et al. | |
| 6,534,380 B1 | 3/2003 | Yamauchi et al. | |
| 6,548,375 B1 | 4/2003 | De Los Santos et al. | |
| 6,593,212 B1 | 7/2003 | Kub et al. | |
| 6,596,569 B1 | 7/2003 | Bao et al. | |
| 6,607,969 B1 | 8/2003 | Kub et al. | |
| 6,632,082 B1 | 10/2003 | Smith | |
| 6,645,831 B1 | 11/2003 | Shaheen et al. | |
| 6,645,833 B2 | 11/2003 | Brendel | |
| 6,653,207 B2 | 11/2003 | Ohya et al. | |
| 6,727,549 B1 | 4/2004 | Doyle | |
| 6,756,285 B1 | 6/2004 | Cartier et al. | |
| 6,756,286 B1 | 6/2004 | Aspar et al. | |
| 6,762,076 B2 | 7/2004 | Kim et al. | |
| 6,764,936 B2 | 7/2004 | Daneman et al. | |
| 6,770,507 B2 | 8/2004 | Abe et al. | |
| 6,774,010 B2 | 8/2004 | Chu et al. | |
| 6,828,214 B2 | 12/2004 | Notsu et al. | |
| 6,846,690 B2 | 1/2005 | Farcy et al. | |
| 6,887,769 B2 | 5/2005 | Kellar et al. | |
| 6,893,936 B1 | 5/2005 | Chen et al. | |
| 6,902,987 B1 | 6/2005 | Tong et al. | |
| 6,927,147 B2 | 8/2005 | Fitzgerald et al. | |
| 6,974,759 B2 | 12/2005 | Moriceau et al. | |
| 7,029,548 B2 * | 4/2006 | Aspar et al. | 156/239 |
| 2001/0007367 A1 | 7/2001 | Ohkubo | |
| 2001/0007789 A1 | 7/2001 | Aspar et al. | |
| 2002/0000646 A1 | 1/2002 | Gooch et al. | |
| 2002/0001221 A1 | 1/2002 | Hashimoto | |
| 2002/0025604 A1 | 2/2002 | Tiwari | |
| 2002/0081861 A1 | 6/2002 | Robinson et al. | |
| 2002/0083387 A1 | 6/2002 | Miner et al. | |
| 2002/0145489 A1 | 10/2002 | Cornett et al. | |
| 2002/0153563 A1 | 10/2002 | Ogura | |
| 2002/0185469 A1 | 12/2002 | Podlesnik et al. | |
| 2002/0185684 A1 | 12/2002 | Campbell et al. | |
| 2003/0077885 A1 | 4/2003 | Aspar et al. | |
| 2003/0119279 A1 | 6/2003 | Enquist | |
| 2003/0119280 A1 | 6/2003 | Lee et al. | |
| 2003/0134489 A1 | 7/2003 | Schwarzenbach et al. | |
| 2003/0162367 A1 | 8/2003 | Roche | |
| 2003/0199105 A1 | 10/2003 | Kub et al. | |
| 2003/0234075 A1 * | 12/2003 | Aspar et al. | 156/344 |
| 2004/0009649 A1 | 1/2004 | Kub et al. | |
| 2004/0029358 A1 | 2/2004 | Park et al. | |
| 2004/0126708 A1 | 7/2004 | Jing et al. | |
| 2004/0144487 A1 | 7/2004 | Martinez et al. | |
| 2004/0150006 A1 | 8/2004 | Aulnette et al. | |
| 2004/0157409 A1 | 8/2004 | Ghyselen et al. | |
| 2004/0171232 A1 | 9/2004 | Cayrefourcq et al. | |
| 2004/0209441 A1 | 10/2004 | Maleville et al. | |
| 2004/0222500 A1 * | 11/2004 | Aspar et al. | 257/629 |
| 2004/0235266 A1 | 11/2004 | Tong | |
| 2004/0262686 A1 | 12/2004 | Shaheen et al. | |
| 2005/0029224 A1 | 2/2005 | Aspar et al. | |
| 2005/0042842 A1 | 2/2005 | Lei et al. | |
| 2005/0067377 A1 | 3/2005 | Lei et al. | |
| 2005/0122845 A1 | 6/2005 | Lizzi | |
| 2005/0148122 A1 | 7/2005 | Yonehara | |
| 2005/0148163 A1 * | 7/2005 | Nguyen et al. | 438/514 |
| 2006/0191627 A1 * | 8/2006 | Aspar et al. | 156/249 |

FOREIGN PATENT DOCUMENTS

| | | |
|---|---|---|
| EP | 0 355 913 | 2/1990 |
| EP | 0 383 391 A1 | 8/1990 |
| EP | 0 410 679 A1 | 1/1991 |
| EP | 0 504 714 | 9/1992 |
| EP | 0 533 551 A1 | 3/1993 |
| EP | 0 293 049 B1 | 9/1993 |
| EP | 0 660 140 | 6/1995 |
| EP | 0 665 588 A1 | 8/1995 |
| EP | 0 703 609 | 3/1996 |
| EP | 0 754 953 B1 | 1/1997 |
| EP | 0 793 263 A2 | 9/1997 |
| EP | 0 801 419 A1 | 10/1997 |
| EP | 0 807 970 A1 | 11/1997 |
| EP | 0 849 788 A2 | 6/1998 |
| EP | 0 889 509 A2 | 1/1999 |
| EP | 0 895 282 A2 | 2/1999 |
| EP | 0 898 307 | 2/1999 |
| EP | 0 917 193 A1 | 5/1999 |
| EP | 0 938 129 A1 | 8/1999 |
| EP | 0 902 843 B1 | 3/2000 |
| EP | 0 989 593 A2 | 3/2000 |
| EP | 0 994 503 A1 | 4/2000 |
| EP | 1 050 901 A2 | 11/2000 |
| EP | 1 059 663 A2 | 12/2000 |
| EP | 1 096 259 A1 | 5/2001 |
| EP | 0 717 437 B1 | 4/2002 |
| EP | 0 786 801 A1 | 6/2003 |
| EP | 0 767 486 B1 | 1/2004 |
| EP | 1 403 684 | 3/2004 |
| EP | 0 925 888 B1 | 11/2004 |
| FR | 2 671 472 A1 | 7/1992 |
| FR | 2 681 472 | 3/1993 |
| FR | 2681472 A1 * | 3/1993 |
| FR | 2 558 263 | 7/1995 |
| FR | 2 725 074 | 3/1996 |
| FR | 95 08882 | 6/1996 |
| FR | 2 736 934 | 1/1997 |
| FR | 2 748 850 A1 | 11/1997 |
| FR | 2 748 851 | 11/1997 |
| FR | 2 758 907 A1 | 7/1998 |
| FR | 2 767 416 A1 | 2/1999 |
| FR | 2 767 604 | 2/1999 |
| FR | 2 771 852 A1 | 6/1999 |
| FR | 2 773 261 | 7/1999 |
| FR | 2 774 510 A1 | 8/1999 |
| FR | 2 781 925 A1 | 2/2000 |
| FR | 2 789 518 A1 | 8/2000 |
| FR | 2 796 491 | 1/2001 |
| FR | 2 797 347 | 2/2001 |
| FR | 2 809 867 | 12/2001 |
| FR | 2 819 099 A1 | 7/2002 |
| FR | 2 847 075 A1 | 5/2004 |
| FR | 2 848 337 A1 | 6/2004 |
| FR | 2 861 497 | 4/2005 |
| GB | 2 211 991 A | 7/1989 |
| JP | 53-104156 | 9/1978 |
| JP | 58 31519 | 2/1983 |
| JP | 59-54217 | 3/1984 |
| JP | 61-129872 A | 6/1986 |
| JP | 62265717 | 11/1987 |
| JP | 101004013 | 1/1989 |
| JP | 01-128570 A | 5/1989 |
| JP | 01-169917 A | 7/1989 |
| JP | 08017777 | 1/1990 |
| JP | 4199504 | 7/1992 |
| JP | 07-254690 | 10/1995 |
| JP | 7-302889 | 11/1995 |
| JP | 8133878 | 5/1996 |
| JP | 09-213594 | 8/1997 |
| JP | 09-307719 | 11/1997 |
| JP | 10163166 | 6/1998 |
| JP | 10233352 | 9/1998 |
| JP | 11045862 | 2/1999 |
| JP | 11074208 | 3/1999 |
| JP | 11087668 | 3/1999 |
| JP | 11-145436 | 5/1999 |
| JP | 11-233449 A | 8/1999 |
| JP | 11317577 | 11/1999 |
| RU | 128757 | 6/2000 |
| WO | WO 95/20824 A1 | 8/1995 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 01/43168 A2 | 6/2001 |
| WO | WO 02/05344 A1 | 1/2002 |
| WO | WO 02/47156 A1 | 6/2002 |
| WO | WO 02/083387 A1 | 10/2002 |
| WO | WO 03/013815 A1 | 2/2003 |
| WO | WO 03/021667 A2 | 3/2003 |
| WO | WO 03/063213 A2 | 7/2003 |

| | | | |
|---|---|---|---|
| WO | WO 2004/001810 A2 | 12/2003 |
| WO | WO 2004/042779 A2 | 5/2004 |
| WO | WO 2004/044976 A1 | 5/2004 |
| WO | WO 2004/061944 A1 | 7/2004 |
| WO | WO 2005/013318 A2 | 2/2005 |
| WO | WO 2005/043615 A1 | 5/2005 |

OTHER PUBLICATIONS

PCT International Search Report.
PCT Request in French.
PCT International Preliminary Report in French.
PCT Written Opinion of the International Searching Authority for International Application No. PCT/FR2006/000297.
PCT Written Opinion of the International Searching Authority for International Application No. PCT/FR2006/0001945 date May 12, 2007 in English Translation.
Agarwal et al, "Efficient Production of Silicon-On-Insulator Films by Co-Implantation of He+ with H+", *Applied Physics Letters*, vol. 72, No. 9, 1988, pp. 1086-1088.
Agarwal, Aditya et al. "Efficient Production of Silicon-On-Insulator Films by Co-Implantation of He$^+$ with H$^{+}$"—Proceedings 1997 IEEE International SOI Conference, Oct. 1997—pp. 44-45.
Ahn, K. Y., et al., "Growth, Shrinkage, and Stability of Interfacial Oxide Layers Between Directly Bonded Silicon Wafers", *Applied Physics A.*, vol. 50, 1990, pp. 85-94.
Alley et al., "Surface Roughness Modification of Interfacial Contacts in Polysilicon Microstructures", Proceedings of the 7$^{th}$ International Conference on Solid-State Sensors and Actuators, *Transducers '93*, PACIFICO, Yokohama Japan. Jun. 7-10, 1993, pp. 288-291.
Almedia et al. "Bond formation in ion beam synthesized amorphous gallium nitride", *Elsevier, This Solid Films*, 343-344 1999, pp. 632-636.
Ascheron, C., "A Comparative Study of Swelling, Radiation, Strain and Radiation Damage of High-Energy Proton-bombarded GaAs, GaP, InP, SI and Ge Single Crystals, Nuclear Instruments and Methods in Physics Research", *Nuclear Instruments and Methods in Physics Research* B36, (1989), 1637172.
Ascheron, C., "A Study of Proton Bombardment Induced Swelling of GaP Single Crystals", *Phys. stat. sol.* (a) 92, (1985), pp. 169.
Ascheron, C., "Gettering a Copper in Proton-and Helium-Bombarded Buried Regions of Gallium Phosphide", *Phys. stat. sol.* (a), vol. 106, 1988, pp. 73-79.
Ascheron, C., "Investigations of Hydrogen Implanted GaP Single Crystals by Means of Particle Induced 7-Spectroscopy, Infrared Spectroscopy, and Turyherford Backscattering Channeling Technique" *Phys. stat. sol.* (a) 89, (1985), pp. 549.
Ascheron, C., "Proton Beam Modification of Selected AIIIBV Compounds", *Phys. stat. sol.* (a) 124, (1991), pp. 11.
Ascheron, C. et al, "Proton Bombardment Induced Swelling of GaP", 1985, pp. 169-176.
Ascheron, C., "Swelling, Strain, and Radiation Damage of He+ Implanted GaP", *Phys. stat. sol.* (a) 96, 1986, pp. 555-562. (1986).
Asheron, C., "The Effect of Hydrogen Implantation Induced Stress on GaP Single Crystals", *Nuclear Instruments and Methods in Physics Research*, B28 (1987), pp. 350-359.
Aspar et al., "The Generic Nature of the Smart-Cut © Process for Thin-Film Transfer", *Journal of Electronic Materials*, vol. 30, No. 7, Mar. 2001, pp. 834-840.
Aspar et al., Smart-Cut ©: The basic fabrication process for UNIBOND® SOI wafers, *SEMI* 1996, pp. 37-46.
Aspar et al., U.S. Appl. No. 09/777,516, also Pub. No. US 2001/0007789 A1 with allowed claims, Published Jul. 12, 2001.
Aspar et al., U.S. Appl. No. 10/784,601, including pending claims, filed Feb. 23, 2004.
Aspar, B. "Basic Mechanisms Involved in the Smart-Cut Process", 1997, pp. 223-240.
Aspar, B. et al, "Characterization of SOI substrates: Application to Recent SIMOX and UNIBOND Wafers," *Electrochemical Society Proceedings*, vol. 96-3, pp. 99-111.
Aspar, B. et al, "Transfer of Structured and Patterned Thin Silicon Films Using the Smart-Cut Process", 1996, pp. 1985-1986.
Aspar, B. et al., "Ultra Thin Buried Oxide Layers Formed by Low Dose SIMOX Processes", Proc. 6$^{th}$ International Conference on SOI Technology and Devices, Electro. Soc., vol. 94, No. 11, 1994, pp. 62.
Aspar, B. et al., "Smart Cut—Process Using Metallic Bonding: Application to Transfer of Si, GaAs, InP Thin Films", Electronic Letters—Jun. 10, 1999, vol. 35, No. 12., pp. 1024-1025.
Ashurst et al., "Water Level Anti-Silicon Coatings for MEMS", Sensors and Actuators A104, 2003, pp. 213-221.
Auberton-Herve, A. J. et al, "A New Sal Material: Smart-Cut", 1996, pp. 214-219.
Auberton-Herve, A.J. et al, "SOI Materials for ULSI Applications", *Semiconductor International*, Oct. 1995, 5 pps.
Blanchard-Lagahe C. et al., "Hydrogen and Helium Implantation to Achieve Layer Transfer" vol. 19, pp. 346-358, 2003, *Semiconductor Wafer Bonding VII: Science, Technology, and Applications—Proceedings of the International Symposium*.
Blöchl P.E. et al., First-Principles Calculations of Diffusion Coefficients: Hydrogen in Silicon, *Physical Review Letters*, vol. 64, No. 12, 1990, pp. 1401-1404.
Borgati, Stephen P., "The Root-Mean-Square", Boston College, Nov. 16, 1998, Obtained from the Internet at: <http://www.analytictech.com/mb313/rootmean.htm>.
Bruel, M. et al., (vol. 99-1) Meeting Abstract No. 333, "Single Crystal Semiconductor Layer Delamination and Transfer Through Hydrogen Implantation", The 195$^{th}$ Meeting of the Electrochemical Society, May 2-6, 1999, Seattle, Washington.
Bruel, Michel, "Application of Hydrogen Ion Beams to Silicon on Insulator Material Technology", *Nuclear Instruments and Methods in Physics Research*, B108, 1996, pp. 313-319.
Bruel, M. et al., "Smart-Cut: A New Silicon on Insulator Material Technology Based on Hydrogen Implantation and Wafer Bonding", 1997, pp. 1636-164, col. 36, Part 1, No. 3B.
Bruel, M. "Smart-Cut Process: The Way to Unibond S.O.I. Wafers", 1996, pages unknown.
Bruel, M. et al, "Smart-Cut": A Promising New SOI material technology, *Proceedings 1994 IEEE, International Sal Conference*, Oct. 1995, pp. 178-179.
Bruel, M. et al, "Smart-Cut-a new SOI Material Technology based on hydrogen Implantation and wafer bonding," *CEA*, 1996, 24 pages.
Bruel, M., "Silicon on insulator Material Technology", *Electronic Letters*; 31 Jul. 6, 1995; No. 14; pp. 1201-1202.
Bruel, M., "Silicon-an-Insulator", *European Semiconductor*, Mar. 1997.
Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.
Canham et al. "Radiative Recombination Channels due to Hydrogen in Crystalline Silicon", *Materials Science and Engineering*, B4 (1989) pp. 41-45.
Carter et al., "Applications of Ion Beams to Materials", *Inst. Phys. Conf. Ser.*, No. 28, Chapter 1, 1976, pp. 30-36.
Carter, G. et al., The Collection of Ions Implanted in Semiconductors: II Range Distributions Derived From Collection and Sputter-Etch Curves, *Radiation Effects*, 1972, vol. 16, pp. 107-114.
Cassidy, Victor M., "Ion Implantation Process Toughens Metalworking Tools," *Modern Metals*, 1984, pp. 65-67.
Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.
Cerofini et al., "Ultradense Gas Bubbles in Hydrogen-or-Helium-Implanted (or Co-Implanted) Silicon", *Materials Science and Engineering*, B71, 2000, pp. 196-202.
Cerofolini et al., "Hydrogen and Helium Bubbles in Silicon", *Material Science and Engineering 2000*—Reports: A Review Journal, Published by Elsevier Science S.A. 2000, pp. 1-52.
Chu et al, "Radiation Damage of 50-250 keV Hydrogen Ions in Silicon", *Ion Implantation in Semiconductors*, eds. F. Chernob et al., Plenum New York 1976, pp. 483-492.
Chu, et al. "Ion Implantation in Semiconductors", Chernow, Borders and Brice, Pirnum Press, New York and London. Radiation Damage of 50-250 keV Hydrogen Ions in Silicon, 1976, pp. 483-491.

Chu, P.K. et al., "Plasma Immersion Ion Implantation-A Fledgling Technique for Semiconductor Processing", Materials Science and Engineering Reports, *A Review Journal*, vol. R17, Nos. 6-7, Nov. 30, 1996, pp. 207-280.

Cowern, N. et al., "Transport Diffusion of Ion-Implanted B in Si: Dose, Time, and Matrix Dependence of Atomic and Electrical Profiles", *J. Appl. Phys.*, vol. 68, No. 12, 1990, pp. 6191-6198.

Cristoloveanu, S. et al, "Electrical Properties of Unibond Material", *Electrochemical Society Proceedings*, vol. 96-3, pp. 142-147.

Csepregl, L. et al. "Regrowth Behavior of Ion-Implanted Amorphous Layers on <111> Silicon", *Applied Physics Letters*, vol. 2, 1976, pp. 92-93.

Cullis, A.G. et al. "Comparative study of annealed neon-, argon-, and krypton-ion implantation damage in silicon,"*J. Appl. Phys.*, 49(10), Oct. 1978, pp. 5188-5198.

Dhara et al, "Mechanism of nanoblister formation in Ga+ self-ion implanted GaN nanowires", *Applied Physics Letters*, vol. 86, No. 20, 2005, p. 203199.

Demeester, et al., "Epitaxial Lift-Off and Its Applications", *Semicond. Sci. Technol.*, vol. 8, 1993, pp. 1124-1135.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

DiCioccio et al., "III-V Layer Transfer Onto Silicon and Applications", *Phys. Stat. Sol. (a)*, vol. 202, No. 4, 2005 pp. 509-515.

DiCioccio, et al.,"Silicon carbide on Insulator formation using the Smart Cut process", *Electronics Letters*, vol. 32, No. 12, Jun. 6, 1996, pp. 144-145.

Diem et al., "SOI 'SIMOX': From Bulk to Surface Micromachining, A New Age for Silicon Sensors and Actuators", *Sensors and Actuators*, vol. A 46-47, 1995, pp. 8-16.

Dirks, A. G. et al., "Columnar Microstructure in Vapor DEuroposited Thin Films", *Thin Solid Films*, vol. 47, 1977, pp. 219-233.

Duo, et al., "Comparison Between the different Implantation orders in H+ and He+ Co-implantation", *J. Phys. D. Appl. Phys.* vol. 34, 2001, pp. 477-482.

Duo, et al., "Evolution of Hydrogen and Helium Co-Implanted Single-Crystal Silicon During Annealing", 2001 American Institute Physics—Journal of Applied Physics, vol. 90, No. 8, Oct. 15, 2001, pp. 3780-3786.

Eaglesham, White, Feldman, Moriya and Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress in Surface Deformation of He-Implanted Surfaces" *Journal of Applied Physics*, vol. 48, No. 1, Jan. 1977, pp. 9-17.

Evans, J.H., "An Interbubble Fracture Mechanism of Blister Formation on Helium-Irradiated Metals" *Journal of Nuclear Materials*, 68, 1977, pp. 129-140.

Feijoo et al., "Prestressing of Bonded Wafers", vol. 92-7, 1992, pp. 230-238.

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

French Search Report, FA 641570; FR 0312621, Jul. 19, 2004.

Fujitsuka et al., "A New processing Technique to Prevent Stiction Using Silicon Selective Etching for SOT-MEMS", *Sensors and Actruators*, A97-98, 2002, pp. 716-719.

Gamier, D. M., "The Fabrication of a Partial Soi Substrate", Proceedings of the 9th International Symposium on Silicon on Isolator Technology and Devices, vol. 99, Chap. 54, 1990, 73-78.

Gerasimenko, N., "Infrared Absorption of Silicon Irradiated by Protons", *Phys. stat.sol. (b)* 90, (1978), pp. 689-695.

Ghandi, Sorab, "VLSI Fabrication Princiles-Silicon and Gallium Arsenide", *Rensselaer Polytechnic Institute*, 1983, John Wiley & Sons publishers, pp. 135.

Goesele et al., "Semiconductor Wafer Bonding", Science and Technology, ECS Series, *Annual Review of Material Science*, vol. 28, New Jersey, 1999, pp. 215-241.

Greenwald, A.C., "Pulsed-electron-beam annealing of ion-implantation damage", *J. Appl. Phys.* 50(2), Feb. 1978, pp. 783-786.

Grovenor, C.R.M., *Microelectronic Materials*, pp. 73-75 (1989).

Guilhalmenc, C. et al, "Characterization by Atomic Force Microscopy of the SOI Layer Topography in Low Dose SIMOX Materials", *Materials Science and Engineering*, B46, 1997, pp. 29-32.

Haisma et al., Silicon-on-Insulator Wafer Bonding-Wafer Thinning Technological Evaluations, *JAPANese Journal of Applied Physics*, Aug. 28, 1989, No. 8, Part 1, Tokyo, Japan, pp. 1426-1443.

Hamaguchi et al., "Device Layer Transfer Technique using Chemi-Mechanical Polishing", *JAPANese Journal of Applied Physics*, Oct. 23, 1984, No. 10, Part 2, Tokyo, Japan, pp. L815-L817.

Hamaguchi et al., "Novel LSI/SOI Wafer Fabrication Using Device Layer Transfer Technique", *Proc. IEDM*, 1985, pp. 688-691.

Henttinen et al., "Mechanically Induced Si Layer Transfer if Hydrogen-Implanted Si-Wafers", *American Institute of Physics*, vol. 76, No. 17, 2000, pp. 2370-2372.

Hulett, D.M. et al., "Ion Nitriding and Ion Implantation: A Comparison," *Metal Progress*, 1985, pp. 18-21.

IBM Technical Disclosure Bulletin, *Isolation by Inert Ion Implantation*, 1986, vol. 29 No. 3, pp. 1416.

IBM Technical Disclosure Bulletin, *SOI Interposer Structure XP 000627972*, Jul. 1996, vol. 39 No. 7, pp. 1-5.

International Search Report, PCT/FR2004/002779, Mar. 23, 2005.

International Search Report, PCT/FR2004/002781, Mar. 23, 2005.

Japanese Office Action dated Oct. 25, 2007 for JAPANese Patent Application No. 2002-581572.

Jaussaud, C. et al., Microstructure of Silicon Implanted With High Dose Oxygen Ions, *Appl. Phys. Lett.*, vol. 48, No. 11, 1985, pp. 1064-1066.

Johnson, "High Fluence Deuteron Bombardment of Silicon", *Radiation Effects*, vol. 32, pp. 159-167.

Jones, K. S. et al., "A Systematic Analysis of Defects in Ion Implanted Silicon", *Applied Physics A.*, vol. 45, 1988 pp. 1-34.

Jones et al., "Enhanced elimination of implantation damage upon exceeding the solid solubility", *J. App. Phys.*, vol. 62, No. 10, 1987, pp. 4114-4117.

Kamada et al, Observation of Blistering and Amorphization on Germanium Surface After 450 keV Ar+ION Bombardment, *Radiation Effects*, vol. 28, 1976, pp. 43-48.

Klem, J.F., "Characteristics of Lift-Off Fabricated AlGaAs/InGaAs Single-Strained-Quantum Well Structures on Glass and Silicon Substrates", *Inst. Phys. Conf.* Serial No. 96: Chapter 6, (1989), pp. 387-392.

Komarov et al., Crystallographic Nature and Formation Mechanisms of Highly Irregular Structure in Implanted and Annealed S1, Layers*Radiation Effects*, vol. 42, 1979, pp. 169-178.

Kucheyev et al., "Ion Implantation Into GaN", *Materials Science and Engineering*, vol. 33, 2001, pp. 51-107.

Laporte A. et al., "Charged Defects At the Interface Between Directly Bonded Silicon Wafers"—Applied Physics, vol. 36 (Sep. 1997) pp. 5502-5506—Part 1, No. 9A.

Li, J., "Novel Semiconductor Substrate Formed by Hydrogen Ion Implantation into Silicon," Appl. Phys. Lett., vol. 55, No. 21, Nov. 20, 1989, pp. 2223-2224.

Ligeon, E., "Hydrogen Implantation in Silicon Between 1.5 and 60 KeV", *Radiation Effects 1976*, vol. 27, pp. 129-137.

Liu et al., "Investigation of Interface in Silicon-On-Insulator by Fractual Analysis", *Applied Surface Science*, vol. 187, Feb 28, 2002, pp. 187-191.

Liu et al. "Ion Implantation in GaN At Liquid-Nitoigen Temperature: Structural Characteristics and Amorphization", *Physical Review B of the American Physical Society*, vol. 57, No. 4, 1988, pp. 2530-2535.

Lu, X., et al., "SOI Material Technology Using Plasma Immersion Ion Implantation", Proceedings 1996 IEEE International SOI Conference, Oct. 1996, pp. 48-49.

Maleville, C. et al, "Physical Phenomena involved in the Smart-Cut Process", *Electrochemical Society Proceeding*, vol. 96-3, 1996—pp. 34-46.

Maleville, C. et al, "Wafer Bonding and Hi-Implantation Mechanisms Involved in the Smart-Cut Technology", 1997, pp. 14-19.
Manuaba, A., "Comparative Study on Fe32Ni36CrI4P12B 6 Metallic Glass and its Polycrystalline Modification bombarded by 2000 keV Helium Ions with High Fluence" *Nuclear Instruments and Methods*, (1982) pp. 409-419.
Mastrangelo, C. et al., "Suppression of Stiction in MEMS", *Proceedings of the Materials Research Society Seminar*, vol. 605, 2000, pp. 1-12.
Matsuda et al., "Large Diameter Ion Beam Implantation System," *Nuclear Instruments and Methods*, vol. B21, 1987, pp. 314-316.
Matsuo et al., "Abnormal solid solution and activation behavior in GA-implanted Si(100)", *Appl. Phys. Lett.*, vol. 51, No. 24, 1987, pp. 2037-2039.
Materne, A. et al., "Changes in Stress and Coercivity After Annealing of Amorphous Co (Zr, Nb) Thin Films DEuropesited by R. F. Sputtering", donloaded on Apr. 24, 2009, pp. 1752-1754.
Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.
Miyagawa, S. et al, "Helium Reemission During Implantation of Silicon Carbide", 1982, pp. 2302-2306.
Miyagawa, S., "Surface structure of silicon carbide Irradiated with helium ions with mono energy and continuous energy distributions" *J. Appl. Phys.* 53(12), Dec. 1982, pp. 8697-8705.
Monemar, B. "Shallow Impurities in Semiconductors 1998", Proceedings of the Third International Conference in Sweden, Aug. 10-12, 1988, No. 95, pp. 493-499.
Moreau, Wayne M., "Semiconductor Lithography, Principles, Practices, and Materials," Plenum Press, 1988. Table of Contents only.
Moriceau, H. et al, A New Characterization Process Used to Qualify SOI Films 1991 pp. 173-178.
Moriceau, H. et al, "A New Characterization Process Used to Qualify SOI Films", 1991 pp. 173-178.
Moriceau, H. et al. "Cleaning and Polishing As Key Steps for Smart-Cut SOI Process", Proceedings 1996 IEEE SOI Conference, Oct. 1996.
Moriceau, H. et al, "The Smart-Cut Process as a Way to Achieve Specific Film Thickness in Sal Structures", 1997, pages unknown.
Moriceau et al., (vol. 99-1) Meeting Abstract No. 405, "A New Characterization Process Used to Qualify SOI Films", the 195th Meeting of the Electrochemical Society, May 2-6, 1999, Seattle, Washington.
Munteanu, D. et al, "Detailed Characterization of Unibond Material", 1997, pp. 395-398.
Myers, D. R., "The effects of Ion-Implantation damage on the first order Raman spectra GaPa" *J. Appl. Phys.* 54(9), Sep. 1977.
Nethling. J. et al, "Identification of Hydrogen Platelets in ProtonBombarded GaAs", 1985, pp. 941-945.
Nichols C. S et al., "Properties of Hydrogen in Crystalline Silicon Under Compression and Tension", *Physical Review Letters*, vol. 63, No. 10, 1989, pp. 1090-1093.
Nicoletti, S. et al., "Bi-Epitaxial YBCO Grain Boundry Josephson Junctions on SrTiO3 and Sapphire Substrates", *Physics C269*, 1996, pp. 255-267.
Office Action (Non-Final) for U.S. Appl. No. 11/327,906—Dated Oct. 1, 2007 (67).
Office Action (Final) for U.S. Appl. No. 11/327,906—Dated Feb. 11, 2008 (67).
Ono et al., "Orientation Dependence of Flaking of Ion Irradiated Aluminum Single Crystals", *Japanese Journal of Applied Physics*, vol. 25, No. 10, 1986, pp. 1475-1480.
Paszti, E, "Flaking and Wave-Like Structure on Metallic Glasses Induced by MeV-Energy Helium Ions", *Nuclear Instruments and Methods*, vol. 209/210, (1983), pp. 273-280.
Picraux, S. Thomas et al., "Ion Implantation of Surfaces," *Scientific American*, vol. 252, No. 3, pp. 102-113 1985.
Pollentier, et al., "Fabrication of High-Radiance LEDs by Epitaxial Lift-Off", *SPIE*, vol. 1361, 1990, pp. 1056-1062.
Popov, V.P. et al., "Blistering on a Silicon Surface in the Process of Sequential Hydrogen/Helium ION Co-Iplantation"—Optoeleciron-ics Instrumentation and Data Processing, No. 3, Apr. 5, 2001—pp. 90-98—2001.
Primak, W., "Impurity Effect in the Ionization Dilation of Vitreous Silica" *J. Appl. Phys.* 39(13) 1968.
Reissue U.S. Appl. No. 10/449,786.
Renier, M. et al., "A New Low-Energy Ion Implanter for Bombardment of Cylindrical Surfaces," *Vacuum*, vol. 35, No. 12, pp. 577-578, 1985.
Roth, J., "Blistering and Bubble Formation" *Inst. Phys. Conf.* Serial No. 28, 1976: Chapter 7, pp. 280-293.
Sah, Chih-Tang et al., "Deactivation of the Boron Acceptor in Silicon by Hydrogen," *Appl. Phys. Lett.* 43, (2), Jul. 1983, pp. 204-206.
Saint-Jacques R. G., "La Formation des Cloques", *Nuclear Instruments and Methods*, No. 209/210, North Holland Publishing Co., 1983, pp. 333-343.
Schnell et al., "Plasma Surface Texturization for Multicrystaline Silicon Solar Cells", *IEEE*, XXVIII, Photovoltaic Conference, 2000, pp. 367-370.
Shintani, A. et al., "Temperature dependence of stresses in chemical deposited vitreous films", *J. Appl. Phys.*, vol. 51, No. 8, 1980, pp. 4197.
Silicon-On-Insulator, *European Semiconductor*, Mar. 1997, pp. 17 and 18.
Sioshansi, Piran, "Ion Beam Modification of Materials for Industry," *Thin Solid Film*, vol. 118, 1984, pp. 61-71.
Snyman, H. C., "Transmission Electron Microscopy of Extended Crystal Defects in Proton Bombarded and Annealed GaAs", *Radiation Effects*, 1983, vol. 69, pp. 199-230.
Snyman, H. C. et al, "Void Formation in Annealed Proton-Bombarded GaAs", 1981, pp. 243-245.
Stein, Myers and Follstaedt, "Infrared Spectroscopy of chemically bonded hydrogen at voids and defects in silicon", *J. Appl. Phys.* 73(b6), Mar. 15, 1993, pp. 2755-2764.
Stephen, D., "Investigation of Lattice Strain in Proton-Irradiated GaP by a Modified Auleytner Technique" *Phys. stat. sol.* (a) 87, 1985, pp. 589-596.
Sunkara et al., "Bulk synthesis of silicon nanowires using a low-temperature vapor-liquid-solid solution", *Applied Physics Letters*, vol. 79, No. 10, Sep. 3, 2001, pp. 1546-1548.
Suzuki et al., "High-Speed and Low Power n+-p+ Double-Gate SOI CMOS", *IEICE Trans. Electron.*, vol. E78-C, No. 4, 1995, pp. 360-367.
Sze, S.M., VLSI Technology, 2.sup.nd Ed., 1988, pp. 9-10.
Tan, T. Y. et al., "On Oxygen Precipitation Retardation/Recovery Phenomena, Nucleation Incubation Phenomena and the Exigent-Accomodation-Volume Factor of Precipitation", *Proceedings of the 5th International Symposium on Silicon Materials Science and Technology, Semiconductor Silicon 198 Electrochem. Soc.*, New Jersey, 1986, pp. 864-873.
Terada, K. et al., "A New Dram Cell With a Transistor on a Lateral Epitaxial Silicon Layer (Tole Cell)", *IEEE Transactions on Electron Device*, vol. 37, No. 9, 1990, pp. 2052-2057.
Terreault, Bernard, "Hydrogen Blistering of Silicon: Progress in Fundamental Understanding", *Phys. Stat. Sol.* (a) 204, No. 7, 2007, pp. 2129-2184.
Theodore, N. David et al., TFSOI With Improved Oxidation Resistance (to Reduce Isolation Induced Stresses and Leakage), Motorola Bulletin XP 000691920, *Technical Developments*, Nov. 1996, pp. 158-159.
Timoshenko, S. et al., "Analysis of Bi-Metal Thermostats", *J. Opt. Soc. Am.*, vol. 11, 1925, pp. 233-256.
Tong et al., "Low Temperature Si Layer Splitting", Proceedings 1997 IEEE International SOI Conference, Oct. 1997, pp. 126-127.
Tonini, Monelli, Cornl, Ottaviani, Frabboni, Canteri, Queirolo, "Hydrogen Interaction with phosphorus ion implantated silicon", *Ion Implantation Technology—94*, (1995) pp. 801-804.
Tzeng, J.C., "A Novel Self-Aligned Oxgyen (Salox) Implanted SOI Mosfet Device Structure" *Nuclear Instruments and Methods in Physics Research* B2, 1987, pp. 112-115.

U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.

Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.

Van de Walle, C. "Theoretical Aspects of Hydrogen in Crystalline Semiconductors", *Physica B*, Holland, vol. 170, No. 15, 1991, pp. 21-32.

Van de Walle, C. "Theory of Hydrogen Diffusion and Reactions in Crystalline Silicon", *Physical Review Letters*, vol. 64, No. 6, 1980, pp. 669-672.

Van de Walle, C. "Theory of Hydrogen Diffusion and Reactions in Crystalline Silicon", *Physical Review B*, vol. 39, No. 15, 1989, pp. 10 791-10 808, plus diagrams.

Van Swijgenhoven et al. "Helium Bubble and Blister Formation for Nickel and an AMorphous Fe-Ni-Mo-B Alloy During 5 kev He-+-Irradiation at Temperatures Between 200 K and 600", *Nuclear Instruments and Methods*, 209/210, 1983, pp. 461-468.

Veldkamp, W.B. et al., "Binary Optics," *Scientific American*, 1992, pp. 50-55.

Venezia et al., "The Role of Implantation Damage in the Production of Silicon-On-Insulator Films by Co-Implantation of $He^+$ and $H^+$", Electrochemical Society Proceedings vol. 98-1, 1998—pp. 1384-1395.

Weldon et al., "Mechanism of Silicon Exfoliation Induced by Hydrogen/Hekium Co-implantation", *Applied Physics Letters*, vol, 73, No. 25, pp. 3721-3723, Dec 21, 1998.

Wemple, S.H., "Optical and channeling studies of ion-bombarded GaP", *J. Appl. Phys.*, vol. 45, no. 4, Apr. 1974, pp. 1578-1588.

Whitton, J. L. et al., "The Collection of Ions Implanted in Semiconductors: 1 Saturations Effects", *Radiation Effects*, Scotland, vol. 16, 1972, pp. 101-105.

Wiegand, M. et al., "Wafer Bonding of Silicon Wafers Covered With Various Surface Layers", Sensors and Actuators, Elsevier Science B.V., vol. 86, 2000, pp. 91-95.

Williams J. et al., "Annealing behaviour of high-dose rare-gas implantations into silicon", from Application of Ion Beams to Materials, 1975, Chap. 1, *Inst. Phys. Conf.* Ser. No. 28, 1976, pp. 30-36.

Wittmaack et al., "High Fluence Retention of Noble Gases Implanted in Silicon" *Radiation Effects*, vol. 39, 1978, pp. 81-95.

Wolf, Stanley Ph.D., Silicon Processing for the VLSI Era (vol. 2), Lattice Press, 1990, pp. 66-79.

Wong et al., "Integration of GaN Thin Films With Dissimilar Substrate Materials by Pd-In Metal Bonding and Laser Lift-Off", Journal of Electronic Materials, vol. 28, No. 12, 1999, pp. 1409-1413.

Yamaguchi H. et al., "Intelligent Power IC With Partial SOI Structure", *Jpn. J. Appl. Phys.*, vol. 34, 1995, pp. 864-868.

Yee et al., "Polysilicon Surface-Modification Technique to Reduce Sticking of Microstructures", *Sensors and Actuators* A 52, 1996, pp. 145-150.

Yun et al., "Fractional Implantation Area Effects on Patterned Ion-Cut Silicon Layer Transfer", Dept. of Electrical Eng, and Computer Sciences, University of California, Berkley, CA, 94720, USA, 1999 IEEE International SOI Conference, Oct. 1999, pp. 129-130.

Yun et al., "Thermal and Mechanical Separations of Silicon Layers From Hydrogen Pattern-Implanted Wafers", *Journal of Electronic Materials*, vol. 38, No. 8, Apr. 24, 2001, pp. 960-964.

Yun, H. et al., "Transfer of Patterned Ion-Cut Silicon Layers", *Applied Physics Letters*, vol. 73, No. 19, 1998, pp. 2772-2774.

U.S. District Court District of Delaware (Wilmington) Civil Docket for Case #: 1:08-cv-00292-SLR—(54 pgs).

Complaint filed with Jury Demand against MEMC Electronic Materials Inc.—Magistrate Consent Notice to Pltf. ( Filing fee $350, receipt No. 152004.)—filed by SOITEC Silicon on Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).

Notice of Availability of a U.S. Magistrate Judge to Exercise Jurisdiction (sns, ) (Entered: May 20, 2008) (1 pg).

Report to the Commissioner of Patents and Trademarks for Patent/Trademark Nos. RE39,484 E; 6,809,009; 7,067,396 B2; (sns, ) (Entered: May 20, 2008) (1 pg).

Summons Returned Executed by SOITEC Silicon on Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).

Motion for Pro Hac Vice Appearance of Attorney George W. Neuner, Alan M. Spiro, Brian M. Gaff and Carolyn D'Agincourt—filed by SOITEC Silicon on Insulator Technologies SA, Commissariat a LEnergie Atomique. (Attachments: # 1 Certificate of Compliance Certification by Counsel to Be Admitted Pro Hac Vice, # 2 Certificate of Compliance Certification by Counsel to Be Admitted Pro Hac Vice, # 3 Certificate of Compliance Certification by Counsel to Be Admitted Pro Hac Vice, # 4 Certificate of Compliance Certification by Counsel to Be Admitted Pro Hac Vice, # 5 Certificate of Service)(Kraft, Denise) (Entered: May 23, 2008) (6 pgs).

Stipulation to Extend Time Answer to Complaint to Jul. 9, 2008—filed by MEMC Electronic Materials Inc.. (Rogowski, Patricia) (Entered: Jun. 5, 2008) (1 pg).

Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).

Motion for Pro Hac Vice Appearance of Attorney Michael L. Brody, Richard P. Gilly, Gail J. Standish, Marcus T. Hall and Jason S. Charkow—filed by SOITEC Silicon on Insulator Technologies SA. (Attachments: # 1 Certification by Counsel to be Admitted Pro Hac Vice, # 2 Certification by Counsel to be Admitted Pro Hac Vice, # 3 Certification by Counsel to be Admitted Pro Hac Vice, # 4 Certification by Counsel to be Admitted Pro Hac Vice, # 5 Certification by Counsel to be Admitted Pro Hac Vice)(Kraft, Denise) (Entered: Jun. 10, 2008) (8 pgs).

Disclosure Statement pursuant to Rule 7.1 filed by SOITEC Silicon on Insulator Technologies SA, Commissariat a LEnergie Atomique. (Attachments: # 1 Certificate of Service)(Kraft, Denise) (Entered: Jun. 16, 2008) (3 pgs).

Motion to Dismiss Based upon or, in the Alternative, Motion for a More Definite Statement—filed by MEMC Electronic Materials Inc. (Rogowski, Patricia) (Entered: Jul. 9, 2008) (4 pgs).

Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).

Disclosure Statement pursuant to Rule 7.1 filed by MEMC Electronic Materials Inc. (Rogowski, Patricia) (Entered: Jul. 9, 2008) (3 pgs).

Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).

Sealed Reply Brief re 10 Motion to Dismiss Based upon or, in the Alternative, Motion for a More Definite Statement filed by Memo Electronic Materials Inc. (Rogowski, Patricia) (Entered: Aug. 07, 2008) Redacted Reply Brief re 14 - re 10 Motion to Dismiss Based upon or, in the Alternative, Motion for a More Definite Statement filed by Memo Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 07, 2008) (98 pgs).

Redacted Reply Brief re 14—re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).

Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).
Motion for Pro Hac Vice Appearance of Attorney B. Scott Eidson—filed by MEMC Electronic Materials Inc. (Attachments: # 1 Exhibit Certification by Counsel to be Admitted Pro Hac Vice)(Rogowski, Patricia) (Entered: Feb. 23, 2009) (4 pgs).
Notice of Service of Plaintiffs' Initial Disclosures Pursuant to Fed. R. Civ. P. 26(a)(1) by SOITEC Silicon on Insulator Technologies SA, Commissariat a L'Energie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Notice of Service of MEMC Electronic Materials, Inc.'s Initial Disclosures by MEMC Electronic Materials Inc. (Rogowski, Patricia) (Entered: Mar. 6, 2009) (3 pgs).
Proposed Order Proposed Scheduling Order re 16 Memorandum and Order, Set Hearings, by SOITEC Silicon on Insulator Technologies SA, Commissariat a 'LEnergie Atomique. (Kraft, Denise) (Entered: Mar. 10, 2009) (7 pgs).
Letter to the Honorable Sue L. Robinson from Denise Seastone Kraft, Esq. regarding [Proposed] Scheduling Order—re 21 Proposed Order, 16 Memorandum and Order, Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon on Insulator Technologies SA, Commissariat a L'Energie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order,, Set Hearings, by SOITEC Silicon on Insulator Technologies SA, Commissariat a L'Energie Atomique. (Kraft, Denise) (Entered: Mar. 12, 2009) (7 pgs).
Letter to the Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).
Scheduling Order: Case referred to the Magistrate Judge for the purpose of exploring ADR. Joiner of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).
Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).
Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It Is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).
Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).
Motion to Dismiss Based upon Fed. R. Civ. P. 12(b)(1) and (6) and Article III of the United States Constitution—filed by SOITEC Silicon on Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon on Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).
Answer to 19 Answer to Complaint, Counterclaim Partial Answer to Defendant's Counterclaims, Affirmative Defenses and Soitec Counterclaims, Counterclaim against MEMC Electronic Materials Inc. By SOITEC Silicon on Insulator Technologies SA, Commissariat a LEnergie Atomique. (Attachments: # 1 Certificate of Service)(Kraft, Denise) (Entered: Apr. 7, 2009) (18 pgs).
Notice of Service of First Request for Production of Documents and Things Directed to Commissariat a L'Energie Atomique; First Request for Production of Documents and Things Directed to SOITEC Silicon on Insulator Technologies, S.A. and SOITEC USA, Inc.; and First Set of Interrogatories Directed to SOITEC Silicon on Insulator Technologies, S.A., Soitec USA, Inc. and Commissariat a L'Energie Atomique by MEMC Electronic Materials Inc. (Rogowski, Patricia) (Entered: Apr. 14, 2009) (3 pgs).
Stipulation to Extend Time Defendant to File Answering Brief in Opposition to Plaintiffs' Partial Motion to Dismiss Counterclaim Counts II, Ill, IV, V, and VIII to May 6, 2009—filed by MEMC Electronic Materials Inc. (Rogowski, Patricia) (Entered: Apr. 21, 2009) (3 pgs).
Answer to 32 Answer to Counterclaim,,, of S.O.I. TEC Silicon on Insulator Technologies, S.A. and SOITEC U.S.A., Inc. by MEMC Electronic Materials Inc. (Rogowski, Patricia) (Entered: Apr. 23, 2009) (4 pgs).
Stipulation to Extend Time Answering Brief in Opposition to Plaintiffs' Partial Motion to Dismiss Counterclaim Counts II, Ill, IV, V and VIII to May 15, 2009—filed by MEMC Electronic Materials Inc.. (Rogowski, Patricia) (Entered: May 6, 2009) (3 pgs).
Notice of Service of Soitec's First Set of Interrogatories (Nos. 1-17) and Soitec's First Set of Requests for Production of Documents and Things (Nos. 1-132) by SOITEC Silicon on Insulator Technologies SA, Commissariat a 'LEnergie Atomique. (Attachments: # 1 Certificate of Service)(Kraft, Denise) (Entered: May 6, 2009) (2 pgs).
Stipulation to Extend Time for Defendant to File an Answering Brief in Opposition to Plaintiffs' Partial Motion to Dismiss Counterclaim Counts II, Ill, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon on Insulator Technologies SA, Commissariat a L'Energie Atomique. (Attachments: # 1 Certificate of Service)(Kraft, Denise) (Entered: May 13, 2009).
Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered—re 38 Stipulation to Extend Time. Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).
Stipulation to Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).
Notice of Service of (1) Soitec's Objections and Responses to MEMC's First Set of Interrogatories; (2) Soitecs Objections and Responses to MEMC's First Request for Production of Documents and Things; (3) CEAs Objections and Responses to MEMC's First Set of Interrogatories; and (4) CEAs Objections and Responses to MEMC's First Request for Production of Documents and Things by SOITEC Silicon on Insulator Technologies SA, Commissariat a L'Energie Atomique. (Attachments: # 1 Certificate of Service) (Kraft, Denise) (Entered: May 29, 2009).
Stipulation to extend date to Jun. 19, 2009 by which defendant may file an answering brief in opposition to plaintiffs' Partial Motion to Dismiss Counterclaim Counts II, Ill, IV, V, and VIII by MEMC Electronic Materials Inc.. (Rogowski, Patricia) (Entered: Jun. 5, 2009).
Notice of Service of MEMC's Answers to SOITEC's First Set of Interrogatories (Nos. 1-17) and MEMC's Responses to SOITEC's First Set of Requests for Production of Documents and Things (Nos. 1-132) by MEMC Electronic Materials Inc..(Rogowski, Patricia) (Entered: Jun. 5, 2009) So Ordered—re 42 Stipulation to Extend Time. Set Briefing Schedule: re 30 Motion to Dismiss. (Answering Brief due Jun. 19, 2009.). Signed by Judge Sue L. Robinson on Jun. 8, 2009. (lid) (Entered: Jun. 8, 2009).
Notice of Service of Soitec's Second Set of Requests for Production of Documents and Things (Nos. 133-135) re 41 Notice of Service by SOITEC Silicon on Insulator Technologies SA, Commissariat a LEnergie Atomique. Related document: 41 Notice of Service filed by SOITEC Silicon on Insulator Technologies SA, Commissariat a L'Energie Atomique. (Attachments: # 1 Certificate of Service)(Kraft, Denise) (Entered: Jun. 11, 2009).
Letter to Honorable Sue L. Robinson from Patricia Smink Rogowski regarding Transmitting Form of Protective Order. (Attachments: # 1 Form of Protective Order, # 2 Exhibit Exhibit A to Form of Protective Order)(Rogowski, Patricia) (Entered: Jun. 16, 2009).
Notice of Service of MEMC's Second Request for Production of Documents and Things Directed to S.O.I.TEC Silicon on Insulator Technologies, S.A. and Soitec USA, Inc. By MEMC Electronic Materials Inc. (Rogowski, Patricia) (Entered: Jun. 16, 2009) Set/Reset Hearings: Discovery Conference re-set per joint request of counsel for Sep. 16, 2009 08:30 AM in Courtroom 6B before Judge Sue L. Robinson. (nmf) (Entered: Jun. 18, 2009).
Stipulation to Extend Time Defendant's Answering Brief in Opposition to Plaintiffs' Partial Motion to Dismiss Counterclaim Counts II, Ill, IV, V, and VIII to Jul. 2, 2009—filed by MEMC Electronic Materials Inc.. (Rogowski, Patricia) (Entered: Jun. 19, 2009) So Ordered—re 47 Stipulation to Extend Time. Set Briefing Schedule: re 30 Motion to Dismiss (Answering Brief due Jul. 2, 2009.). Signed by Judge Sue L. Robinson on Jun. 23, 2009. (lid) (Entered: Jun. 23, 2009) So Ordered, re 45 Protective Order. Signed by Judge Sue L. Robinson on Jun. 30, 2009. (nmf) (Entered: Jun. 30, 2009).
Notice of by SOITEC Silicon on Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).
Notice of Service of MEMC's Responses to SOITEC's Second Set of Requests for Production of Documents and Things Directed to MEMC by MEMC Electronic Materials Inc..(Rogowski, Patricia) (Entered: Jul. 14, 2009).
Stipulation and [Proposed] Order to File an Amended Complaint by SOITEC Silicon on Insulator Technologies SA, Commissariat a LEnergie Atomique. (Attachments: # 1 Exhibit A, # 2 Certificate of Service)(Kraft, Denise) (Entered: Jul. 16, 2009).
Notice of Service of Soitec's Objections and Responses to MEMC's Second Request for Production of Documents and Things Directed to Soitec re 46 Notice of Service by SOITEC Silicon on Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).
Notice of Withdrawal of Docket Entry 51 by SOITEC Silicon on Insulator Technologies SA, Commissariat a L'Energie Atomique re 51 Notice of Service, (Attachments: # 1 Certificate of Service)(Kraft, Denise) (Entered: Jul. 17, 2009).
Notice of Service of Soitec's Objections and Responses to MEMC's Second Request for Production of Documents and Things Directed to SOITEC re 46 Notice of Service by SOITEC Silicon on Insulator Technologies SA, Commissariat a L'Energie Atomique. Related document: 46 Notice of Service filed by MEMC Electronic Materials Inc.. (Attachments: # 1 Certificate of Service)(Kraft, Denise) (Entered: Jul. 17, 2009).
Notice of Service of MEMC Electronic Materials, Inc.'s Second Set of Interrogatories Directed to S.O.I.TEC Silicon on Insulator Technologies, S.A., SOITEC USA, Inc. and Commissariat a L'Energie Atomique by MEMC Electronic Materials Inc..(Rogowski, Patricia) (Entered: Jul. 17, 2009).
Notice of Service of Soitec's Production of Documents Bates Numbered SCEA 00000001 to SCEA 00002442 by SOITEC Silicon on Insulator Technologies SA, Commissariat a L'Energie Atomique. (Attachments: # 1 Certificate of Service)(Kraft, Denise) (Entered: Jul. 17, 2009) So Ordered, re 50 Stipulation. Signed by Judge Sue L. Robinson on Jul. 20, 2009. (nmf) (Entered: Jul. 20, 2009).
Notice of Service of MEMC's Production of Documents Bates Numbered MEMC0300000 to MEMC0306530 by MEMC Electronic Materials Inc. (Rogowski, Patricia) (Entered: Jul. 20, 2009).
First Amended Complaint *for Patent Infringement* against MEMC Electronic Materials Inc.—filed by SOITEC Silicon on Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).
Notice of Service of Soitec S.A.'s Second Set of Interrogatories (Nos. 18-22) and CEA's First Set of Interrogatories (Nos. 1-11) by SOITEC Silicon on Insulator Technologies SA, Commissariat a L'Energie Atomique. (Attachments: # 1 Certificate of Service)(Kraft, Denise) (Entered: Jul. 23, 2009).
Notice of Service of S.O.I.TEC Silicon on Insulator Technologies, S.A. and Commissariat a Lenergie Atomique Supplemental Production of Documents Bates Numbered SLIT 00000001 to SLIT 00049728 re 43 Notice of Service, by SOITEC Silicon on Insulator Technologies SA, Commissariat a LEnergie Atomique. Related document: 43 Notice of Service, filed by MEMC Electronic Materials Inc.. (Attachments: # 1 Certificate of Service)(Kraft, Denise) (Entered: Jul. 27, 2009).
Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).
Notice of Service of MEMC's Production of Documents Bates Numbered MEMC0300000-MEMC0337055 by MEMC Electronic Materials Inc. (Rogowski, Patricia) (Entered: Aug. 5, 2009).
Notice of Service of S.O.I.TEC Silicon on Insulator Technologies, S.A. and Commissariat a L Energie Atomique's Revised Supplemental Production of Documents Bates Numbered SLIT00000001-SLIT0004886; SLIT00004931 SLIT00004985; SLIT00005169 SLIT00005174; SLIT00005241 SLIT00006368; and SLIT00006886-SLIT00049728 re 59 Notice of Service, by SOITEC U.S.A., Inc., SOITEC Silicon on Insulator Technologies SA, Commissariat a LEnergie Atomique. Related document: 59 Notice of Service, filed by SOITEC Silicon on Insulator Technologies SA, Commissariat a LEnergie Atomique. (Attachments: # 1 Certificate of Service)(Kraft, Denise) (Entered: Aug. 6, 2009).
Stipulation to Extend Time to Answer or Otherwise Respond to MEMC's Amended Counterclaims to Aug. 31, 2009—filed by SOITEC Silicon on Insulator Technologies SA, SOITEC U.S.A., Inc., Commissariat a L'Energie Atomique. (Attachments: # 1 Certificate of Service)(Kraft, Denise) (Entered: Aug. 25, 2009).
Notice of Service of S.O.I.TEC Silicon on Insulator Technologies, S.A. and Commissariat a L'Energie Atomique's Supplemental Production of Documents Bates Numbered SOIT 00000001 to SOIT 00003528 and SLIT 00049729 to SLIT 00060612 by SOITEC Silicon on Insulator Technologies SA, SOITEC U.S.A., Inc., Commissariat a L'Energie Atomique. (Attachments: # 1 Certificate of Service)(Kraft, Denise) (Entered: Aug. 25, 2009).
Notice of Service of MEMC's Production of Documents Bates Numbered MEMC0337056 to MEMC0337503 and MEMC0337504-MEMC0338047 by MEMC Electronic Materials Inc..(Rogowski, Patricia) (Entered: Aug. 26, 2009).

Notice of Service of (1) SOITECs Supplemental Responses to MEMC Electronic Materials, Inc's First Set of Interrogatories; and (2) CEAs Supplemental Responses to MEMC Electronic Materials, Inc.s First Set of Interrogatories re 41 Notice of Service,, by SOITEC Silicon on Insulator Technologies SA, SOITEC U.S.A., Inc., Commissariat a L'Energie Atomique. Related document: 41 Notice of Service,, filed by SOITEC Silicon on Insulator Technologies SA, Commissariat a L'Energie Atomique. (Attachments: # 1 Certificate of Service)(Kraft, Denise) (Entered: Aug. 26, 2009).

Notice of Service of MEMC's Supplemental Answers to SOITEC's First Set of Interrogatories by MEMC Electronic Materials Inc.. (Rogowski, Patricia) (Entered: Aug. 27, 2009) So Ordered—re 63 Stipulation to Extend Time. Set/Reset Answer Deadlines: SOITEC Silicon on Insulator Technologies SA answer due Aug. 31, 2009; Commissariat a L'Energie Atomique answer due Aug. 31, 2009; SOITEC U.S.A., Inc. answer due Aug. 31, 2009. Signed by Judge Sue L. Robinson on Aug. 27, 2009. (lid) (Entered: Aug. 27, 2009).

Answer to 60 Answer to Amended Complaint, Counterclaim,,, Counterclaim *Reply to Defendant's Amended Counterclaims, Counterclaims and Affirmative Defenses* against MEMC Electronic Materials Inc. by SOITEC Silicon on Insulator Technologies SA, Commissariat a L'Energie Atomique, SOITEC U.S.A., Inc.. (Attachments: # 1 Certificate of Service)(Kraft, Denise) (Entered: Aug. 31, 2009).

Notice of Service of MEMC's Third Set of Interrogatories Directed to S.O.I.TEC Silicon on Insulator Technologies, S.A., SOITEC USA, Inc., and Commissariat a L'Energie Atomique by MEMC Electronic Materials Inc. (Rogowski, Patricia) (Entered: Sep. 1, 2009).

Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).

Notice of Service of Soitec S.A.'s Third Set of Interrogatories (Nos. 23-27) re 58 Notice of Service, by SOITEC Silicon on Insulator Technologies SA, SOITEC U.S.A., Inc., Commissariat a LEnergie Atomique. Related document: 58 Notice of Service, filed by SOITEC Silicon on Insulator Technologies SA, Commissariat a LEnergie Atomique. (Attachments: # 1 Certificate of Service)(Kraft, Denise) (Entered: Sep. 22, 2009).

Notice of Service of MEMC Electronic Materials Inc.'s Answers to SOITEC S.A.'s Second Set of Interrogatories (Nos. 8-22) and MEMC Electronic Materials, Inc.'s Answers to CEA'S First Set of Interrogatories (Nos. 1-11) by MEMC Electronic Materials Inc.. (Rogowski, Patricia) (Entered: Oct. 16, 2009).

Notice of Service of S.O.I.TEC Silicon on Insulator Technologies, S.A. and Commissariat a L'Energie Atomique's Supplemental Production of Documents Bates Numbered SOIT 00003529 to SOIT 00004244 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 16, 2009).

Notice of Service of S.O.I.TEC Silicon on Insulator Technologies, S.A. and Commissariat a L'Energie Atomique's Supplemental Production of Documents Bates Numbered SOIT 00003258.001-.057; SOIT 00003342.001-.007; SOIT 00003343.001-.009; (Con't)—SOIT 00003409.001-.015; and SOIT 00003469.001-.015 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 16, 2009).

Notice of Service of SOITEC/CEA Parties' Objections and Responses to MEMC Electronic Materials, Inc.'s Second Set of Interrogatories by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 16, 2009).

Notice of Service of S.O.I.TEC Silicon on Insulator Technologies, S.A. and Commissariat LEnergie Atomique Supplemental Production of Documents Bates Numbered SOIT 00004245 to SOIT 00205027 by SOITEC Silicon on Insulator Technologies SA, SOITEC U.S.A., Inc., Commissariat a LEnergie Atomique. (Attachments: # 1 Certificate of Service)(Kraft, Denise) (Additional attachment(s) added on Oct. 23, 2009: # 2 revised) (lid). Modified on Oct. 23, 2009 (lid). (Entered: Oct. 16, 2009).

Motion to Bifurcate *the Issues of Willfulness and Damages for Purposes of Discovery and Trial and proposed Form of Order*—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).

Opening Brief in Support re 77 Motion to Bifurcate *the Issues of Willfulness and Damages for Purposes of Discovery and Trial and proposed Form of Order* filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).

Notice of Service of MEMC's Production of Documents Bates Numbered MEMC0338048-MEMC0345027 by MEMC Electronic Materials Inc. (Rogowski, Patricia) (Entered: Oct. 23, 2009).

Notice of Service of S.O.I.TEC Silicon on Insulator Technologies, S.A. and Commissariat a L'Energie Atomique Supplemental Production of Replacement Documents Bates Numbered SCEA 00001337 to SCEA 00001339; SCEA 00002434 to SCEA 00002439; SOIT 00007961; SOIT 00006718 to SOIT 00006727; and SOIT 00007595 to SOIT 00007598 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 23, 2009) Correcting Entry: Pursuant to request of counsel, correct pdf of D.I. 76 has been attached and text of entry has been modified to correct bates number (lid) (Entered: Oct. 23, 2009).

Notice of Service of of S.O.I.TEC Silicon on Insulator Technologies, S.A. and Commissariat a L'Energie Atomique's Supplemental Production of Documents Bates Numbered SOIT 00205028 to SOIT 00206175; SCEA 00002443 to SCEA 00003974; and SLIT 00060613 to SLIT 00063784 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 28, 2009).

Notice of Service of MEMC'S Answers TO SOITEC S.A.'s Third Set of Interrogatories (Nos. 23-27) by MEMC Electronic Materials Inc.. (Rogowski, Patricia) (Entered: Oct. 28, 2009).

Notice of Service of S.O.I.TEC Silicon on Insulator Technologies, S.A. and Commissariat a L'Energie Atomique's Supplemental Production of Documents Bates Numbered SOIT 00206176 to SOIT 00206183 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 28, 2009).

Notice of Service of SOITEC/CEA Parties' Objections and Responses to MEMC Electronic Materials, Inc.'s Third Set of Interrogatories by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 29, 2009).

Cross Motion to Bifurcate *all Collateral Issues*—filed by SOITEC Silicon on Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).

Answering Brief in Opposition re 85 Cross Motion to Bifurcate *all Collateral Issues*, 77 Motion to Bifurcate *the Issues of Willfulness and Damages for Purposes of Discovery and Trial and proposed Form of Order* filed by SOITEC Silicon on Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).

Notice of Service of CEA's Second Set of Interrogatories (Nos. 12-16) by SOITEC Silicon on Insulator Technologies SA, SOITEC U.S.A., Inc., Commissariat a LEnergie Atomique. (Attachments: # 1 Certificate of Service)(Kraft, Denise) (Entered: Nov. 11, 2009) Correcting Entry: Pursuant to request of counsel, Exhibit A to D.I. 86 has been deleted and will be re-filed under seal by counsel at a later time (lid) (Entered: Nov. 12, 2009).

Sealed Exhibit re 86 Answering Brief in Opposition by SOITEC Silicon on Insulator Technologies SA, SOITEC U.S.A., Inc., Commissariat a LEnergie Atomique. (Attachments: # 1 Certificate of Service)(Kraft, Denise) (Entered: Nov. 12, 2009).

Reply Brief re 77 Motion to Bifurcate *the Issues of Willfulness and Damages for Purposes of Discovery and Trial and proposed Form of Order* filed by MEMC Electronic Materials Inc.. (Attachments: # 1 Exhibit 1, # 2 Exhibit 2, # 3 Exhibit 3)(Rogowski, Patricia) (Entered: Nov. 17, 2009).

Answering Brief in Opposition re 85 Cross Motion to Bifurcate *all Collateral Issues* filed by MEMC Electronic Materials Inc.. Reply Brief due date per Local Rules is Dec. 3, 2009. (Rogowski, Patricia) (Entered: Nov. 19, 2009).

Notice of Service of S.O.I.TEC Silicon on Insulator Technologies, S.A. and Commissariat a L'Energie Atomique's Supplemental Production of Documents Bates Numbered SOIT 00206184 to SOIT 00206997 by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 23, 2009).

Notice of Service of (1) Subpoena in a Civil Case to J. William Dockrey; (2) Subpoena in a Civil Case to Allan Fanucci, Esq.; (3) Amended Notice of Videotaped Deposition of Saeed Pirooz; (4) Notice of Videotaped Deposition of Commissariat a L'Energie Atomique; and (5) Notice of Videotaped Deposition of S.O.I.TEC Silicon on Insulator Technologies, S.A. and Soitec U.S.A., Inc. by MEMC Electronic Materials Inc.. (Rogowski, Patricia) (Entered: Nov. 30, 2009).

Notice of Service of S.O.I.TEC Silicon on Insulator Technologies, S.A. and Commissariat a L'Energie Atomique's Supplemental Production of Documents Bates Numbered BHR000000001 to BHR000036157 by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 2, 2009).

Reply Brief re 85 Cross Motion to Bifurcate *all Collateral Issues* filed by Commissariat a LEnergie Atomique, SOITEC Silicon on Insulator Technologies SA, SOITEC U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).

Notice of Service of S.O.I.TEC Silicon on Insulator Technologies, S.A. and Commissariat a L'Energie Atomique's Production of Three Boxes of Wafer Samples by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 04:00 PM in Courtroom 6B before Judge Sue L. Robinson. (nmf) (Entered: Dec. 9, 2009).

Notice of Service of (1) Six Cartons of 300 MM Wafer Samples and 1 Carton of 200 MM Wafer Samples; (2) Documents Marked MEMC0345028-MEMC0345084; (3) Documents Marked MEMC0345085-MEMC0345133; (4) MEMC's Answers to CEA's Second Set of Interrogatories (Nos. 12-16); and (5) MEMC's First Set of Requests for Admission to S.O.I.TEC Silicon on Insulator Technologies, S.A. and SOITEC USA, Inc. by MEMC Electronic Materials Inc..(Rogowski, Patricia) (Entered: Dec. 14, 2009).

Motion for Leave to File *Stipulated Motion for Leave to File a Sur-Reply Brief in Support of MEMC's Motion to Bifurcate*—filed by MEMC Electronic Materials Inc.. (Attachments: # 1 Exhibit 1)(Rogowski, Patricia) (Entered: Dec. 14, 2009).

Redacted Version of 88 Exhibit to a Document *Cross Motion to Bifurcate all Collateral Issues* by Commissariat a LEnergie Atomique, SOITEC Silicon on Insulator Technologies SA, SOITEC U.S.A., Inc.. (Kraft, Denise) (Entered: Dec. 14, 2009). So Ordered—re 97 Motion for Leave to File. Signed by Judge Sue L. Robinson on Dec. 16, 2009. (lid) (Entered: Dec. 16, 2009).

Sur-Reply Brief re 77 Motion to Bifurcate *the Issues of Willfulness and Damages for Purposes of Discovery and Trial and proposed Form of Order MEMC's Sur-Reply Brief in Support of Its Motion to Bifurcate the Issues of Willfulness and Damages for Purposes of Discovery and Trial* filed by MEMC Electronic Materials Inc.. (Rogowski, Patricia) (Entered: Dec. 16, 2009).

Notice of Service of S.O.I.TEC Silicon on Insulator Technologies, S.A. and Commissariat a L'Energie Atomique's Supplemental Production of Documents Bates Numbered SOIT 00207008 to SOIT 00207591 by SOITEC Silicon on Insulator Technologies SA, SOITEC U.S.A., Inc.. (Attachments: # 1 Certificate of Service)(Kraft, Denise) (Entered: Dec. 17, 2009). Minute Entry for proceedings held before Judge Sue L. Robinson—Conference held on Dec. 21, 2009. (Court Reporter V. Gunning.) (nmf) (Entered: Dec. 22, 2009). Oral Order by Judge Sue L. Robinson in open court on Dec. 21, 2009 granting 77 Motion to Bifurcate *the Issues of Willfulness and Damages for Purposes of Discovery and Trial and proposed Form of Order*, denying 85 Cross Motion to Bifurcate all Collateral Issues. (nmf) (Entered: Dec. 22, 2009).

Notice of Service of S.O.I.TEC Silicon on Insulator Technologies, S.A. and Commissariat L'Energie Atomique's Production 12 of CD-ROM Documents Bates Numbered SOIT 00207008 to SOIT 00207591 by Commissariat a LEnergie Atomique, SOITEC Silicon on Insulator Technologies SA, SOITEC U.S.A., Inc..(Kraft, Denise) (Entered: Dec. 22, 2009).

Notice of Service of S.O.I.TEC Silicon on Insulator Technologies, S.A. and Commissariat L'Energie Atomique's Supplemental Production of Documents Bates Numbered BHRO00036158 to BHRO00036584, served on Dec. 11, 2009; and S.O.I.TEC Silicon on Insulator Technologies, S.A. and Commissariat L'Energie Atomique's Supplemental Production of Documents Bates Numbered BHRO00036585 to BHRO00036731, served on Dec. 18, 2009 by SOITEC Silicon on Insulator Technologies SA, SOITEC U.S.A., Inc.. (Attachments: # 1 Certificate of Service)(Kraft, Denise) (Entered: Dec. 22, 2009). Correcting Entry: Pursuant to conversation docket clerk deleted Notice of filing due to document being filed improperly. Counsel will re-file document at a later time. (lid) (Entered: Jan. 4, 2010).

Notice of Service of S.O.I.Tec Silicon on Insulator Technologies, S.A. and SOITEC USA, Inc.'s Objections and Responses to MEMC's Nov. 25, 2009 Notice of 30(b)(6) Deposition of Soitec, and Commissariat a l'Energie Atomique's Objections and Responses to MEMC's Nov. 25, 2009 Notice of 30(b)(6) Deposition of CEA by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 4, 2010).

Stipulation to Amend Scheduling Order re 26 Scheduling Order,,, by MEMC Electronic Materials Inc.. (Rogowski, Patricia) (Entered: Jan. 6, 2010).

Notice of Service of S.O.I.TEC Silicon on Insulator Technologies, S.A. and Commissariat L'Energie Atomique's Production of Documents Bates Numbered HS0000001 to HS0000792 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 6, 2010).

Notice of Service of Documents Marked (1) MEMC0345134-MEMC0391283 and (2) MEMC0391284-MEM0413109 by MEMC Electronic Materials Inc..(Rogowski, Patricia) (Entered: Jan. 7, 2010). So Ordered—re 104 Stipulation Amending Scheduling Order. Order—Setting Scheduling Order Deadlines ( Claims Construction Opening Brief due by Jun. 18, 2010., Discovery due by Jun. 19, 2010.)(Refer to Stipulation for Further Details). Signed by Judge Sue L. Robinson on Jan. 7, 2010. (lid) (Entered: Jan. 7, 2010).

Notice of Service of S.O.I.TEC Silicon on Insulator Technologies, S.A. and Soitec USA, Inc.'s Responses to MEMC Electronic Materials, Inc.'s First Set of Requests for Admission by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 11, 2010).

Notice of Service of Documents Marked MEMC0413110-MEMC0459972 by MEMC Electronic Materials Inc..(Rogowski, Patricia) (Entered: Jan. 13, 2010).

Notice of Service of Notice of Videotaped Depositions of Emmanuel Huyghe, Clotilde Turleque, Christophe Maleville and Hubert Moriceau by MEMC Electronic Materials Inc..(Rogowski, Patricia) (Entered: Jan. 14, 2010).

Notice of Service of Notice of Videotaped Deposition of Norman Soloway by MEMC Electronic Materials Inc..(Rogowski, Patricia) (Entered: Jan. 14, 2010).

Notice of Service of Notice of Videotaped Depositions of (1) Emmanuel Arene, (2) Bruno Ghyselen, (3) Thierry Barge, (4) Chrystelle Legahe, (5) Konstantine Bourdelle, (6) Andre-Jacques Auberton-Herve, (7) Bernard Aspar, (8) Thierry Poumeyrol, and (9) Michel Bruel by MEMC Electronic Materials Inc..(Rogowski, Patricia) (Entered: Jan. 20, 2010).

Notice of Service of S.O.I.TEC Silicon on Insulator Technologies, S.A. and Commissariat L'Energie Atomique's Production 16 of CD-ROM Documents Bates Numbered SOIT 00207592 to SOIT 00218102 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 20, 2010).

Motion for Pro Hac Vice Appearance of Attorney Laura K. Carter—filed by Commissariat a LEnergie Atomique, SOITEC Silicon on Insulator Technologies SA, SOITEC U.S.A., Inc.. (Attachments: # 1 Text of Proposed Order, # 2 Certification, # 3 Certificate of Service)(Kraft, Denise) (Entered: Jan. 21, 2010). So Ordered—re 113 Motion for Pro Hac Vice Appearance of Attorney Laura K. Carter. Signed by Judge Sue L. Robinson on Jan. 26, 2010. (lid) (Entered: Jan. 26, 2010).

Notice of Service of S.O.I.TEC Silicon on Insulator Technologies, S.A. and Commissariat L'Energie Atomique's Production 17 of CD-Rom Documents Bates Numbered SOIT 00218103 to SOIT 00219113 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 27, 2010).

Notice of Service of S.O.I.TEC Silicon on Insulator Technologies, S.A. and Commissariat L'Energie Atomique's Production of Documents Bates Numbered SOIT 00219114 to SOIT 00219229 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 27, 2010).

Notice of Service of Documents Marked (1) MEMC0459973-MEMC-0526213; (2) MEMC0526214-MEMC-0526273; and (3) MEMC0484547-MEMC0526213 by MEMC Electronic Materials Inc..(Rogowski, Patricia) (Entered: Jan. 29, 2010).

Notice of Service of Six DVDs Containing Documents Marked MEMC0526274-MEMC0582949 by MEMC Electronic Materials Inc..(Rogowski, Patricia) (Entered: Feb. 2, 2010).

Notice of Service of Documents Marked MEMC0582950-MEMC0618792 by MEMC Electronic Materials Inc..(Rogowski, Patricia) (Entered: Feb. 8, 2010).

Notice of Service of Documents Marked (1) MEMC0618793-MEMC0697890 and (2) MEMC0697891-MEMC0715676 by MEMC Electronic Materials Inc..(Rogowski, Patricia) (Entered: Feb. 12, 2010).

Notice of Service of Documents Marked MEMC0715677-MEMC0772697 by MEMC Electronic Materials Inc..(Rogowski, Patricia) (Entered: Feb. 18, 2010).

Notice of Service of Notice of Videotaped Deposition by MEMC Electronic Materials Inc..(Rogowski, Patricia) (Entered: Feb. 19, 2010).

Notice of Service of S.O.I.TEC Silicon on Insulator Technologies, S.A. and Commissariat Lnergie Atomiques Production 19 of CD-ROM Documents Bates Numbered SOIT 00219230-SOIT 00242462, SOIT 00242514-SOIT 00271070, SOIT 00271093-SOIT 00277765, SOIT 00277802-SOIT 00280854 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).

Notice of Service of S.O.I.TEC Silicon on Insulator Technologies, S.A. and Commissariat Lnergie Atomiques Production 20 of CD-ROM Documents Bates Numbered SOIT 00280855-SOIT 00310785 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).

Notice of Service of S.O.I.TEC Silicon on Insulator Technologies, S.A. and Commissariat Lnergie Atomiques Production 21 of CD-ROM Documents Bates Numbered SCEA 00003975-SCEA 00004146 and SOIT 00310786-SOIT 00336534 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).

Notice of Service of S.O.I.TEC Silicon on Insulator Technologies, S.A. and Commissariat Lnergie Atomiques Production 22 of CD-ROM Documents Bates Numbered SCEA 00004147-SCEA 00031465 and SOIT 00336535-SOIT 00355547 and SOIT 00355554-SOIT 00359693 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).

Notice of Service of S.O.I.TEC Silicon on Insulator Technologies, S.A.'s Fourth Set of Interrogatories (Nos. 28-29) Directed to MEMC Electronic Materials, Inc. by Commissariat a LEnergie Atomique, SOITEC Silicon on Insulator Technologies SA, SOITEC U.S.A., Inc.. (Attachments: # 1 Certificate of Service)(Kraft, Denise) (Additional attachment(s) added on Mar. 24, 2010: # 1 Certificate of Service) (fms). (Entered: Mar. 3, 2010).

Stipulation to Amend Scheduling Order re 26 Scheduling Order,,, by MEMC Electronic Materials Inc.. (Rogowski, Patricia) (Entered: Mar. 12, 2010). So Ordered—re 127 Stipulation to Amend Scheduling Order. Order—Setting Scheduling Order Deadlines (Claims Construction Opening Brief due by Jun. 18, 2010., Discovery due bu Jun. 19, 2010.) (Refer to Stipulation for Details). Signed by Judge Sue L. Robinson on Mar. 15, 2010. (lid) (Entered: Mar. 15, 2010).

Notice of Service of (1) MEMC Electronic Materials, Inc.'s Second Set of Requests for Admission Directed to Plaintiffs and (2) MEMC Electronic Materials, Inc.'s Fourth Set of Interrogatories Directed to S.O.I.TEC Silicon on Insulator Technologies, S.A., SOITEC USA, Inc. and Commissariat a L'Energie Atomique by MEMC Electronic Materials Inc..(Rogowski, Patricia) (Entered: Mar. 23, 2010). Correcting Entry: Per request of counsel, the pdf attached to D.I. 126 (Notice of Service of S.O.I.TEC Silicon on Insulator Technologies, S.A.'s Fourth Set of Interrogatories (Nos. 28-29) Directed to MEMC Electronic Materials, Inc. by Commissariat a LEnergie Atomique, SOITEC Silicon on Insulator Technologies SA, SOITEC U.S.A., Inc.) has been deleted and replaced with the proper attachment with the correct date. (fms) (Entered: Mar. 24, 2010). Correcting Entry: Per request of counsel, D.I. 129 has been deleted and will be re-filed at a later time. (lid) (Entered: Mar. 29, 2010).

Notice of Service of S.O.I.TEC Silicon on Insulator Technologies, S.A.'s Production 23 Bates Numbered SOIT 00359694 and SOIT 00359695, including Wafer Samples by SOITEC Silicon on Insulator Technologies SA. (Attachments: # 1 Certificate of Service)(Kraft, Denise) (Entered: Mar. 29, 2010).

Notice of Service of S.O.I.TEC Silicon on Insulator Technologies, S.A.'s Production 24 of CD-ROM Documents Bates Numbered SOIT 00359696-SOIT 00419315 by SOITEC Silicon on Insulator Technologies SA. (Attachments: # 1 Certificate of Service)(Kraft, Denise) (Entered: Apr. 1, 2010).

Notice of Service of Electronic Production of OCR Text Files related to: (1) S.O.I.TEC Silicon on Insulator Technologies, S.A.'s Production 19 Bates Numbered SOIT 00219230-SOIT 00242462; SOIT 00242514-SOIT 00271070; SOIT 00271093-SOIT 00277765; SOIT 00277802-SOIT 00280854; (2) S.O.I.TEC Silicon on Insulator Technologies, S.A.'s Production 20 Bates Numbered SOIT 00280855-SOIT 00310785; and (3) S.O.I.TEC Silicon on Insulator Technologies, S.A. and Commissariat a L'Energie Atomique's Production 22 Bates Numbered SCEA 00004147-SCEA 00031465; SOIT 00336535-SOIT 00355547; and SOIT 00355554-SOIT 00359693 by Commissariat a LEnergie Atomique, SOITEC Silicon on Insulator Technologies SA. (Attachments: # 1 Certificate of Service)(Kraft, Denise) (Entered: Apr. 7, 2010).

Notice of Service of (1) Documents marked MEMC0772698-MEMC0775891; (2) Documents marked CRAV00000001-CRAV00000098; and (3) Document marked MEMC0775892 by MEMC Electronic Materials Inc..(Rogowski, Patricia) (Entered: Apr. 7, 2010).

Notice of Service of MEMC Electronic Materials, Inc.'s Supplemental Answer to CEA'S First Set of Interrogatories, MEMC's Answers to SOITEC S.A.'s Fourth Set of Interrogatories (Nos. 28-29), and MEMC's Supplemental Answers to SOITEC S.A.'s Third Set of Interrogatories (No. 23) by MEMC Electronic Materials Inc.. (Rogowski, Patricia) (Entered: Apr. 7, 2010). Set Hearings: Discovery Conference set for Apr. 23, 2010 09:30 AM in Courtroom 6B before Judge Sue L. Robinson. (nmf) (Entered: Apr. 21, 2010).

Notice of Service of S.O.I.TEC Silicon on Insulator Technologies, S.A.'s Production of Documents Bates Numbered SOIT 00419316 (updated from previously produced documents Bates numbered SOIT 00000159-SOIT 00000161) by SOITEC Silicon on Insulator Technologies SA. (Attachments: # 1 Certificate of Service)(Kraft, Denise) (Entered: Apr. 22, 2010). Minute Entry for proceedings held before Judge Sue L. Robinson—Discovery Conference held on Apr. 23, 2010. (Court Reporter V. Gunning.) (nmf) (Entered: Apr. 23, 2010).

Notice of Service of S.O.I.TEC Silicon on Insulator Technologies, S.A. and Commissariat a L'Energie Atomique's electronic production of: (1) Production #25 Bates Numbered SCEA00031466-SCEA00032999; SOIT00419316-SOIT00422470; and SOIT00422478-SOIT00461551; (2) Production #26 Bates Numbered SCEA00033000-SCEA00165680; SCEA00165686-SCEA00167229; SCEA00167232-SCEA00167288; and SOIT00461552-SOIT00474611; and (3) Production #27 Bates Numbered SCEA00167289-SCEA00167291; and SOIT00474611-SOIT00476375 by Commissariat a LEnergie Atomique, SOITEC Silicon on Insulator Technologies SA. (Attachments: # 1 Certificate of Service)(Kraft, Denise) (Entered: Apr. 29, 2010).

Notice of Service of Commissariat a L'Energie Atomique's Production #28 of CD-ROM Documents Bates Numbered SCEA00167292-SCEA00167308 by Commissariat a LEnergie Atomique. (Attachments: # 1 Certificate of Service)(Kraft, Denise) (Entered: Apr. 29, 2010).

Notice of Service of (1) Notice of Videotaped Deposition (Michael Bruel) and (2) Notice of Videotaped Deposition (S.O.I.TEC Silicon on Insulator Technologies, S.A. and SOITEC USA, Inc.) by MEMC Electronic Materials Inc..(Rogowski, Patricia) (Entered: May 3, 2010).

Notice of Service of (1) DVD Containing Video Marked CRA V00000099; (2) CD Containing Documents Marked MEMC0775893-MEMC0775948; (3) CD Containing Documents Marked MEMC0775949-MEMC0775954; and (4) DVD Containing Documents Marked MEMC0775955-MEMC0781961 by MEMC Electronic Materials Inc..(Rogowski, Patricia) (Entered: May 3, 2010).

Notice of Service of Commissariat a L'Energie Atomique's Production #29 of CD-ROM Documents Bates Numbered SCEA 00167309-SCEA 00167315 by Commissariat a LEnergie Atomique. (Attachments: # 1 Certificate of Service)(Kraft, Denise) (Entered: May 3, 2010).

Notice of Service of (1) S.O.I.TEC Silicon on Insulator Technologies, S.A., SOITEC USA, Inc., and Commissariat a L'Energie Atomique's Responses To MEMC's Fourth Set of Interrogatories; and (2) S.O.I.TEC Silicon on Insulator Technologies, S.A., and Commissariat a L'Energie Atomique's Responses to MEMC's Second Set of Requests for Admissions re 128 Notice of Service, bu Commissariat a LEnergieAtomique, SOITEC Silicon on Insulator Technologies SA, SOITEC U.S.A., Inc.. Related document: 128 Notice of Service, filed by MEMC Electronic Materials Inc.. (Attachments: # 1 Certificate of Service)(Kraft, Denise) (Entered: May 4, 2010). Reset Hearings: Oral Argument re-set per joint request of counsel for Sep. 3, 2010 09:30 AM in Courtroom 6B before Judge Sue L. Robinson. (nmf) (Entered: May 5, 2010).

Motion for Discovery Motion for the Admission of the Expert Testimony of John T. Goolkasian Relating to the Certificate of Correction for U.S. Patent No. 7,067,396—filed by MEMC Electronic Materials Inc.. (Rogowski, Patricia) (Entered: May 7, 2010).

Opening Brief in Support re 141 Motion for Discovery *Motion for the Admission of the Expert Testimony of John T. Goolkasian Relating to the Certificate of Correction for U.S. Patent No. 7,067,396* filed by MEMC Eletronic Materials Inc..Answering Brief/Response due date per Local Rules is May 24, 2010. (Attachments: 190 1 Exhibit1, # 2 Exhibit 2, # 3 Exhibit 3, # 4 Exhibit 4, # 5 Exhibit 5, # 6 Exhibit 6, # 7 Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patricia) (Entered: May 7, 2010).

Notice of Service of CD-ROM including re-submittal of documents Bates numbered SOIT 00310798-00336526 as Document Bates numbered SOIT 00310798 in native format by SOITEC Silicon on Insulator Technologies SA. (Attachments: # 1 Certificate of Service)(Kraft, Denise) (Entered: May 20, 2010).

Notice of Service of Amended Notices of Videotaped Deposition of (1) Dr. Bernard Aspar and (2) Dr. Michel Bruel by MEMC Electronic Materials Inc..(Rogowski, Patricia) (Entered: May 21, 2010).

Answering Brief in Opposition re 141 Motion for Discovery *Motion for the Admission of the Expert Testimony of John T. Goolkasian Relating to the Certificate of Correction for U.S. Patent No. 7,067,396 Plaintiff's Answering Brief in Opposition to Defendant's Motion for the Admission of Expert Testimony of John T. Goolkasian* filed by SOITEC Silicon on Insulator Technologies SA.Reply Brief due date per Local Rules is Jun. 4, 2010. (Attachments: # 1 Certificate of Service)(Kraft, Denise) (Entered: May 24, 2010).

Declaration re 145 Answering Brief in Opposition,, *Declaration of Marcus T. Hall Brief in Support of Plaintiff's Answering Brief in Opposition to Defendant's Motion for the Admission of Expert Testimony of John T. Goolkasian* by SOITEC Silicon on Insulator Technologies SA. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service)(Kraft, Denise) (Entered: May 24, 2010).

Letter to the Honorable Sue L. Robinson from Denise Seastone Kraft, Esq. regarding [Proposed] Third Stipulation to Amend Scheduling Order—re 26 Scheduling Order,,,. (Attachments: # 1 Text of Proposed Order)(Kraft, Denise) (Entered: May 25, 2010). Correcting Entry: Stipulation attached to D.I. 147 has been deleted due to document being filed improperly. Counsel is advised to re-file document using the Stipulation event code (lid) (Entered: May 25, 2010).

Stipulation [Proposed] Third Stipulation to Amend Scheduling Order re 26 Scheduling Order,,, 147 Letter by Commissariat a LEnergie Atomique, SOITEC Silicon on Insulator Technologies SA, SOITEC U.S.A., Inc.. (Kraft, Denise) (Entered: May 25, 2010). So Ordered—re 148 to Amend Scheduling Order. Order—Setting Scheduling Order Deadlines (Claims Construction Opening Brief due by Jun. 25, 2010., Discovery due by Jul. 30, 2010. Dispositive Motions due by Jul. 2, 2010., Answering Brief due Jul. 16, 2010., Reply Brief due Jul. 30, 2010.). Signed by Judge Sue L. Robinson on May 26, 2010. (lid) (Entered: May 26, 2010).

Notice of Service of Expert Reports of (1) Peter Moran, (2) John T. Goolkasian, (3) Robert Averback, and (4) Pascal Bellon by MEMC Electronic Materials Inc..(Rogowski, Patricia) (Entered: Jun. 2, 2010).

Notice of Service of S.O.I.TEC Silicon on Insulator Technologies, S.A.'s Production 31 of CD-ROM Documents Bates Numbered SOIT 00476382 to SOIT 00476394 by SOITEC Silicon on Insulator Technologies SA. (Attachments: # 1 Certificate of Service)(Kraft, Denise) (Entered: Jun. 2, 2010).

Notice of Service of (1) Expert Report of Andrew Hirt; (2) Expert Report of John Bravman regarding Invalidity of United States Patent No. 5,834,812; and (3) Expert Report of John Bravman regarding Infringement by Defendant MEMC by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 2, 2010).

Reply Brief *In Support of 141 Motion for Discovery Motion for the Admissin of the Expert Testimony of John Y. Goolkasian Relating to the Certificate of Correction for U.S. Patent No. 7,067,396* filed by MEMC Electronic Materials Inc.. (Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered: Jun. 4, 2010).

Notice of Service of S.O.I.TEC Silicon on Insulator Technologies, S.A.'s Production 32 of CD-ROM Documents Bates Numbered SOIT 00476395 to SOIT 00476441 by SOITEC Silicon on Insulator Technologies SA. (Attachments: # 1 Certificate of Service)(Kraft, Denise) (Entered: Jun. 7, 2010).

Statement re 148 Stipulation *Joint Claim Construction Statement* by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).

Claim Construction Chart by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).
Notice of Service of (1) S.O.I.TEC Silicon on Insulator Technologies, S.A.'s Production 33 of CD-ROM Documents Bates Numbered SOIT 00476442 to SOIT 00476456; and (2) S.O.I.TEC Silicon on Insulator Technologies, S.A.'s Production 33 Supplement including CD-ROM Documents Bates Numbered SOIT 00476442 to SOIT 00476456 (duplicates of Production 33) and SOIT 00476457 (Burg Translations, Inc. Certification) by SOITEC Silicon on Insulator Technologies SA. (Attachments: # 1 Certificate of Service)(Kraft, Denise) (Entered: Jun. 15, 2010).
Sur-Reply Brief re 141 Motion for Discovery *Motion for the Admission of the Expert Testimony of John T. Goolkasian Relating to the Certificate of Correction for U.S. Patent No. 7,067,396 Surreply by Plaintiffs to Motion by Defendant fo the Admission of Expert Testimony of John T. Goolkasian* filed by SOITEC Silicon on Insulator Technologies SA. (Attachments: # 1 Certificate of Service)(Kraft, Denise) (Entered: Jun. 15, 2010).
Declaration re 157 Sur-Reply Brief, *Declaration of Marcus T. Hall in Support of Surreply by Plaintiffs to Motion by Defendant for the Admission of Expert Testimony of John T. Goolkasian* by SOITEC Silicon On Insulator Technologies SA. (Attachments: # 1 Exhibit A, # 2 Exhibit B, # 3 Exhibit C, # 4 Exhibit D, # 5 Certificate of Service)(Kraft, Denise) (Entered: Jun. 15, 2010).
Notice of Service of Videotaped Depositions for Dr. John C. Bravman and Andrew M. Hirt by MEMC Electronic Materials Inc. (Rogowski, Patricia) (Entered: Jun. 18, 2010).
Stipulation Stipulated Motion for Leave to Exceed Page Limit Under Delaware L.R. 7.1.3 by MEMC Electronic Materials Inc.. (Rogowski, Patricia) (Entered: Jun. 21, 2010); So Ordered—re 160 Stipulated Motion for Leave to Exceed Page Limit. Signed by Judge Sue L. Robinson on Jun. 22, 2010. (lid) (Entered: Jun. 22, 2010).
Notice of Service of (1) Rebuttal Expert Report of Robert Averback; (2) Report on Characterization of Si Wafers by Transmission Electron Microscopy (Pascal Belton); and (3) Rebuttal Expert Report of Peter Moran by MEMC Electronic Materials Inc.. (Rogowski, Patricia) (Entered: Jun. 22, 2010).
Notice of Service of Supplemental Expert Report of Peter Moran by MEMC Electronic Materials Inc..(Rogowski, Patricia) (Entered: Jun. 22, 2010).
Notice of Service of Documents Marked MEMC0781986-MEMC0782012 by Memc Electronic Materials Inc..(Rogowski, Patricia) (Entered: Jun. 23, 2010).
Notice of Service of S.O.I.TEC Silicon on Insulator Technologies, S.A. and Commissariat a L'Energie Atomique's: (1) Notice of Deposition of Dr. Peter Moran; (2) Notice of Deposition of Dr. Robert Averback; and (3) Notice of Deposition of Dr. Pascal Bellon by Commissariat a LEnergie Atomique, SOITEC Silicon on Insulator Technologies SA. (Attachments: # 1 Certificate of Service)(Kraft, Denise) (Entered: Jun. 24, 2010).
Notice of Service of S.O.I.TEC Silicon on Insulator Technologies, S.A. and Commissariat a L'Energie Atomique's List of Fact Witnesses by Commissariat a LEnergie Atomique, SOITEC Silicon on Insulator Technologies SA. (Attachments: # 1 Certificate of Service)(Kraft, Denise) (Entered: Jun. 24, 2010).
Notice of Service of S.O.I.TEC Silicon on Insulator Technologies, S.A. and Commissariat a L'Energie Atomique's: (1) Supplemental Expert Report of Andrew M. Hirt; and (2) Expert Report of John C. Bravman Regarding Non-infringement of U.S. Patent No. 5,834,812 by Commissariat a LEnergie Atomique, SOITEC Silicon on Insulator Technologies SA. (Attachments: # 1 Certificate of Service)(Kraft, Denise) (Entered: Jun. 24, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113- DA0152, # 6 Appendix DA0153-DA0192, # 7 Appendix DA0193-DA0232, # 8 Appendix DA0233-DA0272, # 9 Appendix DA0273-DA0312, # 10 Appendix DA0313- DA0352, # 11 Appendix DA0353-DA0392, # 12 Appendix DA0393-DA0432, # 13 Appendix DA0433-DA0472, # 14 Appendix DA0473-DA0512, # 15 Appendix DA0513-DA0521, # 16 Appendix DA0522-DA0545, # 17 Appendix Sealed—DA0546-DA0551, # 18 Appendix DA0552-DA0563, # 19 Appendix Sealed—DA0564- DA0566, # 20 Appendix DA0567-DA0573, # 21 Appendix Sealed—DA0574-DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed—DA0653-DA0657, # 29 Appendix DA0658-DA0667, # 30 Appendix DA0668-DA0670, # 31 Appendix DA0671-DA0678, # 32 Appendix DA0679-DA0687, # 33 Appendix DA0688-DA0696, # 34 Appendix Sealed—DA0697-DA0705, # 35 Appendix Sealed—DA0706-DA0711, # 36 Appendix Sealed—DA0712-DA0714, # 37 Appendix DA0715-DA0717, # 38 Appendix DA0718-DA0719, # 39 Appendix DA0720-DA0722, # 40 Appendix DA0723-DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).
Claim Construction Opening Brief *Plaintiffs S.O.I.TEC Silicon on Insulator Technologies, S.A. and Commissariat a L'Energie Atomique's Opening Claim Construction Brief* filed by Commissariat a LEnergie Atomique, SOITEC Silicon on Insulator Technologies SA. (Attachments: # 1 Certificate of Service)(Kraft, Denise) (Entered: Jun. 25, 2010).
Declaration re 168 Claim Construction Opening Brief, *Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Attachments: # 1 Certificate of Service)(Kraft, Denise) (Entered: Jun. 25, 2010).
Sealed Exhibit re 169 Declaration, *Exhibit A (Filed Under Seal) to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulators Technologies SA. (Attachments: 190 1 Certificate of Service)(Kraft, Denise) (Entered: Jun. 25, 2010).
Sealed Exhibit re 169 Declaration, *Exhibit B* (Filed Under Seal) *to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Attachments: # 1 Certificate of Service)(Kraft, Denise) (Entered: Jun. 25, 2010).
Sealed Exhibit re 169 Declaration, *Exhibit C (Filed Under Seal) to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulatro Technologies SA. (Attachments: # 1 Certificate of Service)(Kraft, Denise) (Entered: Jun. 25, 2010).
Notice of filing the following document(s) in paper format: Joint Appendix of Exhibits to Opening and Answering Claim Construction Briefs (1) vol. I—JA0001 to JA0533; (2) vol. II—JA0534 to JA0930; (3) vol. III—JA0931 to JA1502; (4) vol. IV—JA1503 to JA1510 (Filed Under Seal); (5) vol. V—JA1511 to JA2089; and (6) vol. VI—JA2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010); Correcting Entry: Docket clerk deleted appendices to D.I. 167 due to documents being filed improperly. Counsel is advised to re-file appendices separately using the Appendix event code. Counsel is also advised that sealed documents may not be filed with public view documents. (lid) (Entered: Jun. 28, 2010).
(Document too large to file in pdf format, will file at later date by Express Mail). Appendix re 167 Claim Construction Opening Brief,,,,,, by MEMC Electronic Materials Inc.. (Attachments: # 1 Appendix DA-0001-DA-0006, # 2 Appendix DA-0007-DA-0032, # 3 Appendix DA-0033-DA-0072, # 4 Appendix DA-0073-DA-0112, # 5 Appendix DA0113-DA-0152, # 6 Appendix DA-0153-Da-0192, # 7 Appendix DA-0193-DA-0232, # 8 Appendix DA-0233-DA-0272, # 9

Appendix DA-0273-DA-0312, # 10 Appendix DA-0313-DA-0352, # 11 Appendix DA-0353-DA-0392, # 12 Appendix DA-0393-DA-0432, # 13 Appendix DA-0433-Da-0472, # 14 Appendix DA-0473-DA-0512, # 15 Appendix DA-0513-A-0521)(Rogowski, Patricia) (Entered: Jun. 28, 2010).

Sealed Appendix re 167 Claim Construction Opening Brief,,,,,, by MEMC Electronic Materials Inc.. (Rogowski, Patricia) (Entered: Jun. 28, 2010).

Notice of Service of S.O.I.TEC Silicon on Insulator Technologies, S.A. and Commissariat a L'Energie Atomique's Production 34 of CD-ROM Documents Bates Numbered SOIT 00476458 to SOIT 00476602 by SOITEC Silicon on Insulator Technologies SA. (Attachments: # 1 Certificate of Service)(Kraft, Denise) (Entered: Jun. 28, 2010).

Redacted Version of 175 Appendix by MEMC Electronic Materials Inc.. (Attachments: # 1 Appendix DA0522-DA0545, # 2 Appendix DA0546-DA0551, # 3 Appendix DA0552-DA0563, # 4 Appendix DA0564-DA0566, # 5 Appendix DA0567-DA0573, # 6 Appendix DA0574-DA0599, # 7 Appendix DA0600-DA0604, # 8 Appendix DA0605-DA0609, # 9 Appendix DA0610-DA0625, # 10 Appendix DA0626-DA0634, # 11 Appendix DA0635, # 12 Appendix DA0636-DA0652, # 13 Appendix DA0653-DA0657, # 14 Appnedix DA0658-DA0667, # 15 Appendix DA0668-DA0670, # 16 Appendix DA0671-DA0678, # 17 Appendix DA0679-DA0687, # 18 Appendix DA0688-DA0696, # 19 Appendix DA0697-DA0705, # 20 Appendix DA0706-DA-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Regowski, Patricia) (Entered: Jun. 28, 2010).

Notice of filing the following document(s) in paper format: Joint Appendix of Exhibits to Opening and Answering Claim Construction Briefs (1) vol. I—JA0001 to JA0533. Appendix vol. I. re 173 Notice of Filing Paper Documents(Oversized Document, Item in File in the Clerks Office). (lid) (Entered: Jun. 28, 2010).

Notice of filing the following document(s) in paper format: Joint Appendix of Exhibits to Opening and Answering Claim Construction Briefs (2) vol. II—JA0534 to JA0930. Appendix vol. II. re 173 Notice of Filing Paper Documents(Oversized Document, Item on File in the Clerks Office). (lid) (Entered: Jun. 28, 2010).

Notice of filing the following document(s) in paper format: Joint Appendix of Exhibits to Opening and Answering Claim Construction Briefs (3) vol. III—JA0931 to JA1502. Appendix vol. III. re 173 Notice of Filing Paper Documents(Oversized Document, Item on File in the Clerks Office) (lid) (Entered: Jun. 28, 2010).

Notice of filing the following document(s) in paper format: Joint Appendix of Exhibits to Opening and Answering Claim Construction Briefs (4) vol. IV—JA1503 to JA1510. Appendix vol. IV. re 173 Notice of Filing Paper Documents, (Oversized Document, Item on File in the Clerks Office) (lid) (Entered: Jun. 28, 2010).

Notice of filing the following document(s) in paper format: Joint Appendix of Exhibits to Opening and Answering Claim Construction Briefs (5) vol. V—JA1511 to JA2089.

Volume VI—JA2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010).

Sealed Appendix re 168 Claim Construction Opening Brief, *Joint Appendix of Exhibits to Opening and Answering Claim Construction Briefs* vol. IV of VI—*Filed Under Seal* by Commissariat a LEnergie Atomique, SOITEC Silicon on Insulator Technologies SA. (Attachments: # 1 Certificate of Service)(Kraft, Denise) (Entered: Jun. 28, 2010).

Notice of Service of S.O.I.Tec Silicon on Insulator Technologies, S.A.'s and Commissariat a L'Energie Atomique's List of Rebuttal Fact Witnesses by Commissariat a LEnergie Atomique, SOITEC Silicon on Insulator Technologies SA. (Attachments: # 1 Certificate of Service)(Kraft, Denise) (Entered: Jun. 30, 2010).

Notice of Service of Amended Notice of Videotaped Deposition of Dr. John C. Bravman by MEMC Electronic Materials Inc. (Rogowski, Patricia) (Entered: Jun. 30, 2010).

Motion in Limine *SOITEC/CEA Parties' Motion to Exclude the Expert Report of Dr. Pascal Bellon and Any Related Testimony*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).

Motion for Partial Summary Judgment *of Invalidity of the Asserted Aspar Patent Claims*—filed by MEMC Electronic Materials Inc.. (Attachments: # 1 Text of Proposed Order, # 2 Certificate of Service)(Rogowski, Patricia) (Entered: Jul. 2, 2010).

Opening Brief in Support re 186 Motion in Limine *SOITEC/CEA Patries' Motion to Exclude The Expert Report of Dr. Pascal Bellon and Any Related Testimony* filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).

Opening Brief in Support re 187 Motion for Partial Summary Judgment *of Invalidity of the Asserted Aspar Patent Claims* filed by MEMC Electronic Materials Inc..Answering Brief/Response due date per Local Rules is Jul. 19, 2010. (Rogowski, Patricia) (Entered: Jul. 2, 2010).

Sealed Appendix re 189 Opening Brief in Suppport, by MEMC Electronic Materials Inc.. (Attachments: # 1 Table of Contents, #2 Certificate of Service)(Rogowski, Patricia) (Entered: Jul. 2, 2010).

Appendix re 186 Motion in Limine *SOITEC/CEA Parties' Motion to Exclude The Expert Report of Dr. Pascal Bellon and Any related Testimony Plaintiffs' Omnibus Appendix to Daubert Motion and Motions for Partial Summary Judgment* filed on Jul. 2, 2010 by Commissariat a LEnergie Atomique, SOITEC Silicon on Insulator Technologies SA. (Attachments: # 1 Appendix vol. II of XIX, # 2 Appendix vol. III of XIX, # 3 Appendix vol. IV of XIX, # 4 Appendix vol. V of XIX, # 5 Appendix vol. VII of XIX, # 6 Appendix vol. IX of XIX, # 7 Appendix vol. XI of XIX, # 8 Appendix vol. XII of XIX, # 9 Appendix vol. XIII of XIX, # 10 Appendix vol. XIV of XIX, # 11 Appendix vol. XV of XIX, #12 Appendix vol. XVI oF XIX, # 13 Appendix vol. XVIII of XIX, # 14 Certificate of Service)(Kraft, Denise) (Entered: Jul. 2, 2010).

Sealed Appendix re 186 Motion in Limine *SOITEC/CEA Parties' Motion to Exclude the Expert Report of Dr. Pascal Bellon and Any Related Testimony Plaintiffs' Omnibus Appendix to Daubert Motion and Motions for Partial Summary Judgment* filed on Jul. 2, 2010—vol. VI of XIX (*Filed Under Seal*) by Commissariat a LEnergie Atomique, SOITEC Silicon on Insulator Technologies SA. (Attachments: # 1 Certificate of Service)(Kraft, Denise) (Entered: Jul. 2, 2010).

Sealed Appendix re 186 Motion in Limine *SOITEC/CEA Parties' Motion to Exclude the Expert Report of Dr. Pascal Bellon and Any Related Testimony Plaintiffs' Omnibus Appendix to Daubert Motion and Motions for Partial Summary Judgment* filed on Jul. 2, 2010—vol. VIII of XIX (*Filed Under Seal*) by Commissariat a LEnergie Atomique, SOITEC Silicon on Insulator Technologies SA. (Attachments: # 1 Certificate of Service)(Kraft, Denise) (Entered: Jul. 2, 2010).

Sealed Appendix re 186 Motion in Limine *SOITEC/CEA Parties' Motion to Exclude the Expert Report of Dr. Pascal Bellon and Any Related Testimony Plaintiffs' Omnibus Appendix to Daubert Motion and Motions for Partial Summary Judgment* filed on Jul. 2, 2010—vol. X of XIX (*Filed Under Seal*) by Commissariat a LEnergie Atomique, SOITEC Silicon on Insulator Technologies SA. (Attachments: # 1 Certificate of Service)(Kraft, Denise) (Entered: Jul. 2, 2010).

Sealed Appendix re 186 Motion in Limine *SOITEC/CEA Parties' Motion to Exclude the Expert Report of Dr. Pascal Bellon and Any Related Testimony Plaintiffs' Omnibus Appendix to Daubert Motion and Motions for Partial Summary Judgment* filed on Jul. 2, 2010—vol. XVII of XIX (*Filed Under Seal*) by Commissariat a LEnergie Atomique, SOITEC Silicon on Insulator Technologies SA. (Attachments: # 1 Certificate of Service)(Kraft, Denise) (Entered: Jul. 2, 2010).

Sealed Appendix re 186 Motion in Limine *SOITEC/CEA Parties' Motion to Exclude the Expert Report of Dr. Pascal Bellon and Any Related Testimony Plaintiffs' Omnibus Appendix to Daubert Motion and Motions for Partial Simmary Judgment* filed on Jul. 2, 2010— vol. XIX of XIX (*Filed Under Seal*) by Commissariat a LEnergie Atomique, SOITEC Silicon on Insulator Technologies SA. (Attachments: # 1 Certificate of Service)(Kraft, Denise) (Entered: Jul. 2, 2010).
Sealed Motion for Summary Judgment *SOITEC/CEA Parties' Motion for Summary Judgment: Non-Infringement (Filed Under Seal)*—filed by Commissariat a LEnergie Atomique, SOITEC Silicon on Insulator Technologies SA. (Attachments: # 1 Certificate of Service)(Kraft, Denise) (Entered: Jul. 2, 2010).
Summary Non-Infringement Soitec/CEA Under Seal) is Jul. 19, 2010. Jul. 2, 2010) for Summary Judgment: for Summary Judgment Non-Infringement (Filed Soitec Silicon on Insulator due date per Local Rules Denise) (Entered: Jul. 2, 2010).
Motion for Summary Judgment *of Non-Infringement*—filed by MEMC Electronic Materials Inc.. (Attachments: # 1 Text of Proposed Order, # 2 Certificate of Service)(Rogowski, Patricia) (Entered: Jul. 2, 2010).
Sealed Opening Brief in Support re 199 Motion for Summary Judgment *of Non-Infringement* filed by MEMC Electronic Materials Inc.. Answering Brief/Response due date per Local Rules is Jul. 19, 2010. (Attachments: #1 Certificate of Service)(Rogowski, Patricia) (Entered: Jul. 2, 2010).
Sealed Appendix re 200 Opening Brief in Support, by MEMC Electronic Materials Inc.. (Attachments: # Table of Contents, # 2 Certificate of Service)(Rogowski, Patricia) (Entered: Jul. 2, 2010).
Motion for Partial Summary Judgment *SOITEC/CEA Parties Motion for Partial Summary Judgment That the Patents in Suit Satisfy the Written Description Requirement*—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 202 Motion for Partial Summary Judgment *SOITEC/CEA Parties Motion for Partial Summary Judgment That The Patents in Suit Satisfy The Written Description Requirement* filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *Plaintiffs' Motion for Partial Summary Judgment That the Certificate of Correction for the '396 Patent is Valid*—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 204 Motion for Partial Simmary Judgment *Plaintiffs' Motion for Partial Summary Judgment That the Certificate of Correction for the '396 Patent is Valid*—filed by Commissariat a LEnergie Atomique, SOITEC Silicon on Insulator Technologies SA.Answering Brief/Response due date per Local Rules is Jul 19, 2010. (Attachments: # 1 Certificate of Service)(Kraft, Denise) (Entered: Jul. 2, 2010).
Motion for Partial Summary Judgment *SOITEC/CEA Parties' Motion for Partial Summary Judgment That the Aspar Patents Are Not Invalid for Inequitable Conduct*—filed by Commissariat a LEnergie Atomique, SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 206 Motion for Partial Summary Judgment *SOITEC/CEA Parties' Motion for Partial Summary Judgment That the Aspar Patents are Not Invalid for Inequitable Conduct*—filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *Plaintiffs' Motion for Partial Summary Judgment That the Bruel Patent Does Not Anticipate the Aspar Patents*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Opening Brief in Support re 208 Motion for Partial Summary Judgment *Plaintiffs' Motion for Partial Summary Judgment That the Bruel Patent Does Not Anticipate the Aspar Patents* filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC's Motion for Partial Summary Judgment of Invalidity of United States Patent No. 5,834,812 for Lack of Enablement*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 210 Motion for Partial Summary Judgment *SOITEC's Motion for Partial Summary Judgment of Invalidity of United States Patent No. 5,834,812 foe Lack of Enablement* filed by SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC's Motion for Partial Summary Judgment for Invalidity of Asserted Claims of United States Patent No. 5,834,812 in View of Prior Art*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Motion for Partial Summary Judgment *That the Best Mode Requirement is Satisfied for the Claims of the '009 and '396 Patents*—filed by Commissariat a LEnergie Atomique, SOITEC Silicon on Insulator Technologies SA. (Attachments: # 1 Text of Proposed Order, # 2 Certificate of Service)(Reed, John) (Entered: Jul. 2, 2010).
Opening Brief in Support re 212 Motion for Partial Summary Judgment *SOITEC's Motion for Partial Summary Judgement for Invalidity of Asserted Claims of United States Patent No. 5,834,812 in View of Prior Art* filed by SOITEC Silicon on Insulator Technologies SA, SOITEC U.S.A., Inc..Answering Brie/Response due date per Local Rules is Jul. 19, 2010. (Attachments: # 1 Certificate of Service)(Kraft, Denise) (Entered: Jul. 2, 2010).
Opening Brief in Support re 213 Motion for Partial Summary Judgment *That the Best Mode Requirement is Satisfied for the Claims of the '009 and '396 Patents* filed by SOITEC Silicon on Insulator Technologies SA.Answering Brief/Response due date per Local Rules is Jul. 19, 2010. (Attachments: # 1 Certificate of Service)(Reed, John) (Entered: Jul. 2, 2010).
Correcting Entry: Per request of counsel, D.I. No. 216 has been deleted and will be re-filed at a later time (lid) (Entered: Jul. 7, 2010).
Correcting Entry: Per request of counsel, D.I. No. 217 has been deleted and will be re-filed at a later time (lid) (Entered: Jul. 7, 2010).
Redacted Version of 200 Opening Brief in Support, by MEMC Electronic Materials Inc.. (Attachments: # 1 Certificate of Service)(Rogowski, Patricia) (Entered: Jul. 7, 2010); Correcting Entry: Per request of counsel, D.I. Nos. 216 and 217 have been deleted and will be re-filed at a later time (lid) (Entered: Jul. 7, 2010).
Redacted Version of 201 Appendix by MEMC Electronic Materials Inc.. (Attachments: # 1 Appendix MA0001-MA0004, # 2 Appendix MA0005-MA0010, # 3 Appendix MA0011-MA0016, # 4 Appendix MA0017-MA0020, # 5 Appendix MA0021-MA0029, # 6 Appendix MA0030-MA0045, # 7 Appendix MA0046-MA0052, # 8 Appendix MA0053-MA0078, # 9 Appendix MA0079-MA0092, # 10 Appendix MA0093-MA0129, # 11 Appendix MA0130-MA0148, # 12 Appendix MA0149-MA0160, # 13 Appendix MA0161-MA0163, # 14 Appendix MA0164-MA0167, # 15 Appendix MA0168-MA0172, # 16 Appendix MA0173-MA0183, # 17 Appendix MA0184-MA0196, # 18 Appendix MA0197-MA0207, # 19 Appendix MA0208-MA0241, # 20 Appendix MA0242-MA0245, # 21 Appendix MA0246-MA0249, # 22 Appendix MA0250-MA0252, # 23 Appendix MA0253-MA0265, # 24 Appendix MA0266-MA0281, # 25 Appendix MA0282-MA0312, # 26 Appendix MA0313-MA0359, # 27 Appendix MA0360-MA0365, # 28 Appendix MA0366, # 29 Appendix MA0367-MA0400, # 30 Appendix MA0401-MA0474, # 31 Appendix MA0475-MA0483, # 32 Certificate)(Rogowski, Patricia) (Entered: Jul. 7, 2010).
Redacted Version of 190 Appendix by MEMC Electronic Materials Inc. (Attachments: # 1 Appendix MA0484-MA0489, # 2 Appendix MA0490-MA0515, # 3 Appendix MA0516-MA0534, # 4 Appendix MA0535-MA0541, # 5 Appendix MA0542-MA0550, # 6 Appendix MA0551-MA0561, # 7 Appendix MA0562-MA0564, # 8 Appendix MA0565-MA0569, # 9 Appendix MA0570-MA0574, # 10 Appendix MA0575-MA0576, # 11 Appendix MA0577-MA0601, # 12 Appendix MA0602-MA0603, # 13 Appendix MA0604-MA0605, # 14 Appendix MA0606-MA0609, # 15 Appendix MA0610-MA0612, # 16 Appendix MA0613-MA0625, # 17 Appendix MA0626-MA0628, # 18 Appendix MA0629-MA0630, # 19 Appendix MA0631-MA0653, # 20 Appendix MA0654-MA0685, # 21 Appendix MA06868-MA0701, # 22 Appendix MA0702-MA0732, # 23 Appendix MA0733-MA0742, # 24 Appendix MA0743-MA0750, # 25 Appendix MA0751-MA0766, # 26 Appendix MA0767-0772, # 27 Appendix MA0773-MA0780, # 28 Appendix MA0781-MA0807, # 29 Appendix MA0808-MA0824, # 30 Appendix MA0825-MA0831. 1, # 31 Appendix MA0832-MA0838, # 32 Appendix MA0839-MA0844, # 33 Appendix MA0845-MA0858, # 34 Appendix MA0859-MA0868, # 35 Appendix MA0869-MA0877, # 36 Appendix MA0878-MA0884, # 37 Appendix MA0885-MA0887, # 38 Appendix MA0888-MA0891, # 39 Appendix MA0892-MA0909, # 40 Appendix MA0910-MA0931, # 41 Certificate of Service)(Rogowski, Patricia) (Entered: Jul. 7, 2010).

Redacted Version of 198 Opening Brief in Support,, *SOITEC/CEA Parties' Opening Brief in Support of Motion for Summary Judgment: Non-Infringement* by Commissariat a LEnergie Atomique, SOITEC Silicon on Insulator Technologies SA, SOITEC U.S.A., Inc.. (Kraft, Denise) (Entered: Jul. 8, 2010).

Redacted Version of 197 Sealed Motion for Summary Judgment *SOITEC/CEA Parties' Motion for Summary Judgment: Non-Infringement (Filed Under Seal)* Sealed Motion for Summary Judgment *SOITEC/CEA Parties' Motion for Summary Judgment: Non Infringement (Filed Under Seal) SOITEC/CEA Parties' Motion for Summary Judgment: Non-Infringement* by Commissariat a LEnergie Atomique, SOITEC Silicon On Insulator Technologies SA, SOITEC U.S.A., Inc.. (Kraft, Denise) (Entered: Jul. 8, 2010).

Redacted Version of 192 Appendix, *Plaintiffs' Omnibus Appendix to Daubert Motion and Motions for Patrial Summary Judgment* Filed on Jul. 2, 2010—vol. VI of XIX by Commissariat a LEnergie Atomique, SOITEC Sillicon on Insulator Technologies SA, SOITEC U.S.A., Inc.. (Kraft, Denise) (Entered: Jul. 9, 2010).

Redacted Version of 193 Appendix, *Plaintiffs' Omnibus Appendix to Daubert Motion and Motions for Partial Summary Judgment* Filed on Jul. 2, 2010—vol. VIII of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 194 Appendix, *Plaintiffs' Omnibus Appendix to Daubert Motion and Motions for Partial Summary Judgment* Filed on Jul. 2, 2010—vol. X of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 195 Appendix, *Plaintiffs' Omnibus Appendix to Daubert Motion and Motions for Partial Summary Judgment* Filed on Jul. 2, 2010—vol. XVII of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 196 Appendix, *Plaintiffs' Omnibus Appendix to Daubert Motion and Motions for Partial Summary Judgment* Filed on Jul. 2, 2010—vol. XIX of XIX by Commissariat a LEnergie Atomique, SOITEC Silicon on Insulator Technologies SA, SOITEC U.S.A., Inc.. (Kraft, Denise) (Entered: Jul. 9, 2010).

Opening Certificate of Inc.. (Attachments: # 1 Jul. 09, 2010).

Appendix re 228 Claim Construction Answering Brief by MEMC Electronic Materials Inc.. (Attachments: # 1 Appendix DA0782_DA0783, # 2 Appendix DA0784-DA0785, # 3 Appendix DA0786, # 4 Appendix DA0787-DA0810, # 5 Appendix DA0811-DA0834, # 6 Appendix DA0835-DA0845, # 7 Appendix DA0846-DA0855, # 8 Certificate of Service)(Rogowski, Patricia) (Entered: Jul. 9, 2010).

Claim Construction Answering Brief re 168 Claim Construction Opening Brief, 228 Claim Construction Answering Brief *Plaintiffs S.O.I.TEC on Insulator Technologies, S.A. And Commissariat A Energie Atomique's Answering Claim Construction Brief* filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Jul. 9, 2010).

Appendix re 230 Claim Construction Answering Brief, *Appendix to Plaintiffs S.O.I.TEC on Insulator Technologies, S.A. And Commissariat A Energie Atomique's Answering Claim Construction Brief* by Commissariat a LEnergie Atomique, SOITEC Silicon On Insulator Technologies SA. (Attachments: # 1 Appendix PA-0001-PA-0050, # 2 Appendix PA-0051-PA-0083, # 3 Certificate of Service)(Kraft, Denise) (Entered: Jul. 9, 2010).

Redacted Version of 183 Appendix, *Joint Appendix of Exhibits to Opening and Answering Claim Construction Briefs* vol. IV of VI by Commissariat a LEnergie Atomique, SOITEC Silicon on Insulator Technologies SA. (Kraft, Denise) (entered: Jul. 12, 2010).

Redacted Version of 170 Exhibit to a Document, *Exhibit A to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon On Insulator Technologies SA. (Kraft, Denise) (Entered: Jul. 12, 2010).

Redacted Version of 171 Exhibit to a Document, *Exhibit B to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).

Redacted Version of 172 Exhibit to a Document, *Exhibit C to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).

Letter to the Honorable Sue L. Robinson from Denise Seastone Kraft, Esq. regarding Courtesy CD-ROM copies of: (1) Plaintiffs' Answering Claim Construction Brief and Appendix; and (2) Plaintiffs' Daubert Motion; Plaintiffs' Motions for Partial Summary Judgment; and Plaintiffs' Omnibus Appendix to Daubert Motion and Motions for Partial Summary Judgment. (Kraft, Denise) (Entered: Jul. 12, 2010).

Notice of Service of Re-Notice of Deposition of Dr. Peter Moran on behalf of S.O.I.TEC Silicon on Insulator Technologies, S.A., Commissariat a L'Energie Atomique, and SOITEC U.S.A., Inc. by Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 13, 2010).

Fourth Stipulation to Amend Scheduling Order re 26 Scheduling Order,,, by MEMC Electronic Materials Inc.. (Rogowski, Patricia) (Entered: Jul. 15, 2010).

Answering Brief in Opposition re 186 Motion in Limine *SOITEC/CEA Parties'Motion to Exclude The Expert Report of Dr. Pascal Bellon and Any Related Testimony* filed by MEMC Electronic Materials Inc..Reply Brief due date per Local Rules is Jul. 29, 2010. (Rogowski, Patricia) (Entered: Jul. 19, 2010).

Sealed Appendix re 239 Answering Brief in Opposition, by MEMC Electronic Materials Inc.. (Attachments: # 1 Table of Contents, # 2 Certificate of Service)(Rogowski, Patricia) (Entered: Jul. 19, 2010).

Sealed Answering Bried in Opposition re 213 Motion for Partial Summary Judgment *That the Best Mode Requirement is Satisfied for the Claims of the '009 and '396 Patents* filed by MEMC Electronic Materials Inc..Reply Brief due date per Local Rules is Jul. 29, 2010. (Rogowski, Patricia) (Entered: Jul. 19, 2010).

Answering Brief in Opposition re 208 Motion for Partial Summary Judgment *Plaintiffs' Motion for Partial Summary Judgment That the Bruel Patent Does Not Anticipate the Aspar Patents* filed by MEMC Electronic Materials Inc..Reply Brief due date per Local Rules is Jul. 29, 2010. (Regowski, Patricia) (Entered: Jul. 19, 2010).

Answering Brief in Opposition re 202 Motion for Partial Summary Judgment *SOITEC/CEA Parties Motion for Partial Summary Judgment That the Patents in Suit Satisfy the Written Description Requirement* filed by MEMC Electronic Materials Inc..Reply Brief due date per Local Rules is Jul. 29, 2010. (Rogowski, Patricia) (Entered: Jul. 19, 2010).

Answering Brief in Opposition re 204 Motion for Partial Simmarry Judgment *Plaintiffs' Motion for Partial Summary Judgment That the Certificate of Correction for the '396 Patent is Valid* filed by MEMC Electronic Materials Inc.. Reply Brief due date per Local Rules is Jul. 29, 2010. (Rogowski, Patricia) (Entered: Jul. 19, 2010).

Answering Brief in Opposition re 210 Motion for Partial Summary Judgment *SOITEC's Motion for Partial Summary Judgment of Invalidity of United States Patent No. 5,834,812 for Lack of Enablement* filed by MEMC Electronic Materials Inc..Reply Brief due date per Local Rules is Jul. 29, 2010. (Rogowski, Patricia) (Entered: Jul. 29, 2010).

Answering Brief in Opposition re 212 Motion for Partial Summary Judgment *SOITEC's Motion for Partial Summary Judgment for Invalidity of Asserted Claims of United States Patent No. 5,834,812 in View of Prior Art* filed by MEMC Electronic Materials Inc..Reply Brief due date per Local Rules is Jul. 29, 2010. (Rogowski, Patricia) (Entered: Jul. 19, 2010).

Sealed Answering Brief in Opposition re 187 Motion for Partial Summary Judgment *of Invalidity of the Asserted Aspar Patent Claims Plaintiffs' Answering Brief in Opposition to Defendant's Motion for Partial Summary Judgment of Invalidity of the Asserted Aspar Claims—Filed Under Seal* filed by Commissariat a LEnergie Atomique, SOITEC Silicon On Insulator Technologies SA.Reply Brief due date per Local Rules is Jul. 29, 2010. (Attachments: # 1 Certificate of Service)(Kraft, Denise) (Entered: Jul. 19, 2010).

Appendix re 247 Answering Brief in Opposition,, *Appendix to Plaintiffs' Answering Brief in Opposition to Defendant's Motion for Partial Summary Judgment of Invalidity of the Asserted Aspar Claims (PA-1103-PA-1156)* by Commissariat a LEnergie Atomique, SOITEC Sililcon on Insulator Technologies SA. (Attachments: # 1 Exhibit PA-1103-PA1109—Filed Under Seal, # 2 Exhibit PA1110-PA-1118—Filed Under Seal, # 3 Exhibit PA-1119-PA-1130—Filed Under Seal, # 4 Exhibit PA-1131-PA-1143—Filed Under Seal, # 5 Exhibit PA-1144-PA-1156, # 6 Certificate of Service)(Kraft, Denise) (Entered: Jul. 19, 2010).

Sealed Answering Brief in Opposition re 197 Sealed Motion for Summary Judgment *SOITEC/CEA Parties' Motion for Summary Judgment: Non-Infringement* (Filed Under Seal)Sealed Motion for Summary Judgment *SOITEC/CEA Parties' Motion for Summary Judgment: Non-Infringement (Filed Under Seal)* filed by MEMC Electronic Materials Inc..Reply Brief due date per Local Rules is Jul. 29, 2010. (Rogowski, Patricia) (Entered: Jul. 19, 2010).

Sealed Answering Brief in Opposition re 199 Motion for Summary Judgment *of Non-Infringement Soitec's Brief in Opposition to Defendant's Motion for Summary Judgment of Non-Infringement* filed by Commissariat a LEnergie Atomique, SOITEC Silicon on Insulator Technologies SA.Reply Brief due date per Local Riles is Jul. 29, 2010. (Attachments: # 1 Certificate of Service)(Kraft, Denise) (Entered: Jul. 19, 2010).

Sealed Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Sillicon on Insulator Technologies SA. (Attachments: # 1 Exhibit PA-1157-PA-1159 Filed Under Seal, # 2 Exhibit PA-1160-PA-1165 Filed Under Seal, # 3 Exhibit PA-1166-PA-1168 Filed Under Seal, # 4 Exhibit PA-1169-PA-1185 Filed Under Seal, # 5 Exhibit PA-1186-PA-1189)(Kraft, Denise) (Entered: Jul. 19, 2010).

Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Attachments: # 1 Exhibit PA-1190-PA-1191, # 2 Certificate of Service)(Kraft, Denise) (Entered: Jul. 19, 2010).

Sealed Answering Brief in Opposition re 206 Motion for Partial Summary Judgment *SOITEC/CEA Parties' Motion for Partial Summary Judgment That the Aspar Patents are Not Invalid for Inequitable Conduct* filed by MEMC Electronic Materials Inc..Reply Brief due date per Local Rules is Jul. 29, 2010. (Rogowski, Patricia) (Entered: Jul. 19, 2010); Correcting Entry: Docket clerk deleted sealed exhibits 1-4 attached to D.I. 248 due to documents being filed improperly. Counsel is advised that sealed and public documents may not be filed together and to re-file documents using the Exhibit to a Document event code indicating that documents are under seal. (lid) (Entered: Jul. 20, 2010).

Sealed Appendix re 247 Answering Brief in Opposition,, *Appendix to Plaintiffs' Answering Brief in Opposition to Defendant's Motion for Partial Summary Judgment of Invalidity of the Asserted Aspar Claims (PA-1103-PA1143 Filed Under Seal)* by Commissariat a LEnergie Atomique, SOITEC Silicon on Insulator Technologies SA. (Attachments: # 1 Exhibit PA-1103-PA-1109 Filed Under Seal, # 2 Exhibit PA-1110-PA-1118 Filed Under Seal, # 3 Exhibit PA-1119-PA1130 Filed Under Seal, # 4 Exhibit PA-1131-PA-1143, # 5 Certificate of Service)(Kraft, Denise) (Entered: Jul. 20, 2010).

Notice of Service of Documents Marked MEMC0782013-MEMC0782178 by MEMC Electronic Materials Inc..(Rogowski, Patricia) (Entered: Jul. 21, 2010).

Letter to the Honorable Sue L. Robinson from Denise Seastone Kraft regarding Courtesy CD-ROM: (1) Plaintiffs Answering Brief in Opposition to Defendants Motion for Partial Summary Judgment of Invalidity of the Asserted Aspar Claims and Appendix; and (2) Soitecs Brief in Opposition to Defendants Motion for Summary Judgment of Non-Infringement and Appendix. (Kraft, Denise) (Entered: Jul. 21, 2010); So Ordered—re 238 Stipulation to Amend Scheduling Order. Order—Setting Scheduling Order Deadlines (Reply Brief due Jul. 30, 2010.)(Refer to Stipulation for Details). Signed by Judge Sue L. Robinson on Jul. 22, 2010. (lid) (Entered: Jul. 22, 2010).

Redacted Version of 241 Answering Brief in Opposition, *to Plaintiffs' Motion for Partial Summary Judgment that the Best Mode Requirement is Satisfied for the Claims of the '009 and '396 Patents* by MEMC Electronic Materials Inc.. (Rogowski, Patricia) (Entered: Jul. 26, 2010).

Redacted Version of 249 Answering Brief in Opposition, *to Plaintiffs' Motion for Summary Judgment on the Infringement of U.S. Patent No. 5,834,812* by MEMC Electronic Materials Inc.. (Rogowski, Patricia) (Entered: Jul. 26, 2010).

Redacted Versiion of 253 Answering Brief in Opposition, *to Plaintiffs' Motion for Partial Summary Judgment that the Aspar Patents Are Not Invalid for Inequitable Conduct* by MEMC Electronic Materials Inc.. (Rogowski, Patricia) (Entered: Jul. 26, 2010).

Redacted Version of 240 Appendix by MEMC Electronic Materials Inc.. (Attachments: # 1 Appendix MA0932-MA0985, # 2 Appendix MA0986-MA1039.22, # 3 Appendix MA1040-MA1144, # 4 Appendix MA1145-MA1200, # 5 Appendix MA1201-MA1265, # 6 Appendix MA1265.1-MA1338, # 7 Appendix MA1339-MA1547, # 8 Appendix MA1548-MA1627, # 9 Appendix MA1628-MA1693, # 10 Appendix MA1694-MA1953, # 11 Appendix MA1954-MA2127, # 12 Appendix MA2128-MA2206, # 13 Appendix MA2207-MA2253, # 14 Appendix MA2254-MA2273, # 15 Appendix MA2274-MA2333, # 16 Appendix MA2334-MA2337, # 17 Appendix MA2338-MA2342, # 18 Appendix MA2343-MA2346, # 19 Appendix MA2347-MA2351, # 20 Certificate of Service)(Rogowski, Patricia) (Entered Jul. 26, 2010).

Seaked Answering Brief in Opposition re 213 Motion for Partial Summary Judgment *That the Best Mode Requirement is Satisfied for the Claims of the '009 and '396 Patents Corrected Version of D.I. 241* filed by MEMC Electronic Materials Inc..Reply Brief due date per Local Rules is Aug. 5, 2010. (Rogowski, Patricia) (Entered: Jul. 26, 2010).

Redacted Version of 261 Answering Brief in Opposition, *to Plaintiffs' Motion for Partial Simmary Judgment that the Best Mode Requirement is Satisfied for the Claims of the '009 and '396 Patents (Corrected Version of D.I. 241)* by MEMC Electronic Materials Inc.. (Rogowski, Patricia) (Entered: Jul. 26, 2010).

Redacted Version of 250 Answering Brief in Opposition, *to Soitec's Brief in Opposition to Defendant's Motion for Summary Judgment of Non-Infringement* by Commissariat a LEnergie Atomique, SOITEC Silicon on Insulator Technologies SA. (Attachments: # 1 Certificate of Service)(Kraft, Denise) (Entered: Jul. 26, 2010).

Redacted Version of 247 Answering Brief in Opposition,, *to Plaintiffs' Answering Brief In Opposition To Defendant's Motion for Partial Summary Judgment Of In validity Of The Asserted Aspar Claims* by Commissariat a LEnergie Atomique, SOITEC Silicon On Insulator Technologies SA. (Attachments: # 1 Certificate of Service)(Kraft, Denise) (Entered: Jul. 26, 2010).

Redacted Version of 254 Appendix,, *to Appendix To Plaintiffs' Answering Brief In Opposition To Defendant's Motion For Partial Summary Judgment Of Invalidity Of The Asserter Aspar Claims*

(*PA-1103-PA1143* bu Commissariat a LEnergie Atomique, SOITEC Silicon On Insulator Technologies SA. (Kraft, Denise) (Entered: Jul. 26, 2010).
Redacted Version of 251 Appendix,, *to Appendix to Plaintiffs' Answering Brief in Opposition to Defendant's Motion For Summary Judgment of Non-Infringement* by Commissariat a LEnergie Atomique, SOITEC Silicon On Insulator Technologies SA. (Kraft, Denise) (Entered: Jul. 26, 2010).
Sealed Reply Brief re 187 Motion for Partial Summary Judgment *of Invalidity of the Asserted Aspar Patent Claims* filed by MEMC Electronic Materials Inc.. (Attachments: # 1 Certificate of Service)(Rogowski, Patricia) (Entered: Jul. 30, 2010).
Reply Brief re 204 Motion for Partial Summary Judgment *Plaintiffs' Motion For Partial Summary Judgment That The Certificate of Correction For the '396 Patent is Valid Reply Brief in Support of Plaintiffs' Motion for Partial Summary Judgment That The Certificate of Correction For the '396 Patent is Valid* filed by Commissariat a LEnergie Atomique, SOITEC Silicon On Insulator Technologies SA. (Attachments: # 1 Certificate of Service)(Kraft, Denise) (Entered: Jul. 30, 2010).
Sealed Appendix re 267 Reply Brief *in Support of MEMC's Motion for Partial Summary Judgment of Invalidity of the Asserted Aspar Patent Claims* by MEMC Electronic Materials Inc.. (Attachments: # 1 Table of Contents, # 2 Certificate of Service)(Rogowski, Patricia) (Entered: Jul. 30, 2010).
Declaration re 268 Reply Brief, *Declaration of Marcus T. Hall in Support of Reply Brief in Support of Plaintiffs' Motion For Partial Summary Judgment That The Certificate of Correction For the '396 Patent is Valid* by Commissariat a LEnergie Atomique, SOITEC Silicon On Insulator Technologies SA. (Attachments: # 1 Exhibit A, # 2 Certificate of Service)(Kraft, Denise) (Entered: Jul. 30, 2010).
Sealed Reply Brief re 199 Motion for Summary Judgment *of Non-Infringement* filed by MEMC Electronic Materials Inc.. (Attachments: # 1 Certificate of Service)(Rogowski, Patricia) (Entered: Jul. 30, 2010).
Appendix re 268 Reply Brief, *Omnibus Appendix to Plaintiffs' Reply Briefs in Support of Plaintiffs' Daubert Motion and Motions For Partial Summary Judgment (PA-1192-PA-1261)* by Commissariat a LEnergie Atomique, SOITEC Silicon On Insulator Technologies SA. (Attachments: # 1 Exhibit PA-1199-PA1204, # 2 Exhibit PA-1205-PA-1206, # 3 Exhibit PA-1206.1, # 4 Exhibit PA-1231-PA1237, # 5 Exhibit PA-1238-PA-1245, # 6 Exhibit PA-1246-PA-1257, # 7 Exhibit PA-1258-PA-1261, # 8 Certificate of Service)(Kraft, Denise) (Entered: Jul. 30, 2010).
Sealed Appendix re271 Reply Brief *in Support of MEMC's Motion for Summary Judgment of Non-Infringement* by MEMC Electronic Materials Inc.. (Attachments: # 1 Table of Contents, # 2 Certificate of Service)(Rogowski, Patricia) (Entered: Jul. 30, 2010).
Sealed Appendix re 272 Appendix,, *Omnibus Appendix to Plaintiffs' Reply Briefs in Support of Plaintiffs' Daubert Motion and Motions For Partial Summary Judgment (PA-1192-PA-1198 and PA-1207-PA-1230 Filed Under Seal)* by Commissariat a LEnergie Atomique, SOITEC Silicon On Insulator Technologies SA. (Attachments: # 1 Exhibit PA-1192-PA-1198 (Filed Under Seal), # 2 Exhibit PA-1207-PA-1217 (Filed Under Seal), # 3 Exhibit PA-1218-PA-1230 (Filed Under Seal), # 4 Certificate of Service)(Kraft, Denise) (Entered: Jul. 30, 2010).
Reply Brief re 210 Motion for Partial Summary Judgment *SOITEC's Motion For Partial Summary Judgment of Invalidity of United States Patent No. 5,834,812 For Lack of Enablement Reply Brief in Support of SOITEC's Motion For Partial Summary Judgment of Invalidity of United States Patent No. 5,834,812 For Lack of Enablement* filed by SOITEC Silicon On Insulator Technologies SA, SOITEC U.S.A., Inc.. (Attachments: # 1 Certificate of Service)(Kraft, Denise) (Entered: Jul. 30, 2010).
Reply Brief re 212 Motionf or Partial Summary Judgment *SOITEC's Motion For Partial Summary Judgment For Invalidity of Asserted Claims of United States Patent No. 5,834,812 in View of Prior Art Reply Brief in Support of SOITEC's Motion For Partial Summary Judgment For Invalidity of Asserted Claims of United States Patent No. 5,834,812 in View of Prior Art* filed by SOITEC Silicon On Insulator Technologies SA, SOITEC U.S.A., Inc.. (Attachments: # 1 Exhibit A, # 2 Exhibit B, # 3 Certificate of Service)(Kraft, Denise) (Entered: Jul. 30, 2010).
Reply Bried re 186 Motion in Limine *SOITEC/CEA Parties' Motion to Exclude The Expert Report of Dr. Pascal Bellon and Any Related Testimony Reply Brief in Support of SOITEC/CEA Parties' Motion to Exclude The Expert Report of Dr. Pascal Bellon and Any Related Testimony* filed by Commissariat a LEnergie Atomique, SOITEC Silicon On Insulator Technologies SA. (Attachments: # 1 Certificate of Service)(Kraft, Denise) (Entered: Jul. 30, 2010).
Sealed Reply Brief re 197 Sealed Motion for Summary Judgment *SOITEC/CEA Parties' Motion For Summary Judgment: Non-Infringement (Filed Under Seal)*Sealed Motion for Summary Judgment *SOITEC/CEA Parties' Motion For Summary Judgment: Non-Infringement (Filed Under Seal) Reply Brief in Support of SOITEC/CEA Parties' Motion For Summary Judgment: Non-Infringement (Filed Under Seal)* filed by Commissariat a LEnergie Atomique, SOITEC Silicon On Insulator Technologies SA. (Attachments: # 1 Certificate if Service)(Kraft, Denise) (Entered: Jul. 30, 2010).
Sealed Reply Brief re 213 Motion for Partial Summary Judgment *That the Best Mode Requirement is Satisfied for the Claims of the '009 and '396 Patents Reply Brief in Support of Plaintiffs' Motion for Partial Summary Judgment That the Best Mode Requirement is Satisfied for the Claims of the '009 and '396 Patents (Filed Under Seal)* filed by Commissariat a LEnergie Atomique, SOITEC Silicon On Insulator Technologies SA. (Attachments: # 1 Certificate of Service)(Kraft, Denise) (Entered: Jul. 30, 2010).
Reply Brief re 202 Motion for Partial Summary Judgment *SOITEC/CEA Parties Motion For Partial Summary Judgment That The Patents in Suit Satisfy The Written Description Requirement Reply Brief in Support of SOITEC/CEA Parties' Motion For Partial Simmary Judgment That The Patents in Suit Satisfy The Written Description Requirement* filed by Commissariat a LEnergie Atomique, SOITEC Silicon On Insulator Technologies SA. (Attachments: # 1 Certificate of Service)(Kraft, Denise) (Entered: Jul. 30, 2010).
Sealed Reply Brief re 208 Motion for Partial Summary Judgment *Plaintiffs' Motion For Partial Summary Judgment That The Bruel Patent Does not Anticipate The Aspar Patents Reply Brief in Support of Plaintiffs' Motion For Partial Simmary Judgment That The Bruel Patent Does Not Anticipate The Aspar Patents (Filed Under Seal)* filed by Commissariat a LEnergie Atomique, SOITEC Silicon On Insulator Technologies SA. (Attachments: # 1 Certificate of Service)(Kraft, Denise) (Entered: Jul. 30, 2010).
Sealed Reply Brief re 206 Motion for Partial Summary Judgment *SOITEC/CEA Parties' Motion For Partial Summary Judgment That The Aspar Patents Are Not Invalid For Inequitable Conduct Reply Bried in Support of SOITEC/CEA Paties' Motion For Partial Summary Judgment That The Aspar Patents Are Not Invalid For Inequitable Conduct (Filed Under Seal)* filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Jul. 30, 2010).
Letter to the Honorable Sue L. Robinson from Denise Seastone Kraft, Esq. regarding Courtesy CD-ROM Plaintiffs' Reply to Daubert Motion and Motions for Partial Summary Judgment, and Plaintiffs' Omnibus Appendix to the Replies. (Kraft, Denise) (Entered: Aug. 2, 2010).
Redacted Version of 269 Appendix, *To Reply Brief in Support of MEMC's Motion for Partial Summary Judgment of Invalidity of the Asserted Aspar Patent Claims* by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).
Redacted Version of 273 Appendix *Reply Brief in Support of MEMC's Motion for Summary Judgment of Non-Infringement* by MEMC Eectronic Materials Inc.. (Attachments: # 1 Appendix Table of Contents, # 2 Appendix MA2352-MA2361, # 3 Appendix MA2362-MA2371, # 4 Appendix MA2372-MA2381, # 5 Appendix MA2382-MA2391, # 6 Appendix MA2392-MA2399, # 7 Appendix MA2400-MA2404, # 8 Appendix MA2405-MA2422, # 9 Appendix MA2423-MA2425, # 10 Appendix MA2426-MA2427, # 11 Appendix MA2428-MA2430, # 12 Appendix MA2431-NA2440, # 13 Appendix MA2441-MA2448, # 14 Appendix MA2449-MA2452, #

15 Appendix MA2452.1-MA2452.9, # 16 Certificate of Service)(Rogowski, Patricia) (Entered: Aug. 3, 2010).
Letter to the Honorable Sue L. Robinson from Patricia Smink Rogowski regarding CD-ROM (1) MEMC's Claim Construction Briefing, (2) MEMC's Briefs in Support of MEMC's Motion for Summary Judgment, and (3) MEMC's Briefs in Opposition to Soitec's Summary Judgment Motions. (Rogowski, Patricia) (Entered: Aug. 3, 2010).
Redacted Version of 267 Reply Brief *in Support of MEMC's Motion for Partial Summary Judgment of Invalidity of the Asserted Aspar Patent Claims* by MEMC Electronic Materials Inc.. (Rogowski, Patricia) (Entered: Aug. 3, 2010).
Redacted Version of 271 Reply Brief *in Support of MEMC's Motion for Summary Judgment of Non-Infringement* by MEMC Electronic Materials Inc.. (Rogowski, Patricia) (Entered: Aug. 3, 2010).
Deguet, C. et al., "*200 MM Germanium-On-Insulator (GEOI) Structures Realized From Epitaxial Wafers Using the Smart Cut™ Technology*". (11 pgs).
Di Cioccio, L. et al., "*Silicon Carbide on Insulator Formation by the Smart Cut® Process*".—Materials Science and Engineering B46 (1997—pp. 349-356).
Jalaguier, E. et al., "*Transfer of Thin InP Films Onto Silicon Substrate by Proton Implantation Process*".—11$^{th}$ International Conference on Indium Phosphide and Related Materials May 16-20, 1999—Davos, Switzerland. (pp. 26-27).
Jalaguier, E. et al., "*Transfer of 3in GaAs Film on Silicon Substrate by Proton Implantation Process*".—(2 pgs).
Letertre F. et al., "*Germanium-On-Insulator (GeOI) Structure Realized by the Smart Cut™ Technology*".—Mat. Res. Soc. Symp. Pros vol. 809 © 2004 Materials Research Society. (pp. 153-158).
Office Action (Non-Final)—U.S. Appl. No. 12/088,047—filed: Jun. 12, 2008—(9 pages).
Auberton-Hervé, A.J., "Why Can Smart Cut® Change the Future of Microelectronics?", Published in International Journal of High Speed Electronics and Systems, vol. 10, No. 1 (2000) pp. 131-146.
Ayguavives et al., "Physical Properties of (Ba,Sr) TiO3 Thin Films Used for Integrated Capacitors in Microwave Applications", IEEE 2001.
Donohue et al., "Pulse-Extended Excimer Laser Annealing of Lead Zirconate Titanate Thin Films", Proceedings of the 12th International Symposium on Integrated Ferroelectrics, Aachen, Germany, Mar. 2000, Integrated Ferroelectrics, vol. 31, pp. 285 to 296, 2000.
Heistand et al., "Advances in Passive Integration for C/RC Arrays & Networks with Novel Thin & Thick Film Materials", 36th Nordic IMAPS Conference, Helsinki, 1999.
Hendrix et al., "Low-Temperature Process for High-Density Thin-Film Integrated Capacitors", International Conference on High-Density Interconnect and Systems Packaging, 2000.
Huang, et al., Calculation of critical layer thickness considering thermal strain in Si1-xGex/Si strained-layer heterostructures, J. Appl. Phys. 83 (1), Jan. 1, 1998.
Jenei et al., "High-Q Inductors and Capacitors on Si Substrate", IEEE 2001.
Kim et al., "A Porous-Si-based Novel Isolation Technology for Mixed-Signal Integrated Circuits", Symposium on VLSI Technology, 2000.
Liu et al., "Integrated Thin Film Capacitor Arrays", International Conference on High Density Packaging and MCMs, 1999.
Motohiro et al. "Geometrical Factors of Argon Incorporation in SiO2 Films Deposited by ION Beam Sputtering"—Thin Solid Films, Elsevier-Sequoia S.A. Lausanne, CH, vol. 120, No. 4—Oct. 1, 1984, pp. 313-327.
Ray et al. "Effect of Reactive-Ion Bombardment on the Properties of Silicon Nitride and Oxynitride Films Deposited by Ion-Beam Sputtering"—Journal of Applied Physics, vol. 75, No. 12, Jun. 15, 1994—pp. 8145-8152.
Roozeboom et al., "High-Value MOS Capacitor Arrays in Ultradeep Trenches in Silicon", Microelectronic Engineering, vol. 53, pp. 581 to 584, Elsevier Science 2000.
Tillmans et al., "Zero-Level Packaging for MEMS or MST Devices: The IRS Method", MEMS/Sensors, Advancing Microelectronics, pp. 37-39, Nov./Dec. 2000.
Tomisaka et al., "Electroplating Cu Fillings for Through-Vias for Three-Dimensional Chip Stacking" (Electronic Components and Technology Conference, 2002).
International Search Report for International Application No. PCT/FR1998/002904, dated Apr. 16, 1999, 2 pages.
International Search Report for International Application No. PCT/FR2002/003422, dated Jan. 22, 2003, 3 pages.
International Search Report for International Application No. PCT/FR2003/003256, dated Mar. 19, 2004, 6 pages.
International Search Report for International Application No. PCT/FR2003/003867, dated May 28, 2004, 3 pages.
International Search Report for International Application No. PCT/FR2003/003622, dated Jun. 3, 2004, 3 pages.
International Search Report for International Application No. PCT/FR2004/001858, dated Dec. 28, 2004, 3 pages.
International Search Report for International Application No. PCT/FR2004/001565, dated Jul. 6, 2005, 3 pages.
International Search Report for International Application No. PCT/FR2006/002184, dated Jan. 24, 2007, 2 pages.
International Search Report for International Application No. PCT/FR2007/000534, dated Nov. 22, 2007, 3 pages.
International Search Report for International Application No. PCT/FR2007/002100, dated Feb. 4, 2009, 3 pages.
International Search Report for International Application No. PCT/FR2008/001427, dated Jul. 1, 2009, 3 pages.
Office Action from U.S. Appl. No. 10/468,223, dated Oct. 5, 2005, 7 pages.
Office Action from U.S. Appl. No. 10/468,223, dated May 3, 2006, 11 pages.
Office Action from U.S. Appl. No. 10/468,223, dated Jan. 10, 2007, 11 pages.
Office Action from U.S. Appl. No. 10/468,223, dated Jul. 20, 2007, 11 pages.
Office Action from U.S. Appl. No. 10/468,223, dated Feb. 11, 2008, 11 pages.
Office Action from U.S. Appl. No. 10/468,223, dated Oct. 29, 2008, 11 pages.
Office Action from U.S. Appl. No. 10/468,223, dated Jun. 25, 2009, 8 pages.
Office Action from U.S. Appl. No. 10/534,199, dated Feb. 19, 2009, 8 pages.
Office Action from U.S. Appl. No. 10/534,199, dated Aug. 5, 2009, 10 pages.
Office Action from U.S. Appl. No. 10/534,199, dated Jan. 20, 2010, 8 pages.
Office Action from U.S. Appl. No. 10/534,199, dated Aug. 4, 2010, 8 pages.
Office Action from U.S. Appl. No. 10/577,175, dated Jun. 22, 2009, 13 pages.
Office Action from U.S. Appl. No. 10/577,175, dated Apr. 13, 2010, 14 pages.
Office Action from U.S. Appl. No. 11/480,250, dated May 22, 2008, 10 pages.
Office Action from U.S. Appl. No. 11/480,250, dated Dec. 3, 2008, 16 pages.
Office Action from U.S. Appl. No. 11/480,250, dated Jan. 26, 2010, 14 pages.
Office Action from U.S. Appl. No. 11/480,250, dated Aug. 3, 2010, 15 pages.
Office Action from U.S. Appl. No. 12/088,047, dated Sep. 25, 2009, 9 pages.
Office Action from U.S. Appl. No. 12/088,047, dated Mar. 10, 2010, 9 pages.
Office Action from U.S. Appl. No. 10/561,299, dated Mar. 26, 2008, 9 pages.
Office Action from U.S. Appl. No. 10/561,299, dated Dec. 9, 2008, 11 pages.
Office Action from U.S. Appl. No. 10/561,299, dated May 11, 2009, 12 pages.
Office Action from U.S. Appl. No. 10/561,299, dated Nov. 16, 2009, 11 pages.
Office Action from U.S. Appl. No. 10/561,299, dated Nov. 27, 2009, 10 pages.

Office Action from U.S. Appl. No. 10/561,299, dated May 11, 2010, 11 pages.
Office Action from U.S. Appl. No. 10/565,621, dated May 15, 2007, 13 pages.
Office Action from U.S. Appl. No. 10/565,621, dated Feb. 11, 2008, 11 pages.
Office Action from U.S. Appl. No. 10/565,621, dated Sep. 12, 2008, 9 pages.
Office Action from U.S. Appl. No. 10/565,621, dated Mar. 12, 2009, 6 pages.
Office Action from U.S. Appl. No. 10/565,621, dated Jan. 7, 2010, 8 pages.
Office Action from U.S. Appl. No. 10/565,621, dated Nov. 23, 2010, 11 pages.
Office Action from U.S. Appl. No. 12/628,772, dated Oct. 7, 2010, 12 pages.
Notice of Allowance from U.S. Appl. No. 12/336,229, dated Sep. 29, 2010, 7 pages.
Notice of Allowance from U.S. Appl. No. 12/336,229, dated Jan. 10, 2011, 4 pages.
Notice of Allowance from U.S. Appl. No. 10/468,223, dated Dec. 28, 2009, 4 pages.
Office Action from U.S. Appl. No. 10/474,984, dated Sep. 24, 2004, 6 pages.
Office Action from U.S. Appl. No. 10/474,984, dated Jun. 6, 2005, 5 pages.
Office Action from U.S. Appl. No. 10/474,984, dated Nov. 16, 2005, 5 pages.
Office Action from U.S. Appl. No. 10/474,984, dated May 17, 2006, 5 pages.
Office Action from U.S. Appl. No. 10/474,984, dated May 7, 2007, 9 pages.
Office Action from U.S. Appl. No. 10/474,984, dated Feb. 6, 2008, 10 pages.
Office Action from U.S. Appl. No. 10/474,984, dated Oct. 17, 2008, 11 pages.
Office Action from U.S. Appl. No. 10/474,984, dated Jul. 7, 2009, 10 pages.
Office Action from U.S. Appl. No. 10/474,984, dated Mar. 11, 2010, 13 pages.
Notice of Allowance from U.S. Appl. No. 10/474,984, dated Oct. 28, 2010, 6 pages.
Office Action from U.S. Appl. No. 10/540,303, dated Dec. 18, 2007, 6 pages.
Notice of Allowance from U.S. Appl. No. 10/540,303, dated Oct. 7, 2008, 9 pages.
Office Action from U.S. Appl. No. 11/327,906, dated Oct. 1, 2007, 5 pages.
Office Action from U.S. Appl. No. 11/327,906, dated Feb. 11, 2008, 5 pages.
Notice of Allowance from U.S. Appl. No. 11/327,906, dated Sep. 15, 2008, 6 pages.
Office Action from U.S. Appl. No. 10/975,826, dated May 5, 2006, 14 pages.
Office Action from U.S. Appl. No. 10/975,826, dated Nov. 28, 2006, 20 pages.
Office Action from U.S. Appl. No. 10/975,826, dated Jul. 17, 2007, 21 pages.
Office Action from U.S. Appl. No. 10/975,826, dated Apr. 1, 2008, 27 pages.
Office Action from U.S. Appl. No. 10/975,826, dated Dec. 10, 2008, 28 pages.
Office Action from U.S. Appl. No. 10/975,826, dated Sep. 2, 2009, 24 pages.
Notice of Allowance from U.S. Appl. No. 10/975,826, dated Apr. 28, 2010, 8 pages.
Office Action from U.S. Appl. No. 10/492,343, dated Oct. 17, 2005, 6 pages.
Office Action from U.S. Appl. No. 10/492,343, dated Jun. 6, 2006, 13 pages.
Office Action from U.S. Appl. No. 10/492,343, dated Nov. 14, 2006, 13 pages.
Office Action from U.S. Appl. No. 10/492,343, dated May 29, 2007, 15 pages.
Office Action from U.S. Appl. No. 10/492,343, dated Feb. 7, 2008, 18 pages.
Office Action from U.S. Appl. No. 10/492,343, dated Aug. 18, 2008, 12 pages.
Office Action from U.S. Appl. No. 10/492,343, dated Dec. 22, 2008, 9 pages.
Notice of Allowance from U.S. Appl. No. 10/492,343, dated Jun. 26, 2009, 6 pages.
Office Action from U.S. Appl. No. 11/747,733, dated Mar. 16, 2009, 9 pages.
Office Action from U.S. Appl. No. 11/747,733, dated Mar. 23, 2010, 5 pages.
Notice of Allowance from U.S. Appl. No. 11/747,733, dated Sep. 29, 2010, 8 pages.
Notice of Allowance from U.S. Appl. No. 12/293,193, dated Oct. 8, 2009, 10 pages.
CV and Publication of Michael P. Marder faxed Sep. 21, 2000.
Expert Report of Marcus Weldon, Ph.D. dated Nov. 1, 2000.
Expert Report of Jean-Pierre Colinge dated Nov. 1, 2000.
Expert Report of Chris Van de Walle, Ph.D. dated Nov. 1, 2000.
Memorandum in Support of Defendant Silicon Genesis Corporation's Motion for Summary Judgment of Invalidity for Lack of Enablement dated Mar. 19, 2001.
Memorandum of Points and Authorities in Support of Soitec's Motion for Summary Judgment on Sigen's Enablement Invalidity Claim (Redacted) dated Mar. 27, 2001.
Soitec's Memorandum of Points and Authorities in Opposition to Silicon Genesis Corporation's Motion for Summary Judgment of Invalidity for Lack of Enablement dated Apr. 11, 2001.
Memorandum in Support of Defendant Silicon Genesis Corporation's Opposition to Soitec's Motion for Summary Judgment on SiGen's Defense of Enablement dated Apr. 20, 2001.
Reply Memorandum in Support of Defendant Silicon Genesis Corporation's Motion for Summary Judgment of Invalidity for Lack of Enablement dated Apr. 30, 2001.
Expert Report of Marcus Weldon, Ph.D. dated Aug. 24, 2001.
Report of Jean-Pierre Colinge in Response to SiGen Enablement and Indefiniteness Expert Reports of Aug. 24, 2001.
Expert Report of Chris Van de Walle, Ph.D. dated Aug. 24, 2001.
Memorandum and Order re: Summary Judgment [denied] dated Feb. 5, 2002.
Plaintiff's Memorandum in Support of Their Motion for Judgment As a Matter of Law and a New Trial dated May 10, 2002.
Silicon Genesis Corporation's Opposition to Plaintiff's Motion for Judgment as a Matter of Law and a New Trial dated Jun. 17, 2002.
Memorandum of Law in Support of Plaintiff's Motion for Judgment on SiGen's Indefiniteness Defense dated Jun. 20, 2002.
Plaintiff's Reply Memorandum in Support of Their Motion for Judgment as a Matter of Law and a New Trial dated Jul. 18, 2002.
Defendant Silicon Genesis Corporation's Opposition to Soitec's Motion for Judgment Re Indefiniteness and Cross-Motion for Judgment of Indefiniteness dated Jul. 19, 2002.
Plaintiff's Reply in Support of their Motion for Judgment on SiGen's Indefiniteness Defense dated Jul. 25, 2002.
Memorandum and Order re: Post-Trial Motions dated Aug. 23, 2002.
Judgment dated Oct. 21, 2002.
Brief of Plaintiffs-Appellants Soitec, S.A. and Commissariat a L'Energie Atomique dated Jan. 28, 2003.
Brief for Defendant-Cross Appellant Silicon Genesis Corporation dated Mar. 22, 2003.
Reply Brief of Plaintiffs-Appellants Soitec, S.A. And Commissariat a L'Energie Atomique dated May 5, 2003.
Reply Brief for Defendant-Cross Appellant Silicon Genesis Corporation dated May 19, 2003.
Plaintiff/Appellants Supplemental Authority Letter [dated Nov. 17, 2003].
Defendant-Cross Appellant's Response to Appellants' Submission of *CFMT, Inc. v. Yieldup Int'l*, [dated Nov. 24, 2003].
Decision from the United States Court of Appeals for the Federal Circuit dated Nov. 26, 2003.

Combined Petition for Panel Rehearing and for Rehearing En Banc by Plaintiffs-Appellant's Soitec, S.A. and Commissariat a L'Energie Atomique, dated Dec. 10, 2003.
Order [dated Jan. 7, 2004 denying Appellants' petition for panel rehearing and Appellant's petition for rehearing en banc].
Judgment Mandate [dated Jan. 14, 2004].
Redacted Version of 274 Appendix,, Omnibus Appendix to Plaintiffs' Reply Briefs in Support of Plaintiffs' Daubert Motion and Motions for Partial Summary Judgment (PA-1192-PA-1198 and PA-1207-PA-1230 Filed Under Seal) by Commissariat a LEnergie Atomique, SOITEC Silicon on Insulator Technologies SA. (Kraft, Denise) (Entered: Aug. 6, 2010).
Redacted Version of 277 Reply Brief, in Support of SOITEC/CEA Parties' Motion to Exclude the Expert Report of Dr. Pascal Belton and Any Related Testimony by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 278 Reply Brief,, in Support of SOITEC/CEA Parties' Motion for Summary Judgment: Non-Infringement (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 279 Reply Brief,, in Support of Plaintiffs' Motion for Partial Summary Judgment That the Best Mode Requirement is Satisfied for the Claims of the '009 and '396 Patents (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 281 Reply Brief, in Support of Plaintiffs' Motion for Partial Summary Judgment That the Bruel Patent Does Not Anticipate the Aspar Patents (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 282 Reply Brief,, in Support of SOITEC/CEA Parties' Motion for Partial Summary Judgment That the Aspar Patents Are Not Invalid for Inequitable Conduct (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Notice of Service of CD of documents MEMC0782194-MEMC0782500 and FH-1 0001 -FH-8 0067 by MEMC Electronic Materials Inc..(Rogowski, Patricia) (Entered: Sep. 16, 2010).
Redacted Version of 301 Sealed Motion for Reconsideration Request to Modify Protective Order by Commissariat a LEnergie Atomique, SOITEC Silicon on Insulator Technologies SA. (Attachments: # 1 Certificate of Service)(Kraft, Denise) (Entered: Sep. 24, 2010).
Redacted Version of 302 Declaration, of Michael L. Brody in Support of Motion to Reconsider Request to Modify Protective Order by Commissariat a LEnergie Atomique, SOITEC Silicon on Insulator Technologies SA. (Attachments: # 1 Certificate of Service)(Kraft, Denise) (Entered: Sep. 24, 2010).
Redacted Version of 303 Exhibit to a Document Exhibit A to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 304 Exhibit to a Document Exhibit B to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 305 Exhibit to a Document Exhibit C to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 306 Exhibit to a Document Exhibit D to Michael L. Brody in Support Of Motion to Reconsider Request to Modify Protective Order by Commissariat a LEnergie Atomique, SOITEC Silicon on Insulator Technologies SA. (Kraft, Denise) (Entered: Sep. 24, 2010).

Proposed Pretrial Order [Proposed] Joint Pretrial Order (Filed Under Seal) by Commissariat a LEnergie Atomique, SOITEC Silicon on Insulator Technologies SA, SOITEC U.S.A., Inc.. (Attachments: # 1 Exhibit 1 (Sealed), # 2 Exhibit 2A (Sealed), # 3 Exhibit 2B (Sealed), # 4 Exhibit 3A (Sealed), # 5 Exhibit 3B (Sealed), # 6 Exhibit 4A (Sealed), # 7 Exhibit 4B (Sealed), # 8 Exhibit 4C (Sealed), # 9 Exhibit 5A (Sealed), # 10 Exhibit 5B (Sealed), # 11 Exhibit 6A (Sealed), # 12 Exhibit 6B (Sealed), # 13 Exhibit 7A (Sealed), # 14 Exhibit 7B (Sealed), # 15 Certificate of Service)(Kraft, Denise) (Entered: Oct. 7, 2010).
Proposed Voir Dire by MEMC Electronic Materials Inc.. (Attachments: # 1 Certificate of Service)(Rogowski, Patricia) (Entered: Oct. 8, 2010).
Verdict Sheet by MEMC Electronic Materials Inc.. (Attachments: # 1 Certificate of Service)(Rogowski, Patricia) (Entered: Oct. 8, 2010).
Proposed Voir Dire by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Verdict Sheet by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Proposed Jury Instructions by Commissariat a LEnergie Atomique, SOITEC Silicon on Insulator Technologies SA, SOITEC U.S.A., Inc.. (Kraft, Denise) (Entered: Oct. 8, 2010).
Redacted Version of 315 Proposed Pretrial Order,, Redacted Version of [Proposed] Joint Pretrial Order by Commissariat a LEnergie Atomique, SOITEC Silicon on Insulator Technologies SA, SOITEC U.S.A., Inc.. (Attachments: # 1 Exhibit 1, # 2 Exhibit 2A, # 3 Exhibit 2B, # 4 Exhibit 3A, # 5 Exhibit 3B, # 6 Exhibit 4A, # 7 Exhibit 4B, # 8 Exhibit 4C, # 9 Exhibit 5A, # 10 Exhibit 5B, # 11 Exhibit 6A, # 12 Exhibit 6B, # 13 Exhibit 7A, # 14 Exhibit 7B, # 15 Certificate of Service)(Kraft, Denise) (Entered: Oct. 13, 2010).
Memorandum Opinion. Signed by Judge Sue L. Robinson on Oct. 13, 2010. (nmf) (Entered: Oct. 13, 2010).
Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting in part and denying in part 213 Motion for Partial Summary Judgment. Signed by Judge Sue L. Robinson on Oct. 13, 2010. (nmf) (Entered: Oct. 13, 2010).
Memorandum Order re: claim construction. Signed by Judge Sue L. Robinson on Oct. 13, 2010. (nmf) (Entered: Oct. 13, 2010) Oral Order by Judge Sue L. Robinson on Oct. 14, 2010 that the responses to the issues raised in the exhibits to the joint pre-trial order are to be stricken from the record. (These filings, formerly D.I. Nos. 318 and 323 have been deleted from the docket.) (nmf) (Entered: Oct. 14, 2010).
Amended Order denying 141 Motion for Discovery; denying 186 Motion in Limine; granting In part and denying in part 187 Motion for Partial Summary Judgment; granting 197 Motion for Summary Judgment; granting 199 Motion for Summary Judgment; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; *granting* 213 Motion for Partial Summary Judgment. Signed by Judge Sue L. Robinson on Oct. 14, 2010. (nmf) (Entered: Oct. 14, 2010) Minute Entry for proceedings held before Judge Sue L. Robinson—Final Pretrial Conference held on Oct. 14, 2010. (Court Reporter V. Gunning.) (nmf) (Entered: Oct. 15, 2010) So Ordered, re 315 Proposed Pretrial Order. Signed by Judge Sue L. Robinson on Oct. 14, 2010. (nmf) (Entered: Oct. 15, 2010).
Motion for Reargument re 327 Memorandum and Order—Reargument of Claim Construction of One Claim Term of U.S. Patent 6,809,009—filed by MEMC Electronic Materials Inc.. (Rogowski, Patricia) (Entered: Oct. 18, 2010).
Second Amended Order re: 325 denying 141 Motion for Discovery; denying 186 Motion In Limine; granting in part and denying in part 187 Motion for Partial Summary Judgment; granting 197 Motion for Summary Judgment ; granting 199 Motion for Summary Judgment **with respect to the '484 patent and with respect to its current process, and denied in other respects; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion For Partial Summary Judgment. Signed by Judge Sue L. Robinson on Oct. 19, 2010. (nmf) (Entered: Oct. 19, 2010).
Memorandum Order granting 329 Motion for Reargument re 327 Memorandum and Order—Reargument of Claim Construction of One Claim Term of U.S. Patent 6,809,009. Signed by Judge Sue L. Robinson on Oct. 19, 2010. (nmf) (Entered: Oct. 19, 2010).
Stipulation Memc's Declaratory Judgment counterclaim asserting invalidity of United States Reissued Patent No. 39,484 in Civil Action No. 1:08-292-SLR is dismissed without prejudice by Commissariat a LEnergie Atomique, SOITEC Silicon on Insulator Technologies SA, SOITEC U.S.A., Inc.. (Kraft, Denise) (nmf, ). (Entered: Oct. 21, 2010).
Stipulation of Fact re 331 Memorandum and Order, 327 Memorandum and Order, 325 Memorandum Opinion by Commissariat a LEnergie Atomique, SOITEC Silicon on Insulator Technologies SA, SOITEC U.S.A., Inc.. (Kraft, Denise) (Entered: Oct. 21, 2010).
Letter to the Honorable Sue L. Robinson from Denise Seastone Kraft regarding Mutually agreed upon narrowing of the issues for trial—re 333 Stipulation, 332 Stipulation,. (Kraft, Denise) (Entered: Oct. 21, 2010) Correcting Entry: The pdf of D.I. 332 has been replaced with the correct pdf of the stipulation per request of filer. (nmf) (Entered: Oct. 22, 2010) So Ordered, re 333 Stipulation filed by SOITEC Silicon on Insulator Technologies SA, SOITEC U.S.A., Inc., Commissariat a LEnergie Atomique, 332 Stipulation, filed by SOITEC Silicon on Insulator Technologies SA, SOITEC U.S.A., Inc., Commissariat a LEnergie Atomique. Signed by Judge Sue L. Robinson on Oct. 22, 2010. (nmf) (Entered: Oct. 22, 2010).
Voir Dire Questions. Read in Open Court Oct. 25, 2010.(nmf) (Entered: Oct. 25, 2010).
Preliminary Jury Instructions. Read in Open Court Oct. 25, 2010. (nmf) (Entered: Oct. 25, 2010) Minute Entry for proceedings held before Judge Sue L. Robinson: Jury Trial Day 1 held on Oct. 25, 2010. (Court Reporter Valerie Gunning, Brian Gaffigan.) (dlk) (Entered: Oct. 26, 2010).
Plaintiff'S Bench Memorandum. Filed in Court Oct. 26, 2010. (nmf) (Entered: Oct. 26, 2010) Minute Entry for proceedings held before Judge Sue L. Robinson—Jury Trial (Day 2) held on Oct. 26, 2010. (Court Reporter Valerie Gunning, Kevin Maurer.) (dlk) (Entered: Oct. 26, 2010) Minute Entry for proceedings held before Judge Sue L. Robinson—Jury Trial—Day 3, held on Oct. 27, 2010. (Court Reporter Valerie Gunning/Kevin Maurer.) (nms) (Entered: Oct. 27, 2010).
Statement—Bench Memorandum Supporting MEMC'S Proffer of Admissions by SOITEC in Prior Lawsuit Involving the '564 Patent submitted at trial by MEMC Electronic Materials Inc.. (Attachments: # 1 Exhibit A)(Rogowski, Patricia) (Entered: Oct. 28, 2010) Minute Entry for proceedings held before Judge Sue L. Robinson—Jury Trial—Day 4 held on Oct. 28, 2010. (Court Reporter Valerie Gunning/Kevin Maurer.) (nms) (Entered: Nov. 1, 2010).
Final Jury Instructions read in open Court by Judge Robinson. (lid) (Entered: Nov. 1, 2010) Minute Entry for proceedings held before Judge Sue L. Robinson—Jury Trial held on Nov. 1, 2010. (Day 5) (Court Reporter V. Gunning.) (lid) (Entered: Nov. 2, 2010) Minute Entry for proceedings held before Judge Sue L. Robinson—Jury Trial completed on Nov. 2, 2010. (Day 6) (Court Reporter V. Gunning.) (lid) (Entered: Nov. 2, 2010).
Redacted Version of 342 Jury Verdict. (lid) (Entered: Nov. 2, 2010).
Statement Bench Memorandum in Support of Plaintiffs' Motion for Judgment as a Matter of Law of No Unenforceability of the '009 Patent Due to Inequitable Conduct submitted at trial by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 2, 2010).
Answering Brief in Opposition re 301 Sealed Motion for Reconsideration Request to Modify Protective Order (MEMC's Opposition to Plaintiffs' Motion for Reargument Re: Modification of the Protective Order) filed by MEMC Electronic Materials Inc. Reply Brief due date per Local Rules is Nov. 22, 2010. (Attachments: # 1 Exhibit 1 through 5, # 2 Certificate of Service)(Rogowski, Patricia) (Entered: Nov. 12, 2010).
Judgment in favor of defendant MEMC Electronic Materials, Inc. and against plaintiffs S.O.I.TEC Silicon on Insulator Technologies, S.A. and Commisseriat a LEnergie Atomique et aux Energies Alternatives as to the 812 patent. It Is Further Ordered that judgment be and is hereby entered in favor of plaintiffs S.O.I.TEC Silicon on Insulator Technologies, S.A. and Commisseriat a LEnergie Atomique et aux Energies Alternatives and against defendant MEMC Electronic Materials, Inc. as to the 009 patent. Signed by Judge Sue L. Robinson on Nov. 15, 2010. (nmf) (Entered: Nov. 15, 2010).
Stipulation Setting Post-Trial Briefing Schedule re 348 Judgment,, by Commissariat a LEnergie Atomique, MEMC Electronic Materials Inc., SOITEC Silicon on Insulator Technologies SA. (Rogowski, Patricia) (Entered: Nov. 15, 2010).
Motion for Reargument re 348 Judgment,, (MEMCS Motion for Reargument of the Courts Order Re: The Unenforceability of the 009 Patent)—filed by MEMC Electronic Materials Inc.. (Attachments: # 1 Exhibit 1)(Rogowski, Patricia) (Entered: Nov. 16, 2010) So Ordered—re 349 Stipulation. Set Post Trial Briefing Schedule: (Opening Brief due Dec. 8, 2010., Answering Brief due Dec. 29, 2010., Reply Brief due Jan. 12, 2010.). Signed by Judge Sue L. Robinson on Nov. 17, 2010. (lid) (Entered: Nov. 17, 2010).
Motion for Leave to File Reply in Support of Plaintiff's Motion for Reargument—filed by Commissariat a LEnergie Atomique, SOITEC Silicon on Insulator Technologies SA. (Attachments: # 1 Text of Proposed Order, # 2 Certificate of Service)(Kraft, Denise) (Entered: Nov. 23, 2010).
Opening Brief in Support re 301 Sealed Motion for Reconsideration Request to Modify Protective Order, 351 Motion for Leave to File Reply in Support of Plaintiffs Motion for Reargument filed by Commissariat a LEnergie Atomique, SOITEC Silicon on Insulator Technologies SA.Answering Brief/Response due date per Local Rules is Dec. 10, 2010. (Attachments: # 1 Appendix A, # 2 Certificate of Service)(Kraft, Denise) (Entered: Nov. 23, 2010).
Stipulation to Extend Time Respond to MEMC's Motion for Reargument of the Court's Order Re: Unenforceability of the '009 Patent to Dec. 3, 2010—filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 24, 2010) So Ordered—re 353 Stipulation to Extend Time. Set Briefing Schedule: re 350 Motion for Reargument re 348 Judgment,. (Answering Brief due Dec. 3, 2010.). Signed by Judge Sue L. Robinson on Nov. 30, 2010. (lid) (Entered: Nov. 30, 2010).
Stipulation to Extend Time to file Motions and Opening Post-Trial Briefs to Dec. 13, 2010—filed by Commissariat a LEnergie Atomique, SOITEC Silicon on Insulator Technologies SA, SOITEC U.S.A., Inc.. (Kraft, Denise) (Entered: Dec. 3, 2010).
Reply Brief re 350 Motion for Reargument re 348 Judgment,, (MEMCS Motion for Reargument of the Courts Order Re: The Unenforceability of the 009 Patent) Plaintiffs' Opposition to MEMC's Motion for Reargument of the Court's Order Re: The Unenforceability of the '009 Patent filed by Commissariat a LEnergie Atomique, SOITEC Silicon on Insulator Technologies SA, Soitec U.S.A., Inc.. (Attachments: # 1 Exhibit A, # 2 Certificate of Service)(Kraft, Denise) (Entered: Dec. 3, 2010) So Ordered—re 354 Stipulation to Extend Time. Set Briefing Schedule: (Post Trial Opening Brief due Dec. 13, 2010.). Signed by Judge Sue L. Robinson on Dec. 6, 2010. (lid) (Entered: Dec. 6, 2010).
Exhibit re 355 Reply Brief, Exhibit B to Plaintiffs' Opposition to MEMC's Motion for Reargument of the Court's Order Re: The Unenforceability of the '009 Patent by Commissariat a LEnergie Atomique, SOITEC Silicon on Insulator Technologies SA, SOITEC U.S.A., Inc.. (Kraft, Denise) (Entered: Dec. 6. 2010).

Answering Brief in Opposition re 351 Motion for Leave to File Reply in Support of Plaintiff's Motion for Reargument filed by MEMC Electronic Materials Inc..Reply Brief due date per Local Rules is Dec. 20, 2010. (Rogowski, Patricia) (Entered: Dec. 10, 2010).
Stipulation to Extend Time Stipulation and Order for Plaintiffs to file Motions and Opening Post-Trial Briefs to Dec. 14, 2010—filed by Commissariat a LEnergie Atomique, SOITEC Silicon on Insulator Technologies SA, SOITEC U.S.A., Inc.. (Kraft, Denise) (Entered: Dec. 13, 2010).
Motion for Judgment as a Matter of Law—MEMC'S Renewed Motion for Judgment as a Matter of Law or in the Alternative for a New Trial—filed by MEMC Electronic Materials Inc.. (Rogowski, Patricia) (Entered: Dec. 13, 2010).
Opening Brief in Support re 359 Motion for Judgment as a Matter of Law—MEMC's Renewed Motion for Judgment As a Matter of Law or in the Alternative for a New Trial filed by MEMC Electronic Materials Inc..Answering Brief/Response due date per Local Rules is Dec. 30, 2010. (Attachments: # 1 Exhibit 1, # 2 Certificate of Service)(Rogowski, Patricia) (Entered: Dec. 13, 2010).
Motion for Judgment as a Matter of Law Plaintiffs' Renewed Motion for Judgment As a Matter of Law or in the Alternative for a New Trial—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).
Opening Brief in Support re 361 Motion for Judgment as a Matter of Law Plaintiffs' Renewed Motion for Judgment As a Matter of Law or in the Alternative for a New Trial filed by Commissariat a LEnergie Atomique, SOITEC Silicon on Insulator Technologies SA.Answering Brief/Response due date per Local Rules is Jan. 3, 2011. (Attachments: # 1 Certificate of Service)(Kraft, Denise) (Entered: Dec. 14, 2010).
Motion for Injunctive Relief Plaintiffs' Motion for Injunctive Relief and to Lift Stay on Damages Discovery—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).
Stipulation to Extend Time due date for Answering and Reply Post-Trial Briefs to Jan. 7, 2011 for Answering Brief and Jan. 21, 2011 for Reply Brief—filed by MEMC Electronic Materials Inc.. (Rogowski, Patricia) (Entered: Dec. 15, 2010) So Ordered- re 365 Stipulation to Extend Time. Set Briefing Schedule: (Answering Post trial Brief due Jan. 7, 2011., Reply post trial Brief due Jan. 21, 2011.). Signed by Judge Sue L. Robinson on Dec. 16, 2010. (lid) (Entered: Dec. 17, 2010).
Stipulation to Extend Time Post-Trial Answering Briefs to Jan. 12, 2011—filed by MEMC Electronic Materials Inc.. (Rogowski, Patricia) (Entered: Jan. 6, 2011).
Notice of Appearance by Aleine Michelle Porterfield on behalf of Commissariat a LEnergie Atomique, SOITEC Silicon on Insulator Technologies SA, SOITEC U.S.A., Inc. (Attachments: # 1 Certificate of Service)(Porterfield, Aleine) (Entered: Jan. 7, 2011).
Joint Stipulation to Extend Time Post-trial Answering Briefs and Post-trial Reply Briefs to Jan. 14, 2011 and Jan. 28, 2011—filed by MEMC Electronic Materials Inc.. (Rogowski, Patricia) (Entered: Jan. 12, 2011).
Answering Brief in Opposition re 359 Motion for Judgment as a Matter of Law—MEMC'S Renewed Motion for Judgment As a Matter of Law or in the Alternative for a New Trial filed by Commissariat a LEnergie Atomique, SOITEC Silicon on Insulator Technologies SA, SOITEC U.S.A., Inc..Reply Brief due date per Local Rules is Jan. 24, 2011. (Attachments: # 1 Certificate of Service)(Kraft, Denise) (Entered: Jan. 14, 2011).
Answering Brief in Opposition re 361 Motion for Judgment as a Matter of Law Plaintiffs' Renewed Motion for Judgment As a Matter of Law or in the Alternative for a New Trial (MEMCS Answering Brief in Opposition to Plaintiffs Renewed Motion for Judgment As a Matter of Law or in the Alternative for a New Trial) filed by MEMC Electronic Materials Inc..Reply Brief due date per Local Rules is Jan. 24, 2011. (Attachments: # 1 Certificate of Service)(Rogowski, Patricia) (Entered: Jan. 14, 2011).
Declaration re 378 Answering Brief in Opposition, (Declaration of Robert M. Evans, Jr. In Support of MEMCS Opposition to Plaintiffs Renewed Motion for Judgment As a Matter of Law or in the Alternative for a New Trial) by MEMC Electronic Materials Inc.. (Attachments: # 1 Exhibit 1, # 2 Exhibit 2, # 3 Certificate of Service)(Rogowski, Patricia) (Entered: Jan. 14, 2011).
Redacted Version of 376 Answering Brief in Opposition, to Plaintiffs' Motion for Injunctive Relief and to Lift Stay on Damages Discovery by Memc Electronic Materials Inc.. (Attachments: # 1 Certificate of Service)(Rogowski, Patricia) (Entered: Jan. 20, 2011).
Redacted Version of 377 Appendix to MEMC's Answering Brief in Opposition to Plaintiffs' Motion for Injunctive Relief and to Lift Stay on Damages Discovery by MEMC Electronic Materials Inc.. (Attachments: # 1 Exhibit 1-7, # 2 Exhibit 8, # 3 Exhibit 9, # 4 Exhibit 10, # 5 Exhibit 11, # 6 Exhibit 12-13, # 7 Exhibit 14, # 8 Exhibit 15, # 9 Exhibit 16, # 10 Exhibit 17, # 11 Exhibit 18, # 12 Exhibit 19, # 13 Certificate of Service)(Rogowski, Patricia) (Entered: Jan. 20, 2011).
Joint Stipulation to Extend Time of Post-Trial Reply Briefs to Tuesday, Feb. 1, 2011—filed by Commissariat a LEnergie Atomique, SOITEC Silicon on Insulator Technologies SA, SOITEC U.S.A., Inc.. (Kraft, Denise) (Entered: Jan. 28, 2011).
Joint Stipulation to Extend Time of Post-Trial Reply Briefs to Friday, Feb. 4, 2011—filed by Commissariat a LEnergie Atomique, SOITEC Silicon on Insulator Technologies SA, SOITEC U.S.A., Inc.. (Kraft, Denise) (Entered: Jan. 31, 2011).
Redacted Version of 364 Opening Brief in Support,,,, Redacted Version of Opening Brief in Support of Plaintiffs' Motion for Injunctive Relief and to Lift Stay on Damages Discovery by Commissariat a LEnergie Atomique, SOITEC Silicon on Insulator Technologies SA, SOITEC U.S.A., Inc.. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Exhibit 0, # 16 Exhibit P, # 17 Exhibit Q, # 18 Exhibit R, # 19 Exhibit S)(Kraft, Denise) (Entered: Feb. 2, 2011).
Reply Brief re 359 Motion for Judgment as a Matter of Law—MEMC's Renewed Motion for Judgment as a Matter of Law or in the Alternative for a New Trial filed by MEMC Electronic Materials Inc.. (Attachments: # 1 Certificate of Service)(Rogowski, Patricia) (Entered: Feb. 4, 2011).
Reply Brief re 361 Motion for Judgment as a Matter of Law Plaintiffs' Renewed Motion for Judgment As a Matter of Law or in the Alternative for a New Trial filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Feb. 4, 2011).
Declaration re 387 Reply Brief, Declaration of Michael L. Brody in Support of Reply Brief in Support of Plaintiffs' Renewed Motion for Judgment as a Matter of Law or in the Alternative for a New Trial by Commissariat a LEnergie Atomique, SOITEC Silicon on Insulator Technologies SA, SOITEC U.S.A., Inc.. (Attachments: # 1 Exhibit A, # 2 Certificate of Service)(Kraft, Denise) (Entered: Feb. 4, 2011).
Motion to Strike 386 Reply Brief, Motion by Plaintiffs' to Strike Reply Brief in Support of MEMC's Renewed Motion for Judgment as a Matter of Law or, in the Alternative, a New Trial (D.I. 386)—filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Feb. 8, 2011).
Opening Brief in Support re 390 Motion to Strike 386 Reply Brief, Motion by Plaintiffs' to Strike Reply Brief in Support of MEMC's Renewed Motion for Judgment as a Matter of Law or, in the Alternative, a New Trial (D.I. 386) Motion to Strike 386 Reply Brief, Motion by Plaintiffs' to Strike Reply Brief in Support of MEMC's Renewed Motion for Judgment as a Matter of Law or, in the Alternative, a New Trial (D.I. 386) filed by Commissariat a LEnergie Atomique, SOITEC Silicon on Insulator Technologies SA, SOITEC U.S.A., Inc..Answering Brief/Response due date per Local Rules is Feb. 25, 2011. (Attachments: # 1 Certificate of Service)(Kraft, Denise) (Entered: Feb. 8, 2011).
Declaration re 391 Opening Brief in Support,, Declaration of Marcus T. Hall in Support of Plaintiffs' Opening Brief in Support of Motion to Strike Reply Brief in Support of MEMC's Renewed Motion for Judgment as a Matter of Law or, in the Alternative, a New Trial (D.I. 386) by Commissariat a LEnergie Atomique, SOITEC Silicon on Insulator Technologies SA, SOITEC U.S.A., Inc.. (Attachments: # 1 Exhibit A, # 2 Certificate of Service)(Kraft, Denise) (Entered: Feb. 8, 2011).

Redacted Version of 389 Reply Brief, Redacted Version of Reply Brief in Support of Plaintiffs' Motion for Injunctive Relief and to Lift Stay on Damages Discovery by Commissariat a LEnergie Atomique, SOITEC Silicon on Insulator Technologies SA, SOITEC U.S.A., Inc.. (Kraft, Denise) (Entered: Feb. 9, 2011).

Ayguavives et al., "Physical Properties of (Ba,Sr) TiO$_3$ Thin Films Used for Integrated Capacitors in Microwave Applications", IEEE 2001.

Donohue et al., "Pulse-Extended Excimer Laser Annealing of Lead Zirconate Titanate Thin Films", Proceedings of the 12$^{th}$ International Symposium on Integrated Ferroelectrics, Aachen, Germany, Mar. 2000, *Integrated Ferroelectics*, vol. 31, pp. 285 to 296, 2000.

Heistand et al., "Advances in Passive Integration for C/RC Arrays & Networks with Novel Thin & Thick Film Materials", 36$^{th}$ Nordic IMAPS Conference, Helsinki, 1999.

Huang, et al., Calculation of critical layer thickness considering thermal strain in $Si_{1-x}Ge_x$/Si strained-layer heterostructures, J. Appl. Phys. 83 (1), Jan. 1, 1998.

Motohiro et al. *"Geometrical Factors of Argon Incorporation in SiO$_2$ Films Deposited by ION Beam Sputtering"*—Thin Solid Films, Elsevier-Sequoia S.A. Lausanne, CH, vol. 120, No. 4—Oct. 1, 1984, pp. 313-327.

Ray et al. *"Effect of Reactive-Ion Bombardment on the Properties of Silicon Nitride and Oxynitride Films Deposited by Ion-Beam Sputtering"*—Journal of Applied Physics, vol. 75, No. 12, Jun. 15, 1994—pp. 8145-8152.

Office Action from U.S. Appl. No. 10/565,621, ated Nov. 23, 2010, 11 pages.

Redacted Version of 277 Reply Brief, in Supprot of SOITEC/CEA Parties' Motion to Exclude The Epert Report of Dr. Pascal Bellon and Any Related Testimony by Commissariat a LEnergie Atomique, SOITEC Silicon On Insulator Technologies SA. (Attachments: # 1 Certificate of Service)(Kraft, Denise) (Entered: Aug. 6, 2010).

Notice of Service of CD of documents MEMC0782194-MEMC0782500 and FH-1 0001-FH-8 0067 by MEMC Electronic Materials Inc..(Rogowski, Patricia) (Entered: Sep. 16, 2010).

Redacted Verison of 315 Proposed Pretrial Order,, Redacted Version of [Proposed] Joint Pretrial Order by Commissariat a LEnergie Atomique, SOITEC Silicon On Insulator Technologies SA, SOITEC U.S.A., Inc.. (Attachments: # 1 Exhibit 1, # 2 Exhibit 2A, # 3 Exhibit 2B, # 4 Exhibit 3A, # 5 Exhibit 3B, # 6 Exhibit 4A, # 7 Exhibit 4B, # 8 Exhibit 4C, # 9 Exhibit 5A, # 10 Exhibit 5B, # 11 Exhibit 6A, # 12 Exhibit 6B, # 13 Exhibit 7A, # 14 Exhibit 7B, # 15 Certificate of Service)(Kraft, Denise) (Entered: Oct. 13, 2010).

Order denying 141 Motion for Discover; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting in part and denying in part 213 Motion for Partial Summary Judgement. Signed by Judge Sue L. Robinson on Oct. 13, 2010. (nmf) (Entered: Oct. 13, 2010).

Amended Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgement; denying 204 Motion for Partial Summary Judgment; denying 206 Motion for Partial Summary Judgment; denying 210 Motion for Partial Summary Judgment; denying 212 Motion for Partial Summary Judgment; *granting* 213 Motion for Partial Summary Judgment. Signed by Judge Sue L. Robinson on Oct. 14, 2010. (nmf) (Entered: Oct. 14, 2010) Minute Entry for proceedings held before Judge Sue L. Robinson—Final Pretrial Conference held on Oct. 14, 2010. (Court Reporter V. Gunning.) (nmf) (Entered: Oct. 15, 2010) So Ordered, re 315 Proposed Pretrial Order. Signed by Judge Sue L. Robinson on Oct. 14, 2010. (nmf) (Entered: Oct. 15, 2010).

Motion for Reargument re 327 Memorandum and Order—Reargument of Claim Construction of One Claim Term of U.S. Patent 6,809,009—filed by MEMC Electronic Materials Inc.. (Rogowski, Patricia) (Entered: Oct. 19, 2010).

Second Amended Order re: 325 denying 141 Motion for Discovery; denying 186 Motion in Limine; granting in part and denying in part 187 Motion for Partial Summary Judgment; granting 197 Motion for Summary Judgment ; granting 199 Motion for Summary Judgment **with respect to the '484 patent and with respect to its current process, amd denied in other respects; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion for Partial Summary Judgment. Signed by Judge Sue L. Robinson on Oct. 19, 2010. (nmf) (Entered: Oct. 19, 2010).

Letter to the Honorable Sue L. Robinson from Denise Seastone Kraft regarding Mutually agreed upon narrowing of the issues for trial—re 333 Stipulation, 332 Stipulation,. (Kraft, Denise) (Entered: Oct. 21, 2010) Correcting Entry: The pdf of D.I. 332 has been replaced with the correct pdf of the stipulation per request of filer. (nmf) (Entered: Oct. 22, 20100 So Ordered, re 333 Stipulation filed by SOITEC Silicon On Insulator Technologies SA, SOITEC U.S. A., Inc., Commissariat a LEnergie Atomique, 332 Stipulation, filed by SOITEC Silicon On Insulator Technologies SA, SOITEC U.S.A., Inc., Commissariat a LEnergie Atomique, Signed by Judge Sue L. Robinson on Oct. 22, 2010. (nmf) (Entered: Oct. 22, 2010).

Answering Brief in Opposition re 301 Sealed Motion for Reconsideration Request to Modify Protective Order (MEMC's Opposition to Plaintiffs' Motion for Reargument Re: Modification of the Protective Order) filed by MEMC Electronic Materials Inc..Reply Brief due date per Local Rules is Nov. 22, 2010. (Attachments: # 1 Exhibit 1 through 5, # 2 Certificate of Service)(Rogowski, Patricia) (Entered: Nov. 12, 2010).

Motion for Leave to File Reply in Support of Plaintiffs Motion for Reargument—filed by Commissariat a LEnergie Atomique, SOITEC Silicon on Insulator Technologies SA. (Attachments: # 1 Text of Proposed Order, # 2 Certificate of Service)(Kraft, Denise) (Entered: Nov. 23, 2010).

Opening Brief in Support re 301 Sealed Motion for Reconsideration Request to Modify Protective Order, 351 Motion for Leave to File Reply in Support of Plaintiff's Motion for Reargument filed by Commissariat a LEnergie Atomique, SOITEC Silicon on Insulator Technologies SA.Answering Brief/Response due date per Local Rules is Dec. 10, 2010. (Attachments: # 1 Appendix A, # 2 Certificate of Service)(Kraft, Denise) (Entered: Nov. 23, 2010.

Exhibit re 355 Reply Brief, Exhibit B to Plaintiffs' Opposition to MEMC's Motion for Reargument of the Court's Order Re: The Unenforceability of the '009 Patent by Commissariat a LEnergie Atomique, SOITEC Silicon on Insulator Technologies SA, SOITEC U.S.A., Inc.. (Kraft, Denise) (Entered: Dec. 6, 2010).

Opening Brief in Support re 361 Motion for Judgment as a Matter of Law Plaintiffs' Renewed Motion For Judgment As A Matter of Law Or In The Alternative For A New Trial filed bu Commissariat a LEnergie Atomique, SOITEC Silicon On Insulator Technologies SA.Answering Brief/Response due date per Local Rules is Jan. 3, 2011. (Attachments: # 1 Certificate of Service)(Kraft, Denise) (Entered: Dec. 14, 2010).

Stipulation to Extend Time due date for Answering and Reply Post-Trial Briefs to Jan. 7, 2011 for Answering Brief and Jan. 21, 2011 for Reply Brief—filed by MEMC Electronic Materials Inc.. (Rogowski, Patricia) (Entered: Dec. 15, 2010) So Ordered—re 365 Stipulation to Extend Time. Set Briefing Schedule: (Answering Post trial Brief due Jan. 7, 2011., Reply post trial Brief due Jan. 21, 2011.). Signed by Judge Sue L. Robinson on Dec. 16, 2010. (lid) (Entered: Dec. 17, 2010).

Answering Brief in Opposition re 359 Motion for Judgement as a Matter of Law—MEMC's Renewed Motion for judgment as a Matther of Law or in the Alternative for a New Trial filed by Commissariat a LEnergie Atomique, SOITEC Silicon On Insulator Technologies SA, SOITEC U.S.A., Inc..Reply Brief due date per Local Rules is Jan. 24, 2011. (Attachments: # 1 Certificate of Service)(Kraft, Denise) (Entered: Jan. 14, 2011).

Redacted Version of 364 Opening Brief in Support,,,, Redacted Version of Opening Brief in Support of Plaintiffs' Motion For Injunctive Relief and to Lift Stay on Damages Discovery by Commissariat a LEnergie Atomique, SOITEC Silicon On Insulator Technologies SA, SOITEC U.S.A., Inc.. (Attachments: # 1 Exhibit A, # 2 Exhibit B, # 3 Exhinit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Exhibit O, # 16 Exhibit P, # 17 Exhibit Q, # 18 Exhibit R, # 19 Exhibit S)(Kraft, Denise) (Entered: Feb. 2, 2011).

Reply Brief re 361 Motion for Judgment as a Matter of Law Plaintiffs' Renewed Motion For Judgment As A Matter of Law Or In The Alternative For A New Trial filed bu Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 4, 2011).

Declaration re 387 Reply Brief, Declaration of Michael L. Brody in Suppport of Reply Brief in Support of Plaintiffs' Renewed Motion For Judgment as a Matter of Law or In The Alternative For a New Trial by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Feb. 4, 2011).

Opening Brief in Support re 390 Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) filed by Commissariat a LEnergie Atomique, SOITEC Silicon On Insulator Technologies SA, SOITEC U.S.A., Inc..Answering Brief/Response due date per Local Rules is Feb. 25, 2011. (Attachments: # 1 Certificate of Service)(Kraft, Denise) (Entered: Feb. 8, 2011. (Attachments: # 1 Certificate of Service)(Kraft, Denise) (Entered: Feb. 8, 2011).

* cited by examiner

METHOD OF TRANSFERRING A THIN FILM ONTO A SUPPORT

RELATED APPLICATION

Related subject matter is disclosed in co-pending, commonly-assigned, patent application Ser. No. 12/088,047, filed Jun. 12, 2008 and titled "METHOD FOR MAKING A THIN-FILM ELEMENT" to Deguet et al.

PRIORITY CLAIM

This application is a U.S. nationalization of PCT Application No. PCT/FR2006/001945, filed Aug. 11, 2006, and claims priority to French Patent Application No. 0508555, filed Aug. 16, 2005.

TECHNICAL FIELD

The invention concerns a method of transferring a thin film, such as a layer with a thickness typically less than 1 μm, onto a support.

BACKGROUND

In the context of the production of stacked structures that are formed, in particular thin layers carried by a support (for example a substrate), it has already been proposed to transfer a thin layer onto the substrate by means of a method that comprises the following main steps:

the formation of a weakened zone at a given depth in a substrate consisting of the material that is to form the thin layer, for example by implantation of a gas at that depth;

the bonding of the implanted substrate (referred to as the donor substrate) onto the support, for example by molecular bonding; and the separation of the donor substrate amputated from the thin layer (situated between the weakened zone and the initial surface of the donor substrate) and the support, which then carries the thin layer, by fracture (generally during a heat treatment step, usually between 200° C. and 600° C.) in the previously weakened zone.

This kind of solution is described in French patent application No. FR 2 681 472, for example; it is used, for example, to deposit a thin layer of silicon onto a support consisting of a silicon substrate covered with a thin layer of insulative silicon oxide ($SiO_2$) in order to obtain an SOI (Silicon-On-Insulator) type structure.

Although the method described briefly hereinabove can be applied as such in the situation that has just been referred to, certain problems can arise in the conventional application of this method in different contexts, for example if the donor substrate and the support have very different mechanical characteristics.

This is the case in particular if it is required to replace the thin layer of silicon with a thin layer of germanium (Ge) that has certain advantageous electronic properties (such as the mobility of the electrical carriers, which improves the performance of circuits produced on germanium).

The production of this kind of structure (referred to as GeOI, standing for Germanium-On-Insulator) by means of the method previously referred to is, for example, the subject of the paper "Germanium-On-Insulator (GeOI) Structure Realized by the Smart Cut™ Technology", F. Letertre et al., in MRS proceedings, 809 B4.4 (2004).

In this instance, the conventional application of the thin layer transfer method referred to hereinabove leads to bonding a silicon substrate onto a substrate implanted with germanium, with a view to their separation, in the zone weakened by implantation, by heat treatment. This solution is problematic, however, because of the large difference between the coefficients of thermal expansion of the two materials used ($2.6 \times 10^{-6}/°$ C. for silicon and $5.8 \times 10^{-6}/°$ C. for germanium). The sudden releasing, at the moment of fracture, of the stresses stored in the structure can cause one or even both substrates to break.

The paper referred to above also proposes carrying out implantation in a layer of germanium, the thickness of which can vary from one micron to a few microns and which is formed epitaxially on the surface of a standard silicon substrate (750 μm thick). The structure subjected to the separation heat treatment therefore behaves as a homostructure because of the small thickness of the germanium compared to the thickness of the two silicon substrates.

This latter solution is nevertheless less advantageous from the electronic point of view because of the high number of dislocations and greater roughness in the epitaxial germanium.

Another known solution for producing a structure including a layer of a first material on a substrate of a second material is, after assembly of a substrate of the first material with the substrate of the second material, to carry out chemical-mechanical thinning of the substrate in the first material. However, this technique cannot be used to obtain layers with a thickness of the order of one micron with a thickness of good homogeneity. Using this technique, the greater the thinning, the less homogeneous the thickness of the residual layer.

SUMMARY

To solve these various problems, and to propose a solution that combines in particular simple implementation, high mechanical strength during the fracture heat treatment, and good electrical crystalline properties of the structure obtained, the invention provides a method for transferring a thin layer of a first material onto a first support formed of a second material, characterized by the following steps:

providing a structure including a layer at least part of which comes from a bulk substrate of the first material and which is attached to a second support formed of a third material having a coefficient of thermal expansion different from that of the first material and close to that of the second material;

forming in the layer a buried weakened zone at a given depth delimiting in the structure the thin layer to be transferred;

bonding the layer attached to the second support to the first support; and fracturing the layer in the weakened zone, including at least one heat treatment step.

In this kind of method, the second support provides good mechanical cooperation with the first support (similar temperature-related changes to the second and third materials), independently of the material of the thin layer to be transferred (first material).

The thickness of the layer is preferably such that the mechanical behavior as a function of temperature of the structure obtained after bonding is imposed by the second support and the first support. The layer is then sufficiently thin not to be involved in the mechanical temperature behavior of the structure obtained after bonding. The fracture step therefore takes place under good conditions whatever the nature of this material, so that the material can be chosen freely, for example for its electrical properties.

According to the invention, the materials and the thicknesses used, and in particular the thickness of the layer of the first material, are chosen so that the release of the stresses stored in the structure at the moment of fracture does not cause either of the structures obtained after fracture to break.

The fracture step can also include a step of applying mechanical loads: mechanical forces (insertion of a blade, traction and/or bending and/or shear forces) and/or ultrasound or microwaves; the step of forming a weakened zone can be carried out by implantation of one or more gaseous species.

The coefficient of thermal expansion of the first material differs from the coefficient of thermal expansion of each of the second and third materials by at least 10%, for example.

The coefficient of thermal expansion of the second material can be chosen to differ by less than 10% from the coefficient of thermal expansion of the third material. The structure obtained after bonding can then be considered to constitute a homostructure. The second material is identical to the third material, for example.

The thickness of the layer attached to the second support is less than 15% of the thickness of the second support, for example, which prevents any significant mechanical impact of this layer on the structure resulting from the bonding step, and in particular limits the elastic energy stored in this structure during heat treatment. This thickness must of course be chosen as a function of the difference between the coefficients of thermal expansion existing in the structure and the temperature that the structure must be able to withstand. The lower this temperature, the thicker the layer attached to the second support can be. Similarly, the smaller the coefficient of thermal expansion difference, the greater this thickness can be.

The second material is silicon, for example. The first material can be germanium.

The thickness of the layer of the first material (before fracture) is between 1 μm and 50 μm, for example.

In an embodiment described hereinafter, the method can include a preliminary step of bonding a solid plate of the first material to the second support, for example at raised temperature (typically between 100° C. and 200° C.). In this case, the layer obtained from the plate and attached to the second support can be obtained by a step of thinning the plate of the first material, for example by chemical-mechanical thinning (which can be effected by a method known as grinding, followed by polishing).

The method can also include a step of epitaxial deposition of the first material onto a portion of the layer (residual layer) remaining attached to the second support after fracture. The crystalline quality of the residual layer being good, that of the epitaxially deposited layer will also be good.

Thus the epitaxially deposited layer can be used for further thin film transfer, for example by means of the following steps:
  forming a buried weakened zone in the epitaxial layer;
  bonding the epitaxial layer onto a third support; and
  fracturing the epitaxial layer in the weakened zone.

In one possible implementation of the method, the layer attached to the second support is obtained entirely from the bulk substrate. This ensures that the whole of the layer is of very good crystalline quality.

In another possible implementation, the layer attached to the second support includes an epitaxial layer of the first material. As already indicated, this enables continued transfer of thin layers based on a residual layer at the same time as retaining good crystalline quality by virtue of the portion obtained from the bulk substrate.

In this case the layer attached to the second support can also include an epitaxial layer of a fourth material the thickness of which is such that its crystalline structure is imparted by the first material. This layer can then be used for other functions, without calling into question the crystalline quality of the layers of the first material.

For example, the method can include a step of elimination of the epitaxial layer of the first material after fracture using the epitaxial layer of the fourth material as a stop layer.

BRIEF DESCRIPTION OF THE DRAWING

Other features and advantages of the present invention will become apparent in the light of the following description, given with reference to the appended drawings, in which.

DETAILED DESCRIPTION

In these figures, the various layers are shown with diagrammatic thicknesses, not directly proportional to reality, in order to clarify their description.

The various steps of one example of a method according to the invention are described next with reference to these figures.

Figure 1:
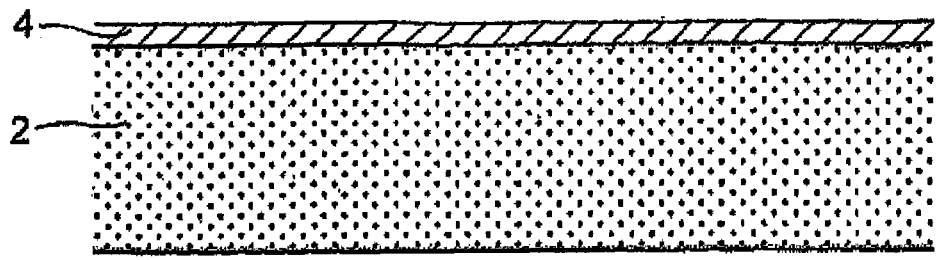
FIGS. 1 to 6 illustrate various steps of one embodiment of a method in accordance with the invention.

This example uses a plate 2 of bulk germanium (which therefore has good crystalline electrical properties), here with a typical diameter of 200 mm and a thickness of 750 μm, on which a surface layer 4 of silicon oxide ($SiO_2$) has been deposited, for example by PECVD (Plasma Enhanced Chemical Vapor Deposition) using $SiH_4$ chemistry at 380° C., as represented in FIG. 1.

A germanium plate 2 with no surface layer, or with one or more surface layers of a different kind, could be used instead.

The silicon oxide layer 4 can be prepared by densification (for example in nitrogen at 600° C. for one hour). The germanium plate 2—silicon oxide layer 4 structure is then prepared for the bonding described hereinafter, for example by chemical cleaning and/or chemical-mechanical polishing for hydrophilic type bonding.

This structure represented in FIG. 1 is then bonded to a substrate 6 consisting of a material the coefficient of thermal expansion whereof is different from that of germanium, for example silicon (Si), which forms a support, on which may have been formed a layer, for example a layer 8 of silicon oxide ($SiO_2$) formed by thermal oxidation, to facilitate subsequent bonding (oxide/oxide bonding being a well proven technology).

Figure 2:
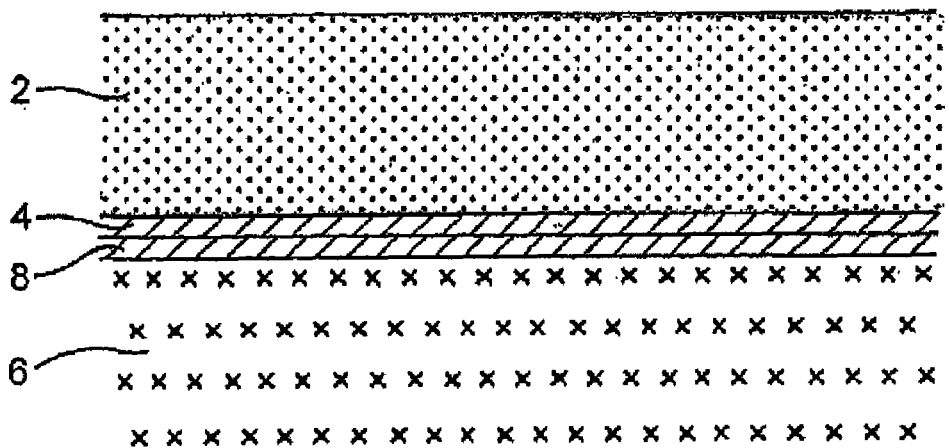

The assembly of the germanium plate 2 on the silicon substrate 6 (where applicable with interposed silicon oxide layers 4, 8) is represented during bonding in FIG. 2.

This bonding can be consolidated in an oven, for example at 200° C. for two hours.

This bonding can advantageously be carried out at raised temperature, for example between 100° C. and 200° C., which generates stresses in the structure that can compensate some of the stresses generated by subsequent heat treatments and in particular the fracture heat treatment, thereby reducing the risk of breakage.

The germanium plate 2 is then thinned, preferably by the combination of grinding followed by chemical-mechanical polishing and where appropriate, chemical etching (polishing producing a good final roughness and chemical etching removing the defects created by grinding). Other thinning techniques could be used, provided that they guarantee the integrity of the structure (in particular provided that they do not necessitate too high a temperature increase of the structure).

The final thickness of germanium must be such that the mechanical behavior of the germanium/silicon assembly is essentially dictated by the silicon 6, so that the mechanical behavior of the assembly as a function of temperature is like that of a homostructure, to be more precise so that the elastic energy stored in the structure during subsequent heat treatments, and in particular during the fracture heat treatment (and even more particularly at the moment of fracture of the structure) does not lead to the structure breaking. A thickness of 1 μm to 50 μm, for example 20 μm, is typically chosen for this germanium layer.

Figure 3:
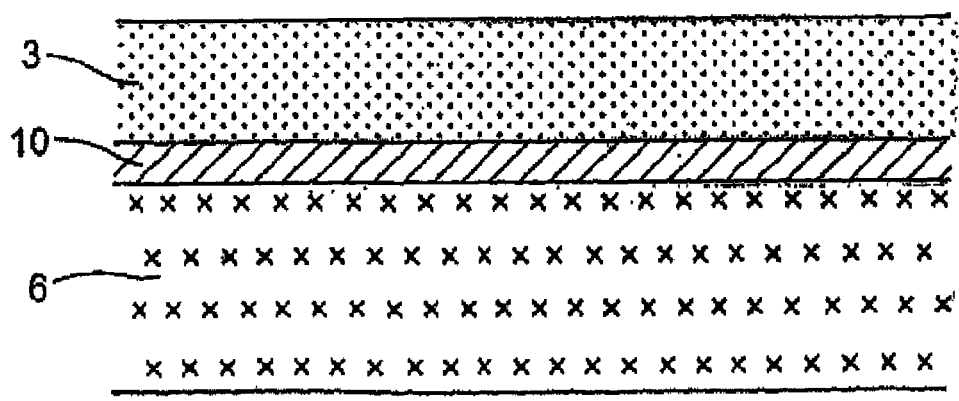

The structure represented in FIG. 3 is then obtained, which thus essentially consists of a substrate 6 forming a support (here of silicon, with a typical thickness of 750 μm for a 200 mm diameter substrate), an intermediate layer 10 of silicon oxide (which corresponds to the assembly of the two silicon oxide layers 4, 8 referred to hereinabove), and a thinned germanium layer 3, of reduced thickness, for example from a few micrometers to a few tens of micrometers thick, for example 20 μm thick.

Because of the process used to produce it, the roughness and the crystalline structure of the thinned germanium layer 3 are close to those of a bulk germanium substrate and the crystalline and electrical properties of the thin layers formed as described hereinafter from the thinned layer 3 of germanium are therefore particularly good.

As explained hereinafter, the reduced thickness of the thinned germanium layer 3 and its bonding to the silicon substrate 6 forming a support nevertheless produce a structure having a different mechanical behavior than a bulk germanium substrate, which will be advantageous when used in the separation step described hereinafter.

What is more, because of the higher thermal conductivity of silicon than germanium, this (germanium/silicon) structure shows better evacuation of heat during subsequent technology steps than the solution using a germanium substrate.

The structure represented in FIG. 3 that has just been described therefore constitutes a particularly advantageous donor structure enabling the transfer of a thin layer, here of germanium, as described next.

Before bonding to the support that is to receive the thin layer (essentially a silicon substrate in the example described here), the structure produced beforehand and represented in FIG. 3 can be prepared by carrying out the following steps:

depositing a layer of silicon dioxide ($SiO_2$), for example by PECVD, as before;

optional densification of the silicon oxide layer in nitrogen at between 400° C. and 600° C. for one hour; and cleaning and/or chemical-mechanical polishing (to improve compatibility with hydrophilic bonding).

Alternatively, it is of course possible not to deposit any oxide and to prepare the germanium surface directly for bonding it to the support that is to receive the thin layer.

A weakened zone 14 is produced in the thinned germanium layer 3, at a depth that corresponds to the thickness of the thin film to be transferred (generally of the order of a few hundred nanometers, for example between a few tens of nanometers and 1000 nm), for example by implantation of gaseous species, here hydrogen ions ($H^+$), with an energy between a few keV and 250 keV and at a dosage rate between $3.10^{16}$ and $7.10^{16}\ H^+/cm^2$; typically, with an implantation energy of 100 kev and a dosage rate of $5.10^{16}\ H^+/cm^2$, an implantation depth of approximately 700 nm is obtained.

The implantation step is carried out after formation of the silicon oxide layer ($SiO_2$) layer and before cleaning the surface, for example.

Figure 4:
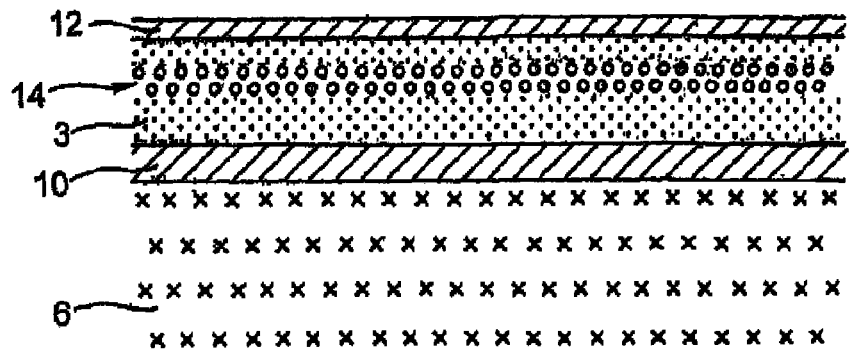

After this implantation step, and where applicable these preparation steps, the donor structure is therefore as shown in FIG. 4.

That structure is then bonded (by the silicon oxide layer 12 deposited on the thinned germanium layer 3, i.e. the surface that has been subjected to implantation), for example by hydrophilic bonding to the support onto which the thin layer is to be transferred, consisting here primarily of a silicon substrate 18 (generally of the order of 750 μm thick for a substrate of 200 mm thickness), covered by a silicon oxide ($SiO_2$) layer 16.

Figure 5:
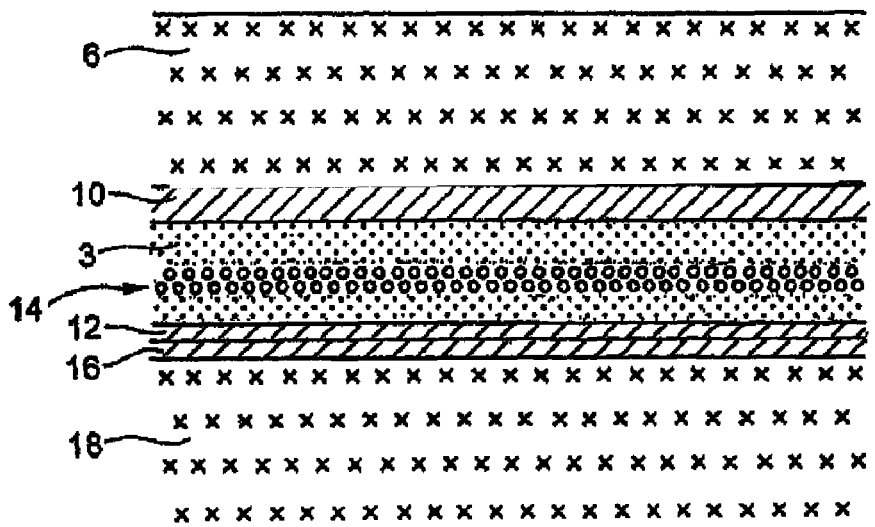

The assembly represented in FIG. 5 is therefore obtained, that is to be subjected to a heat treatment step, generally between 200° C. and 500° C. (at 330° C. here, for example), in order to form a fracture in the weakened zone 14.

Figure 6:
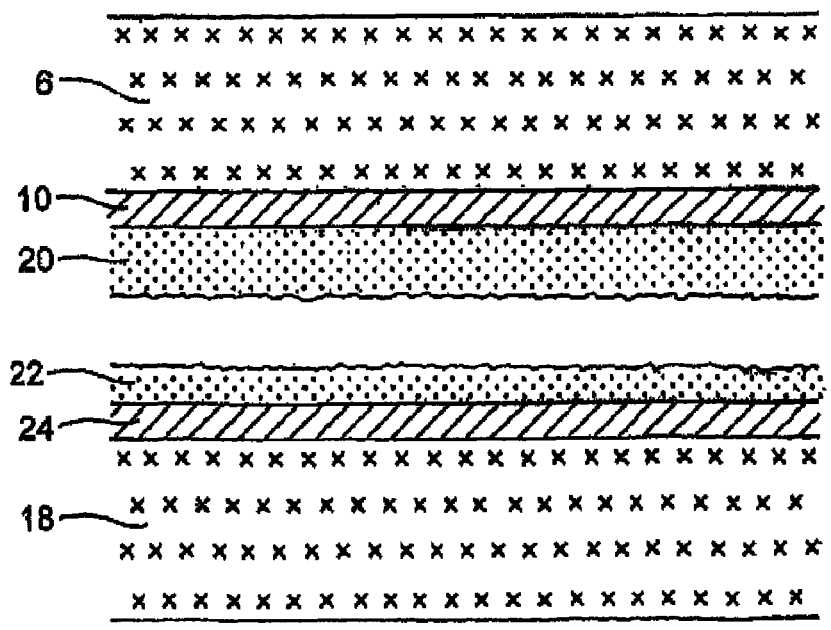

This separates the support formed by the silicon substrate 18 covered by the silicon oxide layer 16, which henceforth carries a thin layer 22 of germanium (coming from the thinned layer 3), and the donor structure peeled off this transferred thin layer, as represented in FIG. 6.

Because the thinned germanium layer 3 is thin compared to the silicon substrates 6, 18 (shown diagrammatically in the figures, in practice in a ratio of the order of at least 1 to 10) and the mechanical compatibility (here in terms of thermal expansion) of the two substrates 6, 18 (here made from the same material), the assembly referred to hereinabove (and represented in FIG. 5) behaves essentially as a homostructure and therefore exhibits good mechanical behavior during the fracture heat treatment step, without serious risk of breakages.

The release of the elastic energy stored in the structure at the moment of fracture is controlled and does not lead to breakage of the structures obtained after fracture.

After the step of fracturing the weakened zone (and consequently separation of the FIG. 5 assembly), the silicon substrate 18 covered with the silicon oxide layer 24 therefore carries a thin film 22 of germanium with good electrical properties because this thin film 22 is derived from the thinned germanium layer 3 the electrical properties whereof are close to those of the initial germanium plate as already mentioned.

There is therefore obtained, where applicable after finishing treatments of the polishing and thermal annealing type, a plate of GeOI (i.e. of germanium on insulator) with electrical properties of the germanium layer that are particularly beneficial.

The donor structure, consisting mainly of the silicon substrate 6 and the residual germanium layer 20 (thinned germanium layer 3 peeled from the thin layer 22), can then be recycled (for example by grinding and/or polishing techniques) in order to be used again as a donor structure for the transfer of a new thin layer of germanium, in this case obtained from the residual layer 20 (this is because, even when peeled from the thin layer 22, the donor structure is essentially constituted as it was beforehand, and represented in FIG. 3).

According to one advantageous implementation possibility, the thinned layer 3 or the residual layer 20 of germanium of the donor structure can serve as a seed for the epitaxial growth of germanium on that structure. Because of the crystalline quality of the thinned (or residual) layer, the crystalline quality of this epitaxial layer will be close to that of a bulk germanium substrate. The thin layer transfer process can therefore be repeated using the epitaxial layer.

Alternatively, there can be produced epitaxially (on the thinned layer 3 or the residual layer 20) successively and iteratively germanium (to a thickness of a few microns, for example 2 μm) and silicon (typically to a thickness of a few nanometers) to form an alternating stack of silicon and germanium.

The epitaxial silicon layers are so thin that the germanium imposes its lattice parameter so that good crystalline quality is maintained in the epitaxial germanium layer.

On the other hand, the combined thickness of the epitaxial layers and the initial germanium layer 3, 20 must remain sufficiently small for the mechanical behavior as a function of temperature of the structure obtained to be imposed by the silicon substrate.

This variant can use the thin silicon layer as a stop layer during successive transfers.

The following process can also be used:

implantation is effected in the epitaxial layer of germanium situated on top of the stack (exterior layer) to define in that layer the thin film to be transferred;

the thin film is transferred as indicated hereinabove;

the rest of the exterior germanium layer is eliminated by selective etching (for example $H_2O_2$ etching);

the silicon stop layer is then eliminated by selective etching (for example using TMAH—tetramethylammonium hydroxide); and the process is repeated on the next germanium layer.

This method avoids the use of polishing after fracture and therefore the non-homogeneous thickness that usually results.

The examples that have just been described constitute only possible embodiments of the inventions which is not limited to them.

The invention claimed is:

1. A method for transferring a thin germanium layer onto a first silicon support, the method comprising:
   providing a structure comprising a layer at least a portion of which is derived from a bulk substrate of germanium, including a preliminary step of bonding a bulk plate of germanium to a second silicon support and thinning the bulk plate to obtain the layer, wherein the layer is attached to the second silicon support, the layer being between 1 μm and 50 μm thick;
   forming a buried weakened zone in the layer at a given depth, by implanting at least one gaseous species, the buried weakened zone delimiting in the structure the thin germanium layer to be transferred;
   bonding the layer to the first silicon support; and
   fracturing the layer in the weakened zone, wherein the fracturing is carried out with a process comprising at least one heat treatment step.

2. The method according to claim 1, wherein a thickness of the layer is dependent on the mechanical behavior as a function of temperature of the structure obtained after bonding the layer to the first silicon support.

3. The method according to claim 1, wherein fracturing the layer further comprises applying mechanical loads.

4. The method according to claim 1, wherein the coefficient of thermal expansion of the thin germanium layer differs from each of the coefficients of thermal expansion of the first and second silicon supports by at least 10%.

5. The method according to claim 1, wherein the thickness of the layer is less than 15% of the thickness of the second silicon support.

6. The method according to claim 1, wherein bonding the bulk plate is carried out at a temperature between 100° C. and 200° C.

7. The method according to claim 1, further comprising epitaxially depositing an epitaxial layer comprising germanium, wherein the epitaxial layer is deposited on a portion of the layer that remains attached to the second silicon support after fracturing.

8. The method according to claim 7, further comprising:
   forming a buried weakened zone in the epitaxial layer;
   bonding the epitaxial layer onto a third support; and
   fracturing the epitaxial layer in the weakened zone.

9. The method according to claim 1, wherein the layer is obtained entirely from the bulk substrate.

10. The method according to claim 1, wherein the layer comprises an epitaxial layer of germanium.

11. The method according to claim 10, wherein the layer further comprises an epitaxial layer of a material of a thickness such that a crystalline structure of the layer is imparted by the germanium.

12. The method according to claim 10, further comprising eliminating the epitaxial layer of germanium after fracture using the epitaxial layer of the material as a stop layer.

* * * * *